(12) United States Patent
Ono

(10) Patent No.: US 7,902,594 B2
(45) Date of Patent: Mar. 8, 2011

(54) SEMICONDUCTOR COMPONENT AND SEMICONDUCTOR DEVICE

(75) Inventor: Mizuki Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 389 days.

(21) Appl. No.: 12/194,271

(22) Filed: Aug. 19, 2008

(65) Prior Publication Data

US 2009/0179244 A1    Jul. 16, 2009

(30) Foreign Application Priority Data

Jan. 11, 2008 (JP) ................. 2008-004480

(51) Int. Cl.
  *H01L 29/76* (2006.01)
  *H01L 21/336* (2006.01)
(52) U.S. Cl. ......................... 257/328; 438/268
(58) Field of Classification Search .................. 438/158, 438/192, 212, 268; 257/328, 349
See application file for complete search history.

(56) References Cited

U.S. PATENT DOCUMENTS

| 5,965,918 | A |   | 10/1999 | Ono | 257/347 |
| 5,990,516 | A | * | 11/1999 | Momose et al. | 257/327 |
| 7,605,421 | B2 | * | 10/2009 | Ono | 257/315 |

FOREIGN PATENT DOCUMENTS

JP    2003-209247    7/2003

OTHER PUBLICATIONS

Colinge, et al., "A Silicon-On-Insulator Quantum Wire", Solid-State Electronics, vol. 39, No. 1, pp. 49-51, 1996.
Wilk, et al., "High-K Gate Dielectrics: Current Status and Materials Properties Considerations", Applied Physics Review, Journal of Applied Physics, vol. 89, No. 10, May 15, 2001, pp. 5243-5275.
"International Technology Roadmap for Semiconductors— 2006 Update, Process Integration, Device and Structures", 35 pages.

* cited by examiner

*Primary Examiner* — Calvin Lee
(74) *Attorney, Agent, or Firm* — Ohlandt, Greeley, Ruggiero & Perle, L.L.P.

(57) ABSTRACT

A semiconductor component includes an insulating region provided on the substrate, plural first conductivity type wire-form semiconductor layers aligned on the insulating region parallel to each other, second conductivity type source/drain regions provided to the respective semiconductor layers, a channel region provided between the source/drain regions, an insulating film provided on the upper and side surfaces of the channel region, and a gate electrode provided on the insulating film to continuously cross the semiconductor layers. The channel region length measured perpendicularly to a current flowing direction and in parallel to the substrate is not more than twofold a maximum depletion layer width determined based on an impurity concentration in the channel region, each interval between the semiconductor layers is not more than twofold an interval between the semiconductor layer and the gate electrode, and a dielectric constant of a part of the insulating region surface is lower than 3.9.

26 Claims, 38 Drawing Sheets

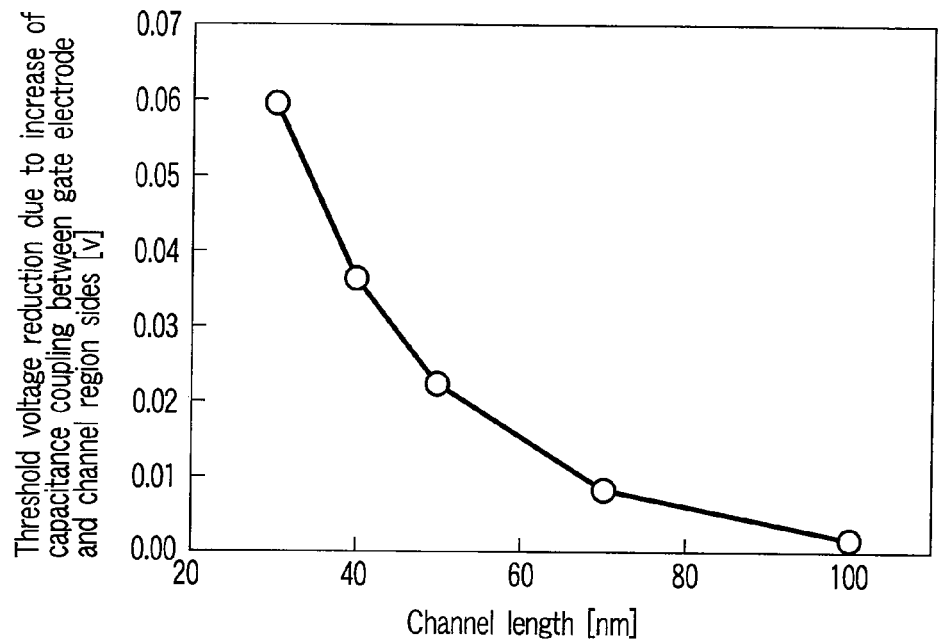
F I G. 8
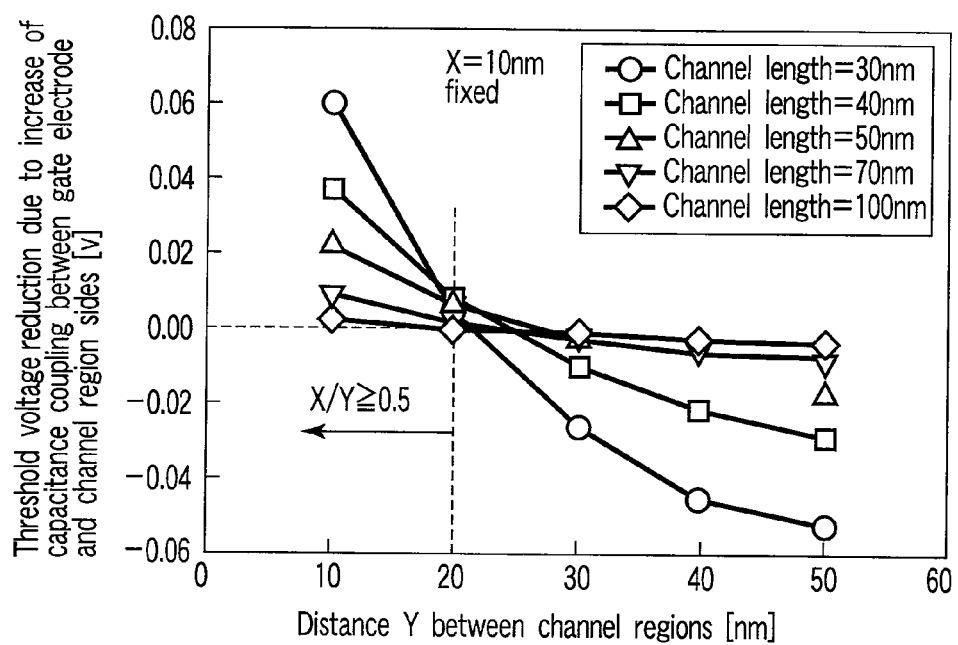
F I G. 9

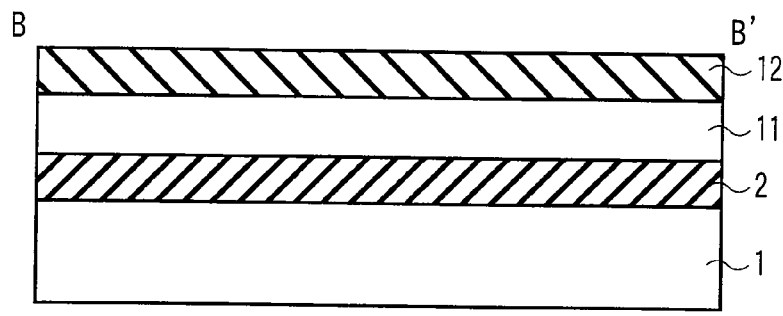
F I G. 16
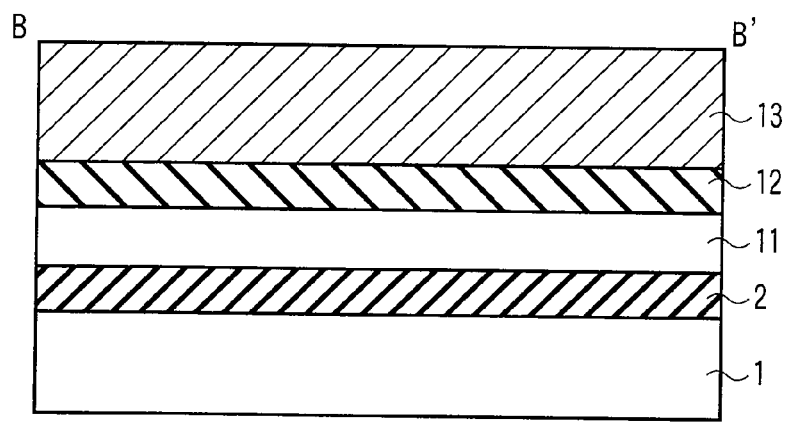
F I G. 17
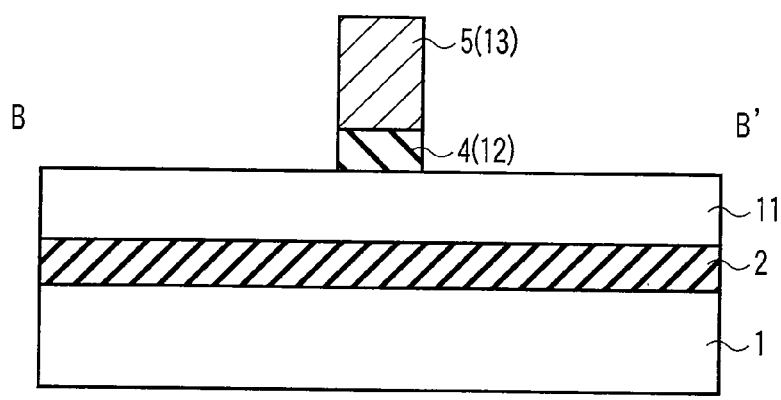
F I G. 18

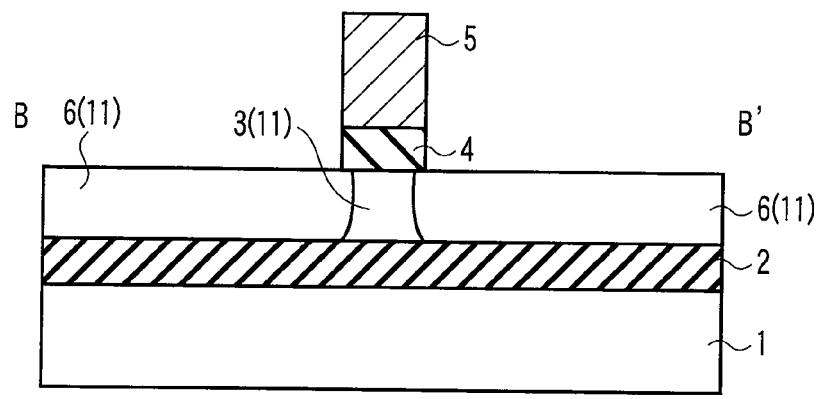
F I G. 19
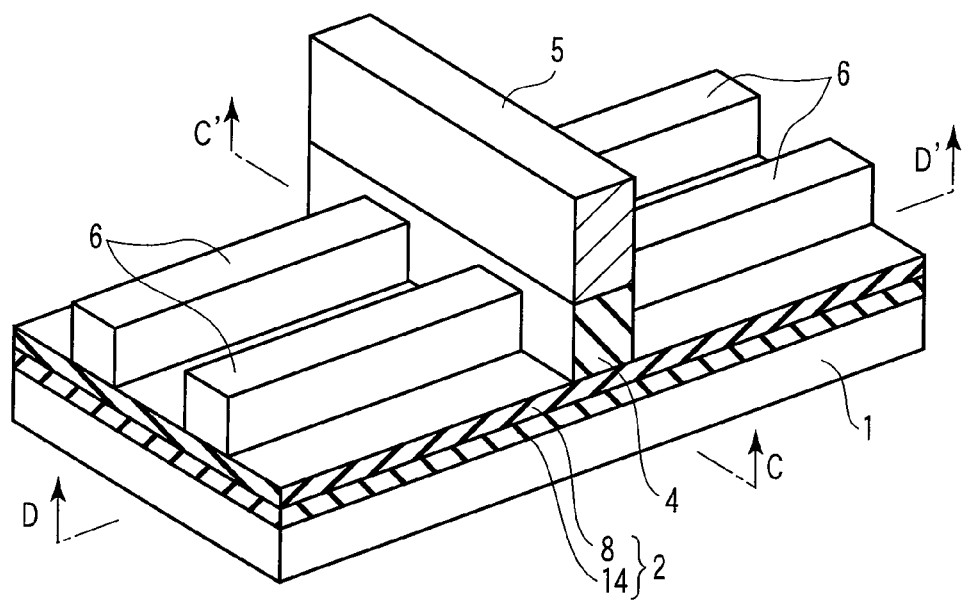
F I G. 20

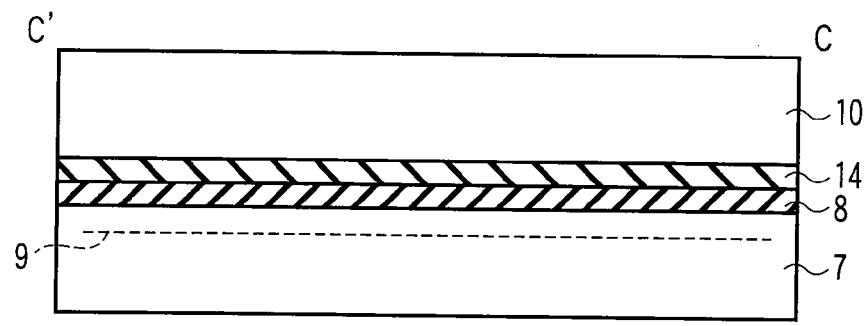
F I G. 24
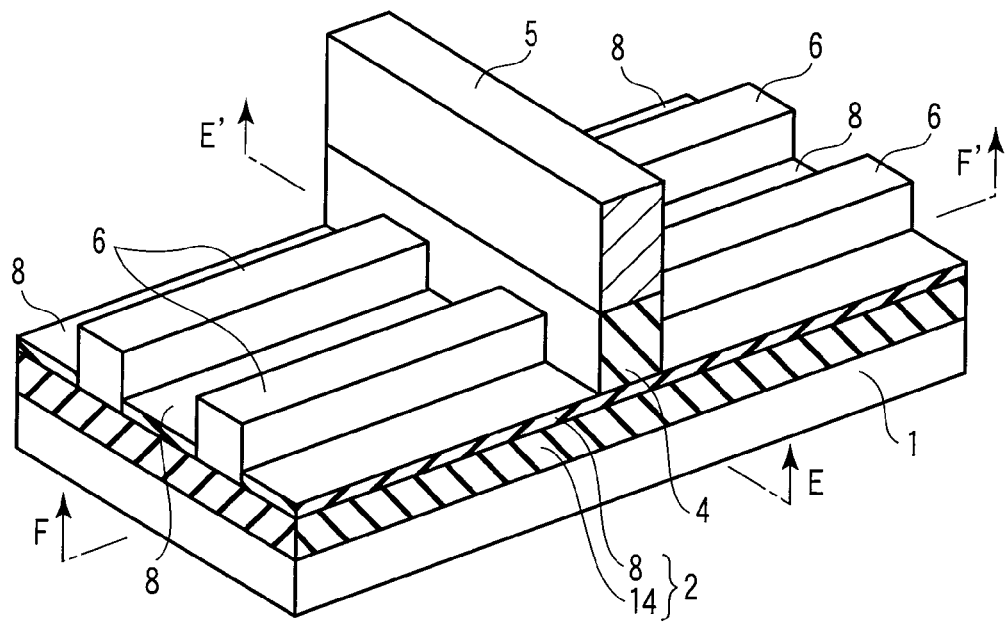
F I G. 25

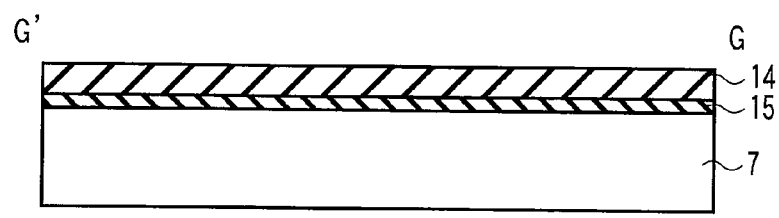
F I G. 37
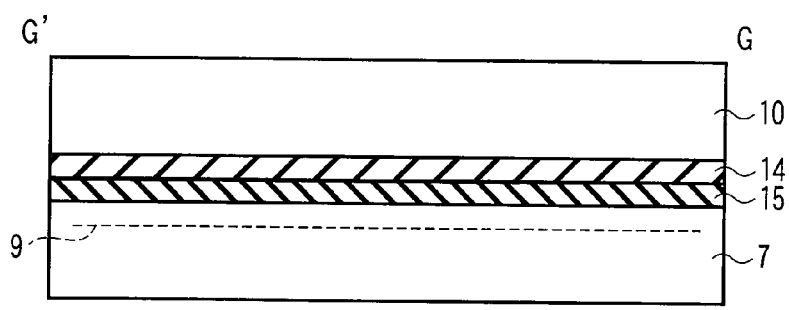
F I G. 38
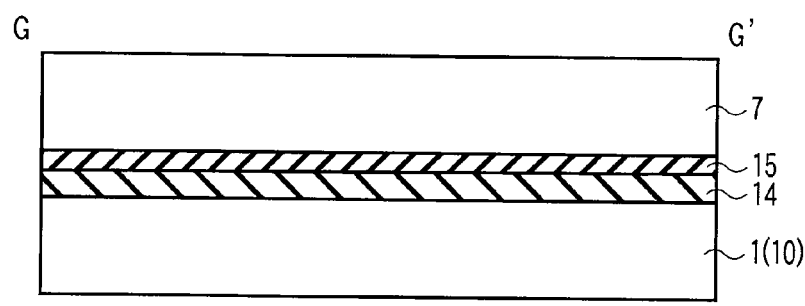
F I G. 39
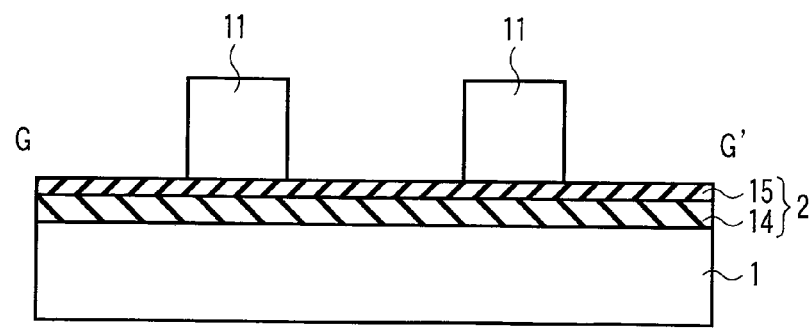
F I G. 40

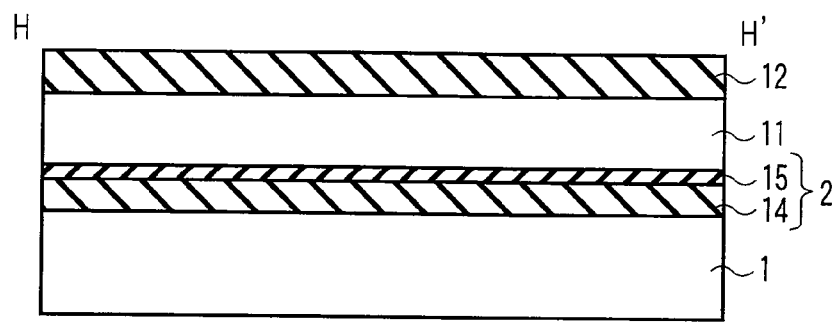
F I G. 41
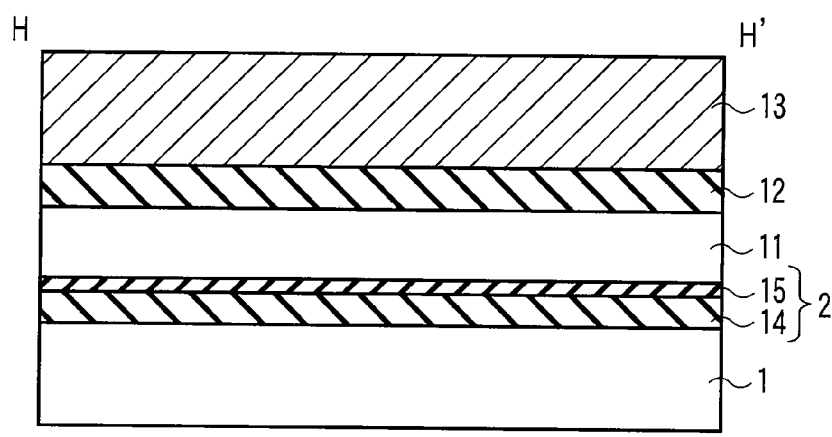
F I G. 42
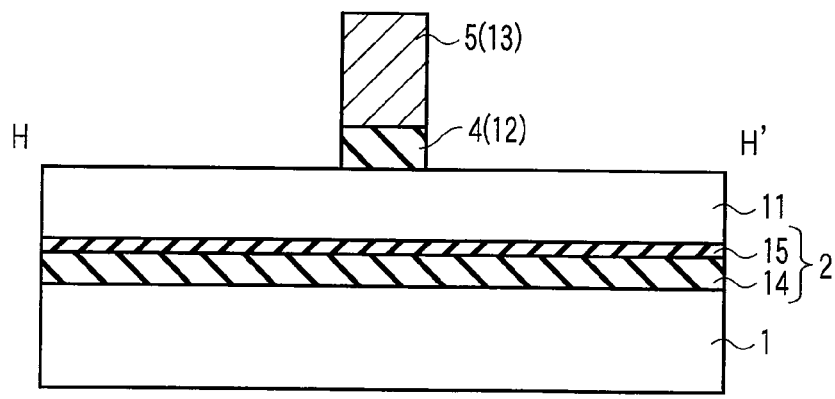
F I G. 43

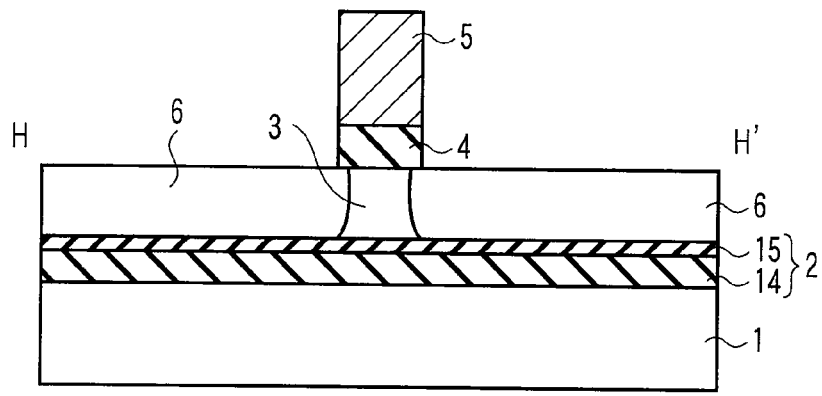
F I G. 44
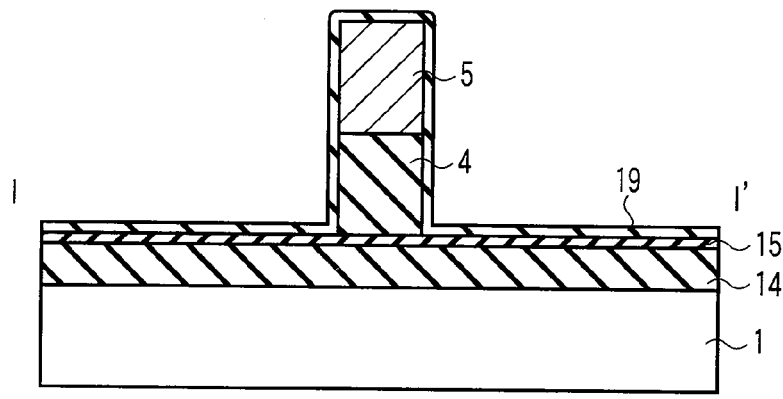
F I G. 45
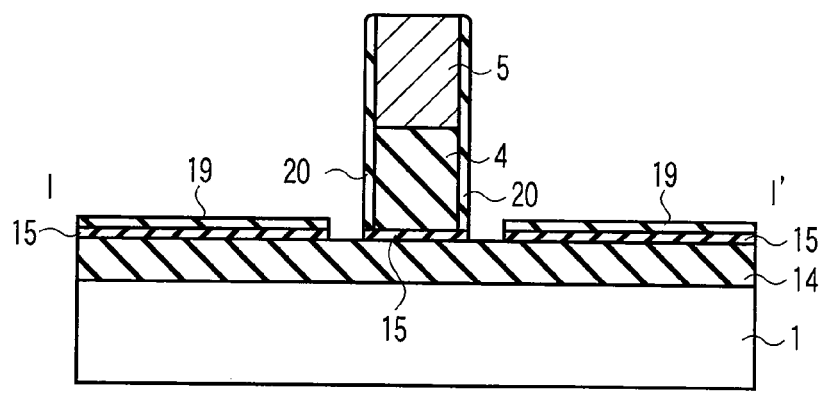
F I G. 46

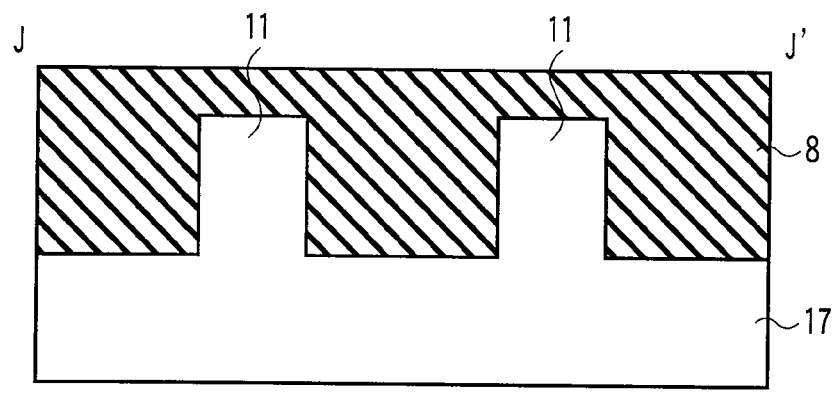
F I G. 53
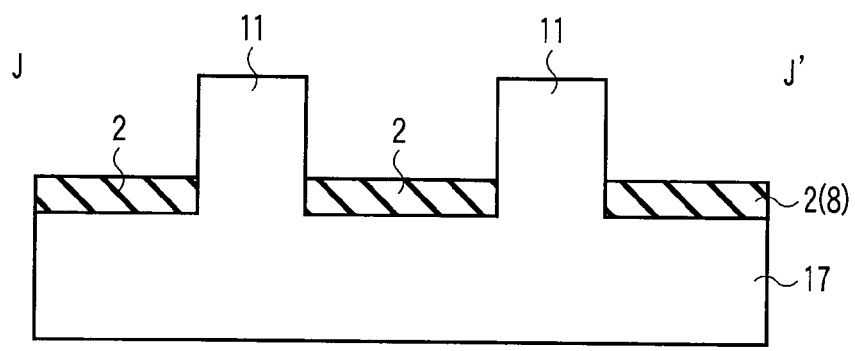
F I G. 54
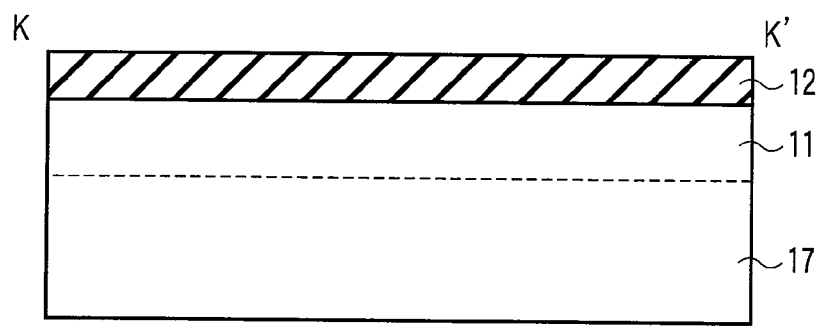
F I G. 55

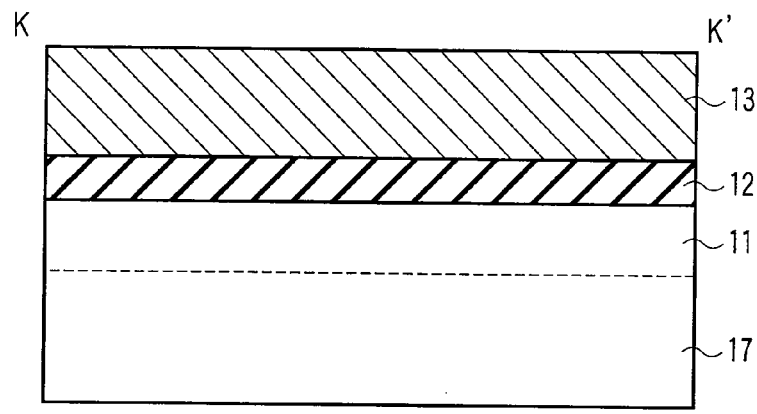
F I G. 56
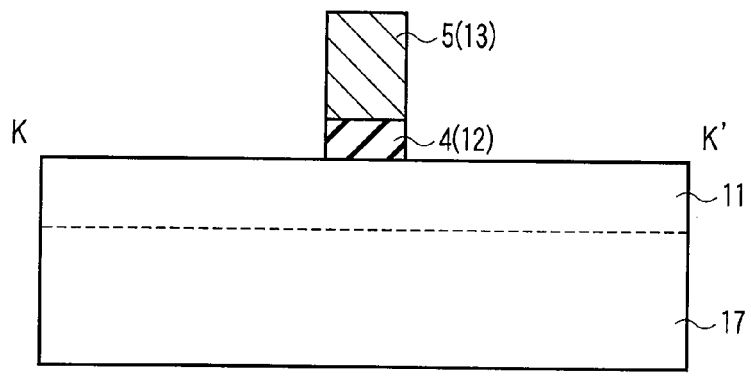
F I G. 57
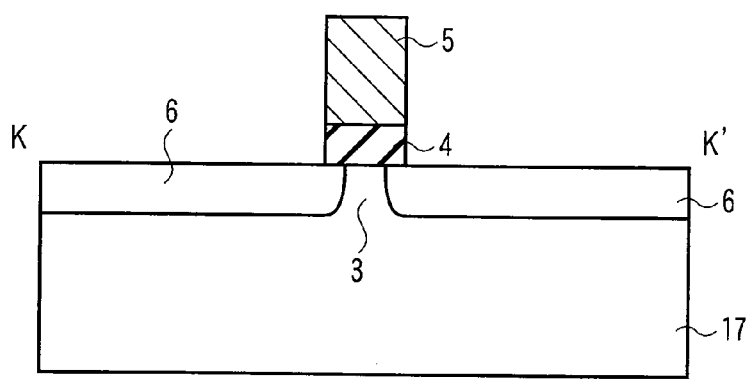
F I G. 58

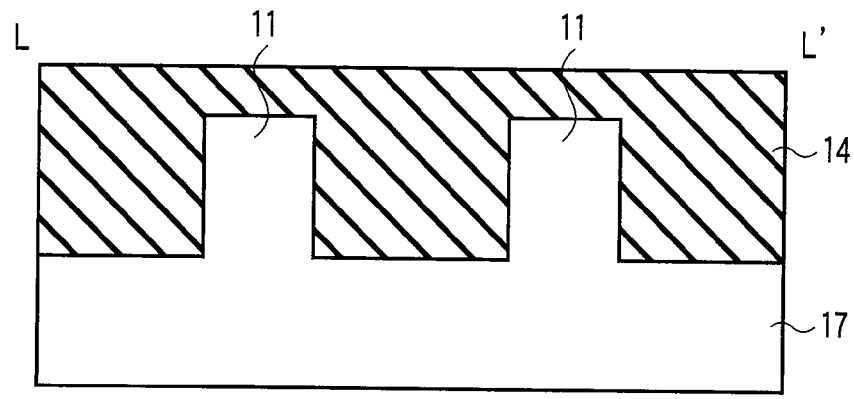
F I G. 61
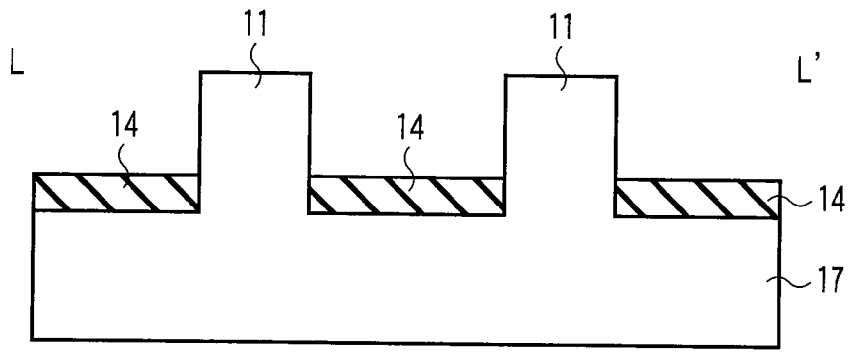
F I G. 62
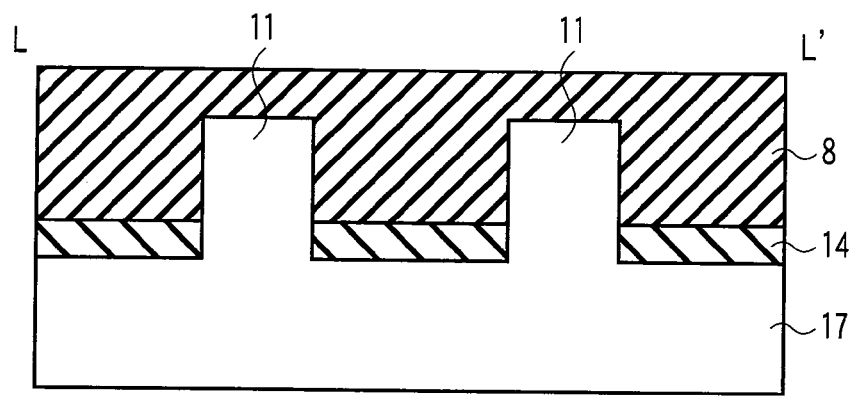
F I G. 63

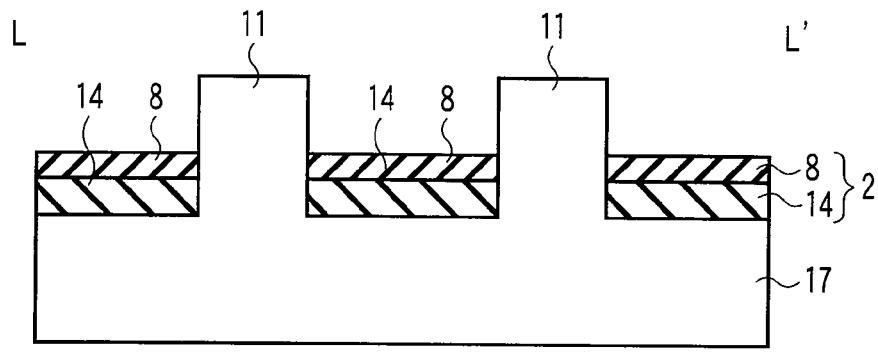
F I G. 64
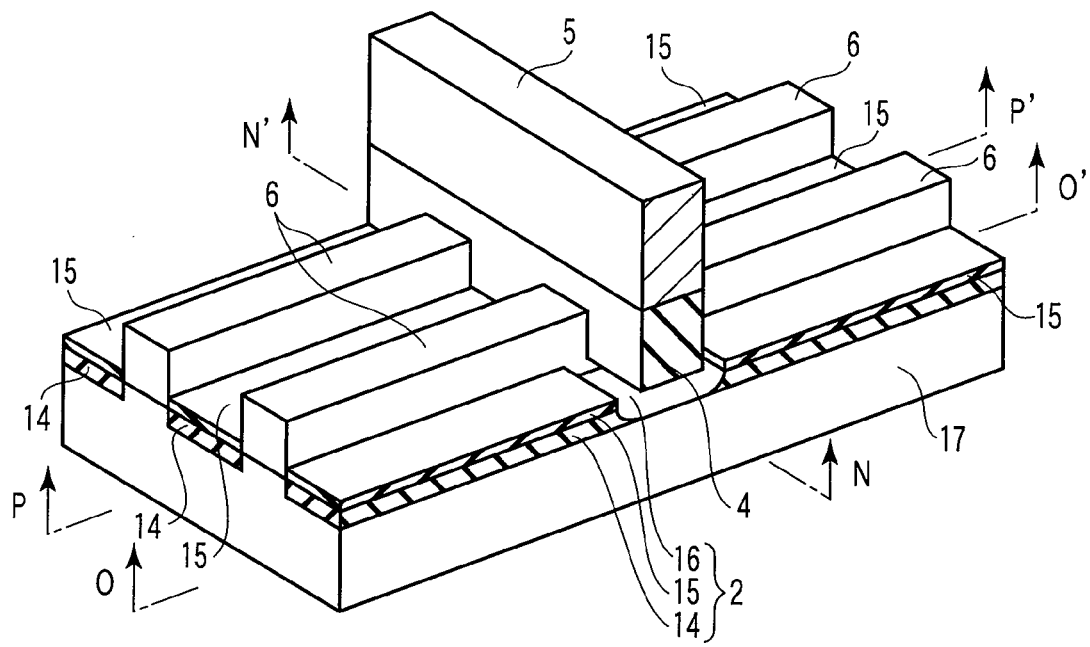
F I G. 65

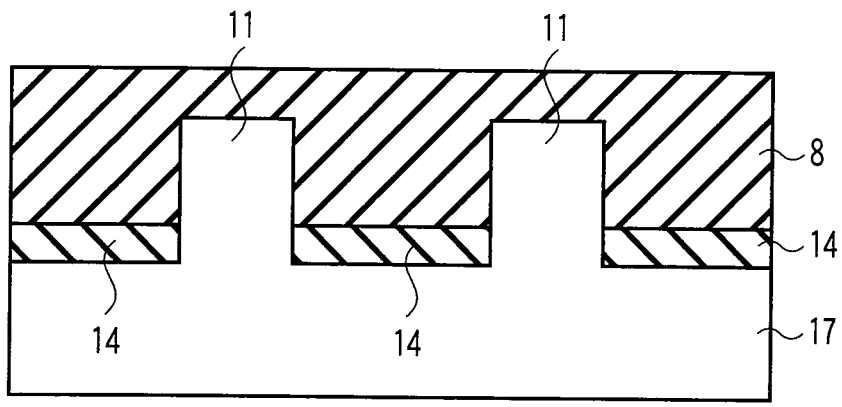
F I G. 69
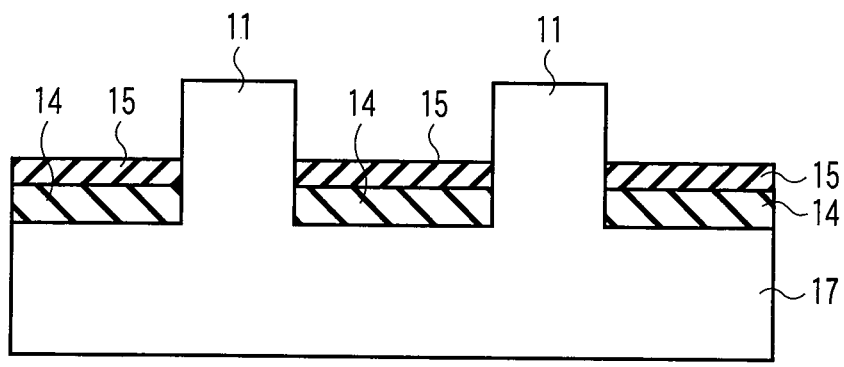
F I G. 70
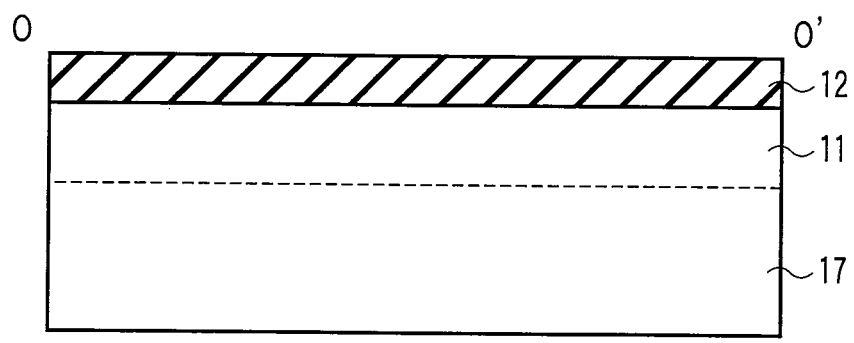
F I G. 71

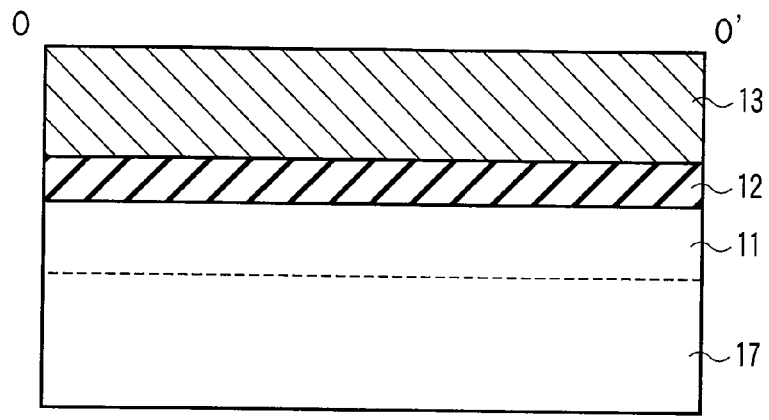
F I G. 72
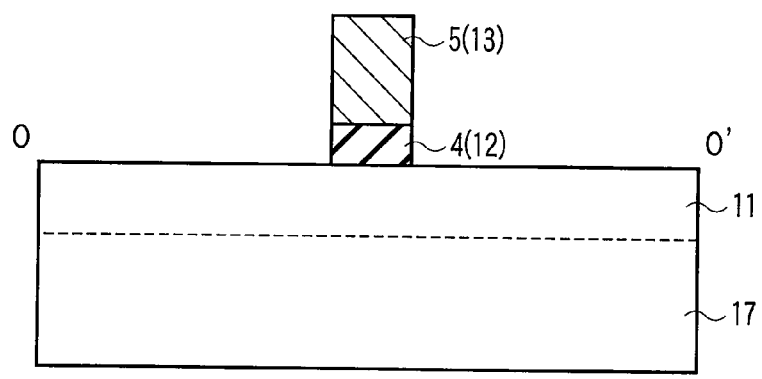
F I G. 73
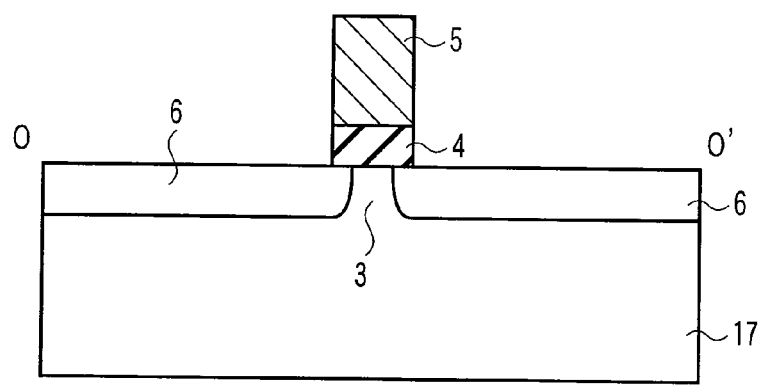
F I G. 74

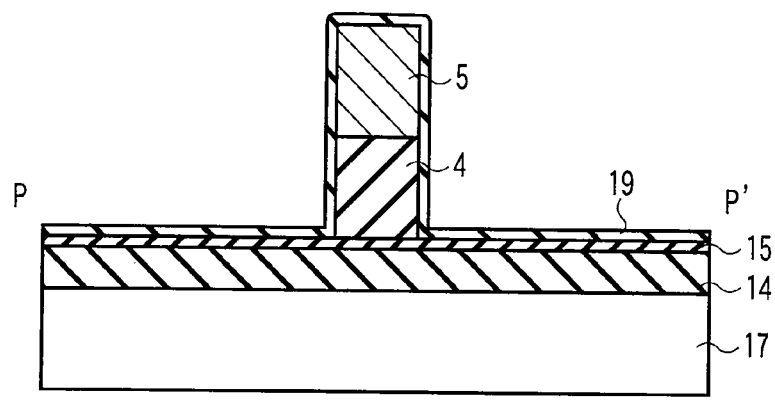
F I G. 75
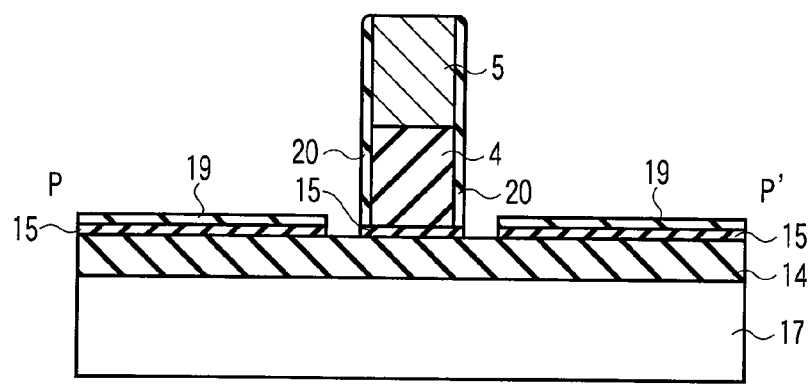
F I G. 76
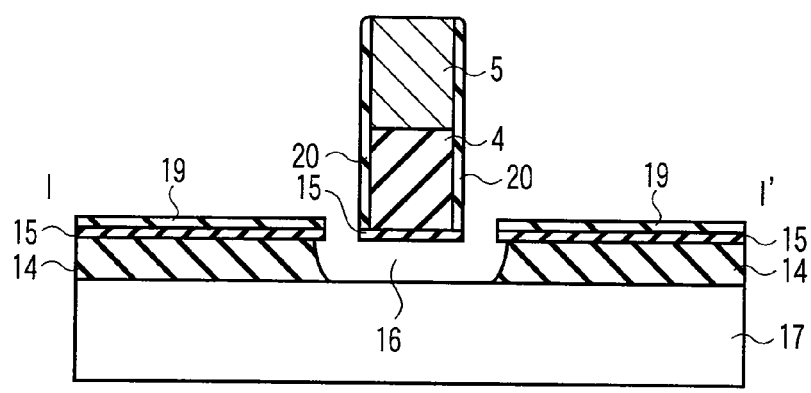
F I G. 77

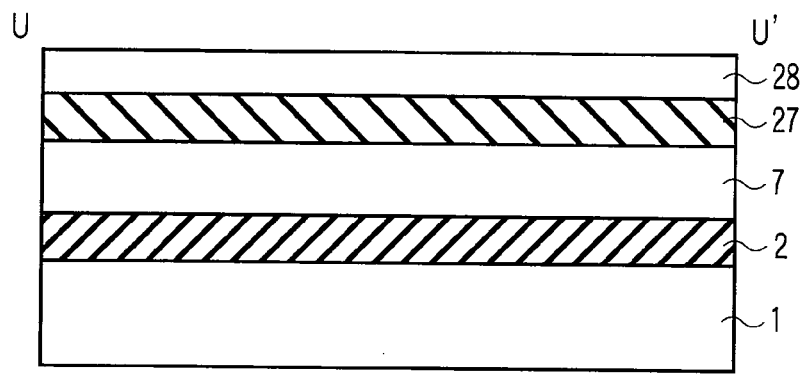
F I G. 83
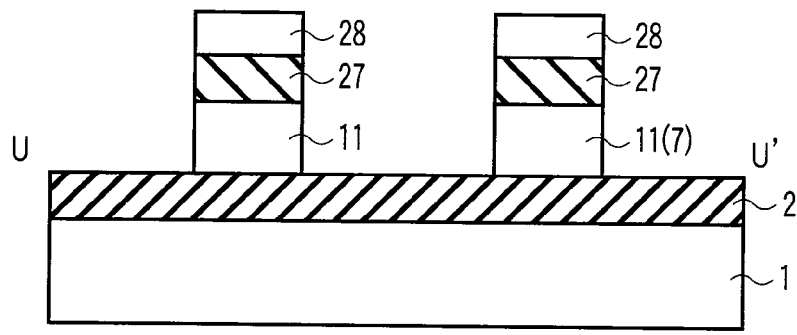
F I G. 84
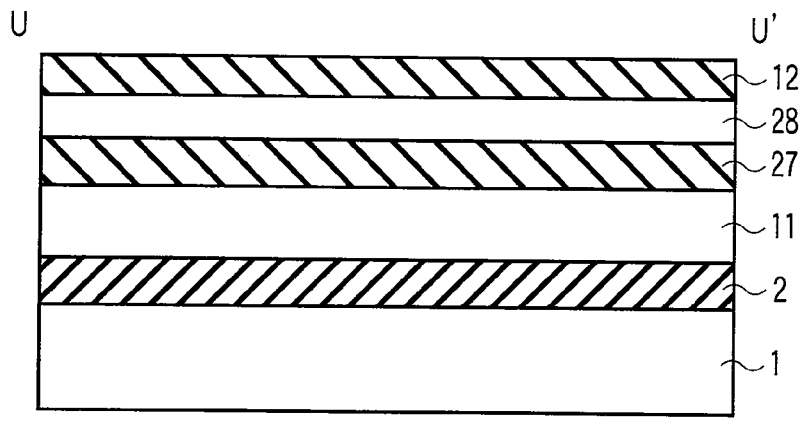
F I G. 85

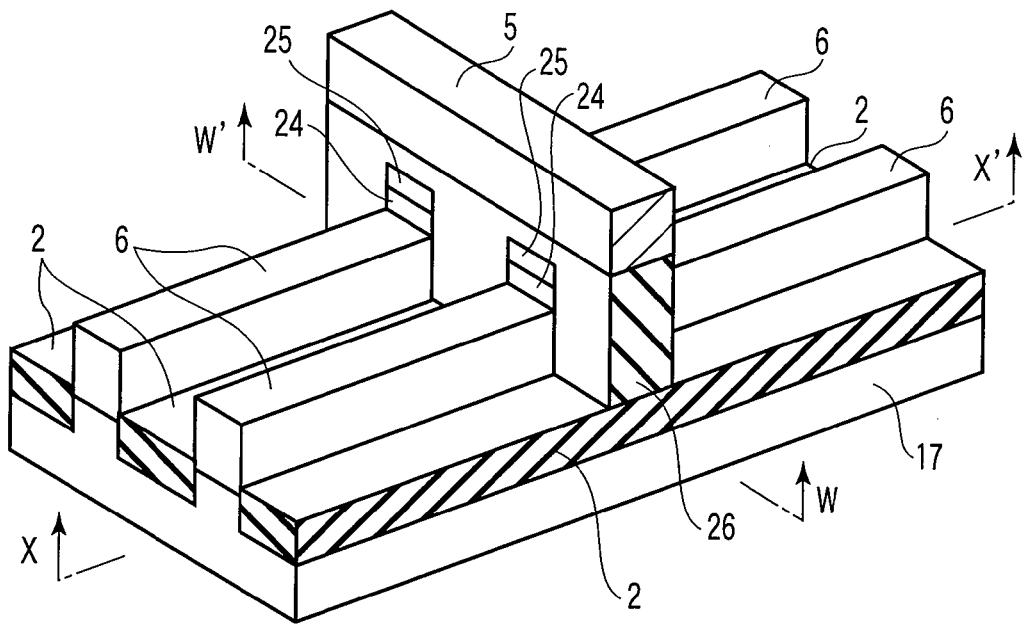
F I G. 89
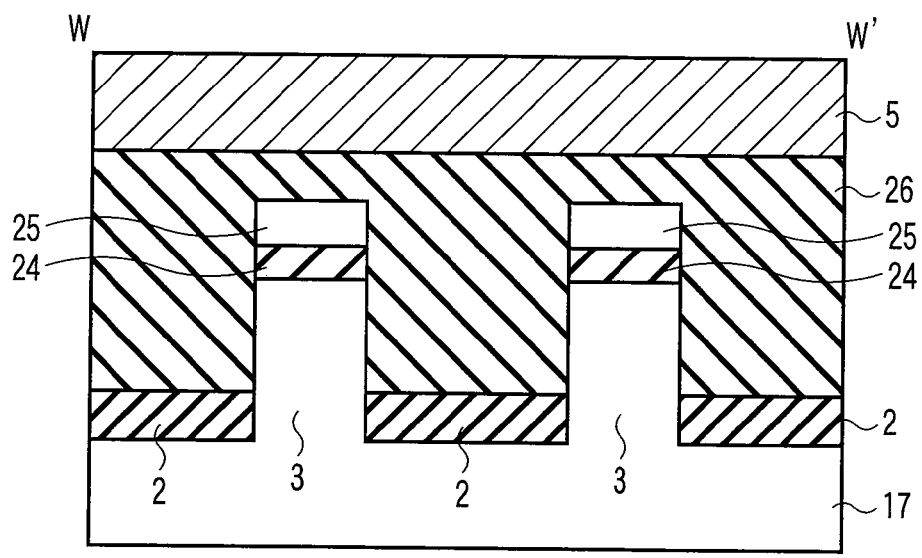
F I G. 90

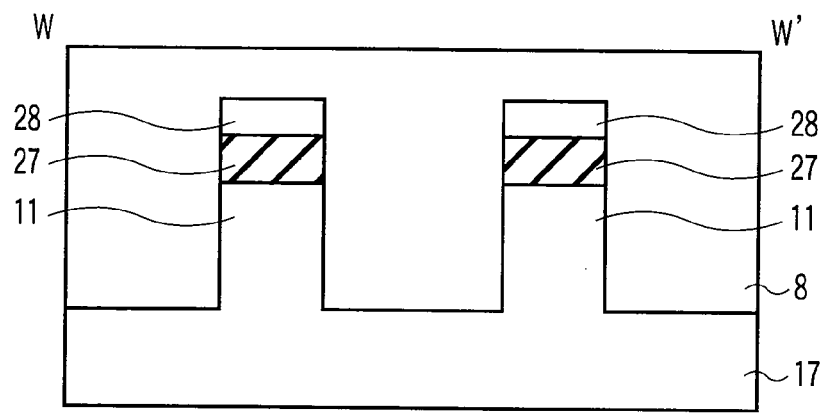
F I G. 94
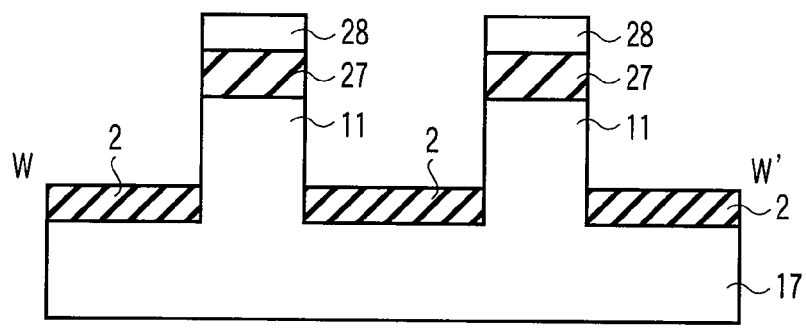
F I G. 95
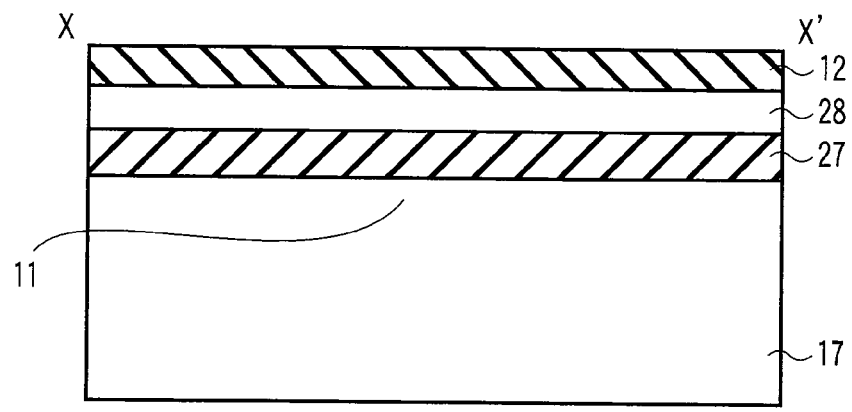
F I G. 96

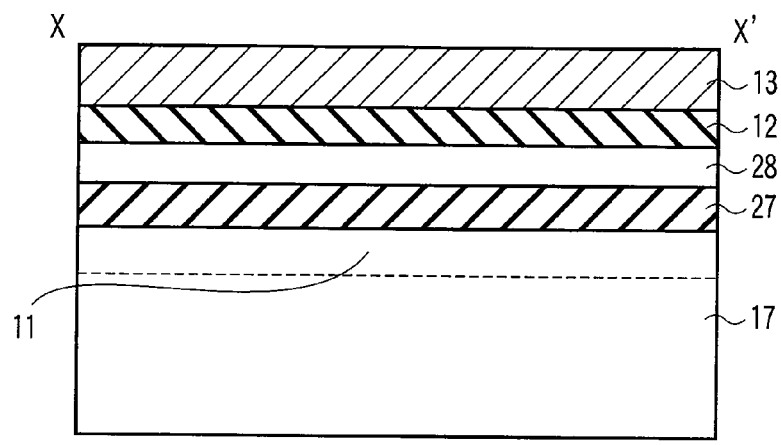
F I G. 97
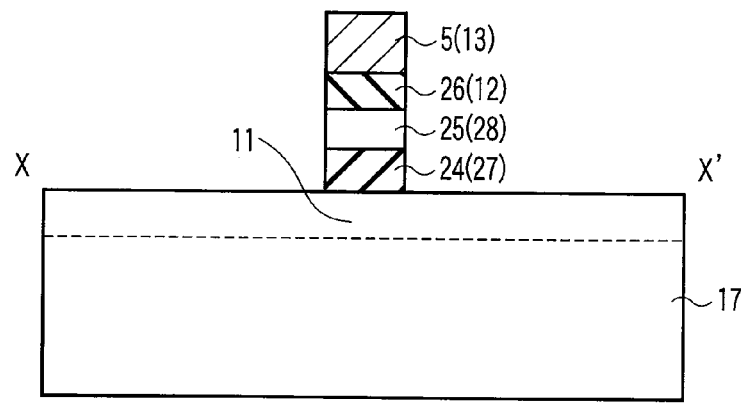
F I G. 98
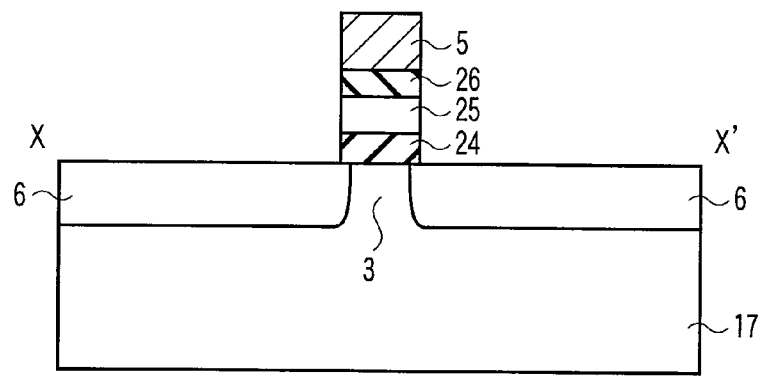
F I G. 99

SEMICONDUCTOR COMPONENT AND SEMICONDUCTOR DEVICE

CROSS-REFERENCE TO RELATED APPLICATIONS

This application is based upon and claims the benefit of priority from prior Japanese Patent Application No. 2008-004480, filed Jan. 11, 2008, the entire contents of which are incorporated herein by reference.

BACKGROUND OF THE INVENTION

1. Field of the Invention

The present invention relates to an MOS type semiconductor component having a plurality of wire-form semiconductor layers and to a semiconductor device using this semiconductor component.

2. Description of the Related Art

In a conventional MOS type semiconductor component, a gate electrode is formed on a planar channel region provided between source/drain regions through a gate insulating film. Control over a current flowing through the channel region is carried out by controlling a potential in the channel region based on capacitance coupling between the gate electrode and the channel region through the gate insulating film. Further, miniaturization of the component has been advanced to improve the performance of the component.

However, when miniaturization of the component advances, the potential in the channel region is greatly affected by not only the gate electrode but also a potential in the source/drain regions. Therefore, the controllability of the gate electrode over the potential in the channel region is lowered, and a so-called short channel effect, in which a current flowing through the channel region cannot be controlled by the gate electrode, thereby becomes obvious.

As a countermeasure for the above-explained problem, a so-called wire-form structure component in which a channel region is formed into a wire-form structure and a gate electrode is formed on upper, left, and right sides of the channel region through a gate insulating film has been proposed (see, e.g., J. P. Colinge, et al., "A silicon-on-insulator quantum wire," in Solid-State Electronics vol. 39 no. 1 (1996) pp. 49-51). Such a structure improves the controllability of the gate electrode over the potential in the channel region and thereby enhances the controllability of the gate electrode for the current flowing through the channel region.

Further, since a film thickness of the gate insulating film is reduced as miniaturization of the component advances, when the gate insulating film is formed of the same silicon oxide as that used in the conventional technology, the current flowing through the gate insulating film cannot be ignored. As a result, the gate insulating film, which was intended to function as an insulating film, cannot function as the insulating film. As a countermeasure, there has been developed a component in which a gate insulating film is formed of a material having a higher dielectric constant than that of a silicon oxide to increase a geometric thickness, i.e., a physical film thickness of the gate insulating film, thereby suppressing a current flowing through the gate insulating film (see, e.g., G. D. Wilk, et al., "High-k gate dielectrics: Current status and materials properties considerations," in Journal of Applied Physics vol. 89 no. 10 (2001) pp. 5243-5275).

In the above-explained wire-form structure component, although the controllability of the gate electrode with respect to the potential in the channel region can be improved, ingenuity must be exercised to obtain a high current driving force since the channel region is formed into a wire-form structure. Therefore, the current driving force is improved by forming a plurality of thin wires constituting the channel regions in parallel. Accordingly, intervals between the wire-form channel regions must be narrowed to densely form the channel regions in order to further improve the current driving force per unit width measured in parallel with a semiconductor substrate surface.

However, when each interval between the channel regions (thin wires) becomes lower than twofold the physical film thickness of the gate insulating film, a new problem occurs. That is, when each interval between the channel regions is wider than twofold the physical film thickness of the gate insulating film, since the gate electrode is formed above the upper, left, and right sides of each channel region, the controllability of the gate electrode with respect to the potential in each channel region is improved. This is one of advantages of the wire-form structure component. Here, the interval between the channel regions means a distance between the channel regions adjacent to each other, which is measured perpendicularly to a main direction of the current flowing through the channel region (thin wire) and in parallel with the semiconductor substrate surface.

However, when each interval between the channel regions is equal to or below twofold the gate insulating film, the gate electrode cannot be formed between the channel regions adjacent to each other, and the gate electrode is formed above the upper side of each channel region alone. In such a case, the advantage of the wire-form structure component, i.e., an improvement in the controllability of the gate electrode over the potential in the channel regions due to formation of the gate electrode above the upper, left, and right sides of each channel region is lost.

Therefore, each interval between the channel regions cannot be narrowed to be less than twofold the physical film thickness of the gate insulating film, which obstructs an improvement in the current driving force. As explained above, the conventional technology has a problem that suppression of the short channel effect due to an improvement in the controllability of the gate electrode over the potential in the channel regions and acquirement of a high current driving force cannot be achieved.

Therefore, in the wire-form structure component, even when the gate electrode is formed above the upper side of each channel region alone, improving the controllability of the gate electrode for the potential in each channel region has been demanded. When the short channel effect is suppressed by improving the controllability of the gate electrode, a component in which each interval between the channel regions is narrower than twofold the physical film thickness of the gate insulating film can be constructed. As a result, a component having the suppressed short channel effect and a high current driving force can be realized.

BRIEF SUMMARY OF THE INVENTION

According to one aspect of the invention, there is provided a semiconductor component, which includes:

a semiconductor substrate;

an insulating region provided on the semiconductor substrate;

a plurality of wire-form semiconductor layers of a first conductivity type aligned on the insulating region substantially parallel to each other and each having an upper surface and a side surface;

a plurality of source/drain regions of a second conductivity type provided to each wire-form semiconductor layer to be apart from each other;

a channel region provided between the source/drain regions of each of the wire-form semiconductor layers;

a first insulating film provided on the upper surface and the side surface of each channel region; and a gate electrode provided on the first insulating film and continuously provided to cross the wire-form semiconductor layers, wherein a length of each channel region measured perpendicularly to a current flowing through the wire-form semiconductor layers in a wire direction and in parallel to a surface of the semiconductor substrate is equal to or below twofold a maximum depletion layer width determined based on an impurity concentration in the channel region, each interval between the wire-form semiconductor layers is equal to or below twofold an interval between the upper surface of the wire-form semiconductor layer and the gate electrode, and a specific dielectric constant of at least a part of a surface of the insulating region is lower than 3.9.

BRIEF DESCRIPTION OF THE SEVERAL VIEWS OF THE DRAWING

FIG. 8 is a characteristic view for explaining a relationship between a channel length and a threshold voltage improvement of the semiconductor component according to the first embodiment;

FIG. 9 is a characteristic view for explaining a relationship between an interval between channel regions and a threshold voltage improvement of the semiconductor component according to the first embodiment;

FIGS. 12 to 19 are cross sectional views for explaining a manufacturing process of the semiconductor component according to the first and eighth embodiments in stages;

FIG. 20 is a perspective view for explaining a structure of a semiconductor component according to a second embodiment;

FIGS. 23 and 24 are cross-sectional views for explaining a manufacturing process of the semiconductor component according to the second embodiment in stages;

FIG. 25 is a perspective view for explaining a structure of a semiconductor component according to a third embodiment;

FIGS. 37 to 48 are cross-sectional views for explaining a manufacturing process of the semiconductor component according to the fourth embodiment;

FIGS. 52 to 58 are cross-sectional views for explaining a manufacturing process of the semiconductor component according to the fifth and ninth embodiments in stages;

FIGS. 61 to 64 are cross-sectional views for explaining a manufacturing process of the semiconductor component according to the sixth embodiment in stages;

FIG. 65 is a perspective view for explaining a structure of a semiconductor component according to a seventh embodiment;

FIGS. 69 to 78 are cross-sectional views for explaining a manufacturing process of the semiconductor component according to the seventh embodiment in stages;

FIGS. 82 to 88 are cross-sectional views for explaining a manufacturing process of the semiconductor component according to the 10th embodiment of the present invention in stages;

FIG. 89 is a perspective view for explaining a structure of a semiconductor component according to an 11th Embodiment;

FIG. 90 is a cross-sectional view taken along a line W-W' in FIG. 89;

FIGS. 92 to 99 are cross-sectional views for explaining a manufacturing process of the semiconductor component according to the 11th embodiment in stages;

DETAILED DESCRIPTION OF THE INVENTION

Embodiments according to the present invention explained below can realize a semiconductor component that can improve the controllability of a gate electrode for a potential in channel regions to suppress a short channel effect and has a high current driving force.

Embodiments according to the present invention will now be explained hereinafter in detail with reference to the drawings. It is to be noted that an interlayer insulating film, a wiring metal, and other parts are omitted in structural drawings of all the embodiments. Further, the scale is not accurate. Although an example of an n-type semiconductor component will be explained in a manufacturing method, the present invention can be likewise applied to a p-type component except a conductivity type of an impurity which should be reversed. Further, the present invention is not restricted to the following embodiments and can be modified in many ways when carried out.

First Embodiment

Figure 1:
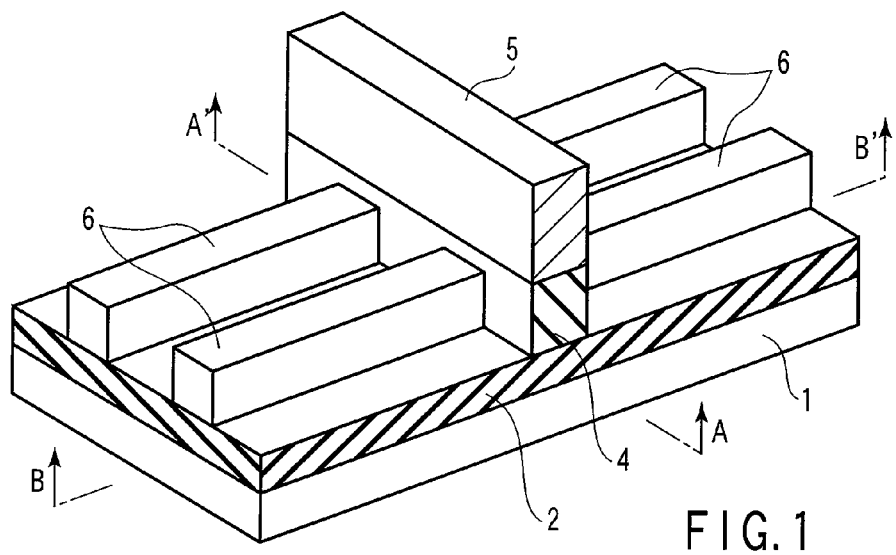
FIG. 1 is a perspective view for explaining a structure of a semiconductor component according to first and eighth embodiments.
Figure 2:
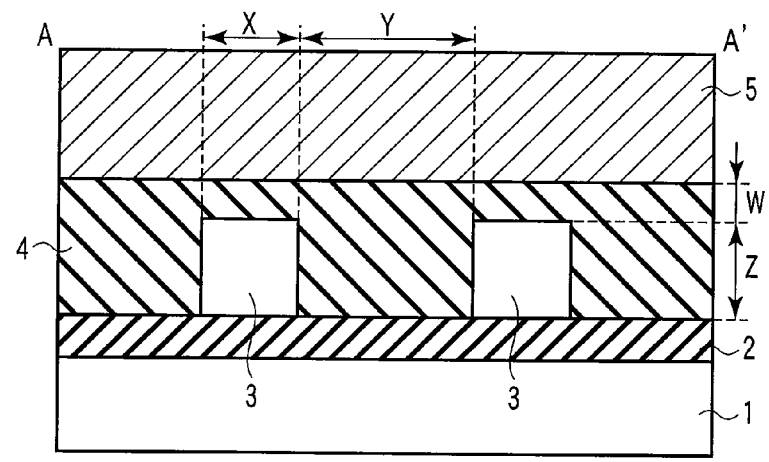
FIG. 2 is a cross-sectional view taken along a line A-A' in FIG. 1.
Figure 3:
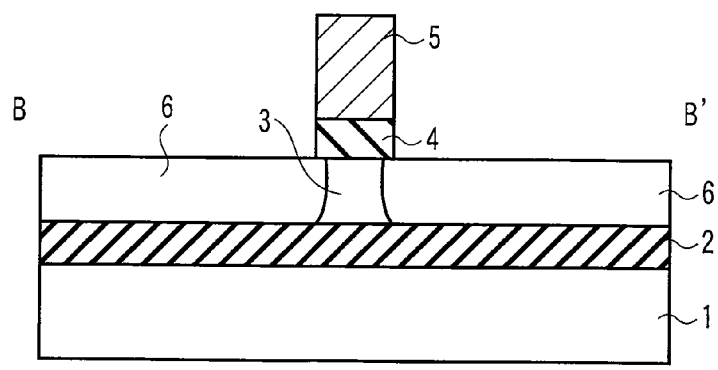
FIG. 3 is a cross-sectional view taken along a line B-B' in FIG. 1.

FIG. 1 schematically shows a structure of a semiconductor component according to a first embodiment. FIGS. 2 and 3 show cross sections taken along a line A-A' and a line B-B' in FIG. 1, respectively. W, X, Y, and Z in FIG. 2 will be explained later.

In a semiconductor component according to this embodiment, an insulating region 2 is formed on a semiconductor substrate 1, and wire-form semiconductor layers are formed on the insulating region 2. Each channel region 3 is formed between source/drain regions 6 formed in the semiconductor layer, and a gate insulating film 4 is formed on an upper surface and right and left side surfaces of each channel region 3. A gate electrode 5 is formed on the gate insulating film 4. A width of each channel region 3 is formed to be equal to or smaller than twofold a maximum depletion layer width determined based on an impurity concentration in the channel region, and a dielectric constant of a surface of the insulating region 2 is formed to be lower than that of a silicon oxide.

Here, in this embodiment, the "maximum depletion layer width determined based on an impurity concentration in the channel region" means a width of a deletion layer which is formed when a voltage equal to a value obtained by dividing a forbidden band width (1.1 eV) of silicon by an elementary electric charge ($1.6 \times 10^{-19}$ C) is applied to a space between a front surface and a back surface of a substrate in a semiconductor substrate with a sufficient thickness including an impurity having a concentration equal to that in the channel region.

When the width of the channel region is set to be equal to or narrower than twofold the "maximum depletion layer width determined based on an impurity concentration in the channel region", a potential in the channel region is controlled by a gate electrode through capacitance coupling formed between the gate electrode and the upper, left, and right surfaces of the channel region. As a result, a short channel effect can be very effectively suppressed as compared with a planar structure.

Configuring a component as shown in FIG. 1 results in increasing capacitance coupling between the side surface of the channel region 3 and a gate electrode 5 even though the gate electrode 5 is formed above the upper side alone of the channel region 3 of the semiconductor layer formed into a wire shape. As a result, the controllability of the gate electrode 5 with respect to a potential in the channel region 3 is improved, and the short channel effect is suppressed. This will be explained hereinafter in detail.

Figure 4:
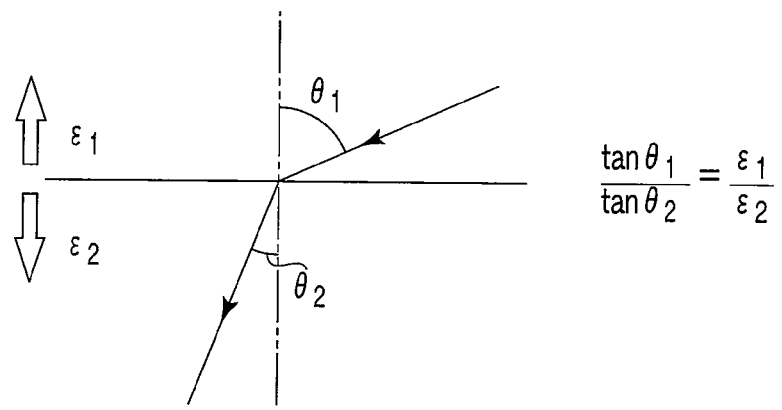
FIG. 4 is a schematic view for explaining refraction of an electric flux line at a plane at which two substances having dielectric constants face each other.

First, a general discontinuous plane of dielectric constants is typically considered as shown in FIG. 4. It is assumed that a dielectric constant above a solid line in FIG. 4 is $\epsilon_1$ and a dielectric constant below the same is $\epsilon_2$. Here, an example where $\epsilon_1 > \epsilon_2$ is shown. A line of electric force running through the discontinuous plane is considered. Assuming that angles formed between the line of electric force and a normal line of the discontinuous plane on both sides of the discontinuous plane are $\theta_1$ and $\theta_2$, $\tan(\theta_1)/\tan(\theta_2) = \epsilon_1/\epsilon_2$ is achieved. Therefore, considering a case where $\epsilon_1$ is a given specific value, $\theta_1$ becomes larger as $\epsilon_2$ is reduced. That is, on a side of the discontinuous plane of the dielectric constants where the dielectric constant is $\epsilon_1$, the line of electric force becomes close to parallel to the discontinuous plane. This embodiment according to the present invention utilizes this phenomenon.

Figures 5A, 5B:
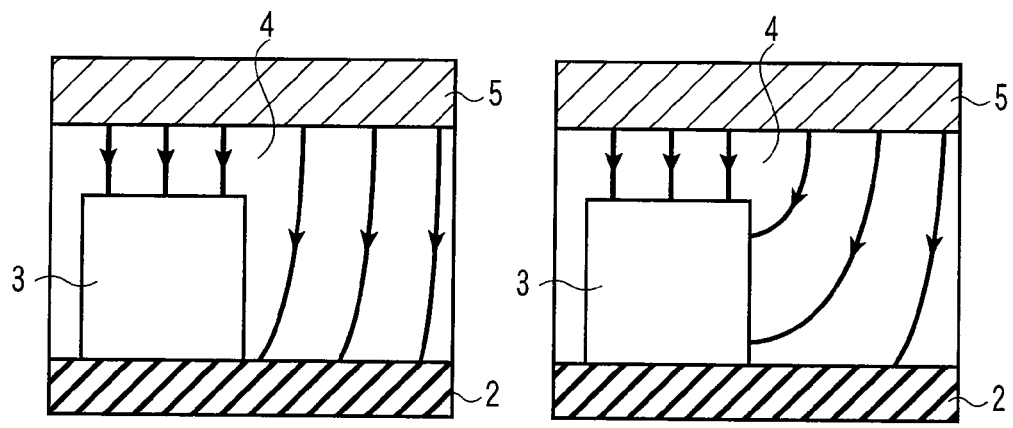
FIGS. 5A and 5B are cross-sectional views for explaining that capacitance coupling between a side surface of a channel region and a gate electrode in the semiconductor component according to the first embodiment is increased.

FIGS. 5A and 5B schematically show a part of a cross section taken along A-A' in FIG. 1 near the channel region 3. It is to be noted that the support semiconductor substrate 1 is omitted in the drawings. Furthermore, only one channel region 3 is shown. FIG. 5A shows an example where a dielectric constant of the insulating region 2 has a given specific value and FIG. 5B shows an example where the dielectric constant of the insulating region 2 is lower than that in FIG. 5A, respectively. It is to be noted that lines of electric force are shown in the gate insulating film 4 alone in the drawings.

Comparing the example in FIG. 5A with that in FIG. 5B, the lines of electric force exiting the gate electrode cross an interface between the gate insulating film 4 and the insulating region 2 to become nearly parallel to the interface in the example FIG. 5B as compared with that in FIG. 5A due to properties of the angle formed between the normal line of the discontinuous plane of dielectric constants and the line of electric force explained with reference to FIG. 4.

As a result, in the example shown in FIG. 5B, the lines of electric force exiting the gate electrode are bent toward the channel region 3 as compared with the example depicted in FIG. 5A. Consequently, capacitance coupling formed between the side surface of the channel region and the gate electrode has a larger value in FIG. 5B than in FIG. 5A.

Due to such a reason, in the semiconductor component according to the present invention, even when the gate electrode 5 is formed above the upper side of the channel region 3 alone which is formed into a wire shape, capacitance coupling between the side surface of the channel region 3 and the gate electrode 5 is increased. As a result, the controllability of the gate electrode 5 over the potential in the channel region 3 is improved, thus suppressing the short channel effect.

When a conventionally utilized silicon oxide is adopted as the insulating region 2, setting a dielectric constant of the insulating region 2 to be lower than that of the silicon oxide enables constructing a component in which the short channel effect is suppressed as compared with a conventional semiconductor component.

In addition to the above-explained result, when the plurality of channel regions 3 are formed, not only can a current driving force be improved, but also each interval Y between the channel regions 3 (see FIG. 2) can be narrowed to become equal to or smaller than twofold a physical film thickness W of the gate insulating film 4 (see FIG. 2). As a result, the current driving force of the component can be further improved.

It is to be noted that an n-type semiconductor component is assured in this example and the lines of electric force exiting the gate electrode 5 are illustrated. However, this is not essential. Even in case of a p-type component, the same effect as that of the n-type component can be obtained except that a direction of the line of electric force is reversed as a result of a reverse polarity.

The short channel effect was examined by using a numerical simulation, and the result of such will now be explained. A component used in the simulation is a component in which a channel region has a square cross section having each side of 10 nm, a gate insulating film has a relative dielectric constant of 19.5 (i.e., fivefold of the silicon oxide) and a physical film thickness of 5 nm on the channel region. That is, an equivalent oxide thickness of the gate insulating film is 1 nm. Here, the equivalent oxide thickness means a value obtained by dividing a product of the physical film thickness and the relative dielectric constant (3.9) of the silicon oxide by the relative dielectric constant of the insulating film. The component having such a structure was subjected to a three-dimensional simulation.

Figure 6:
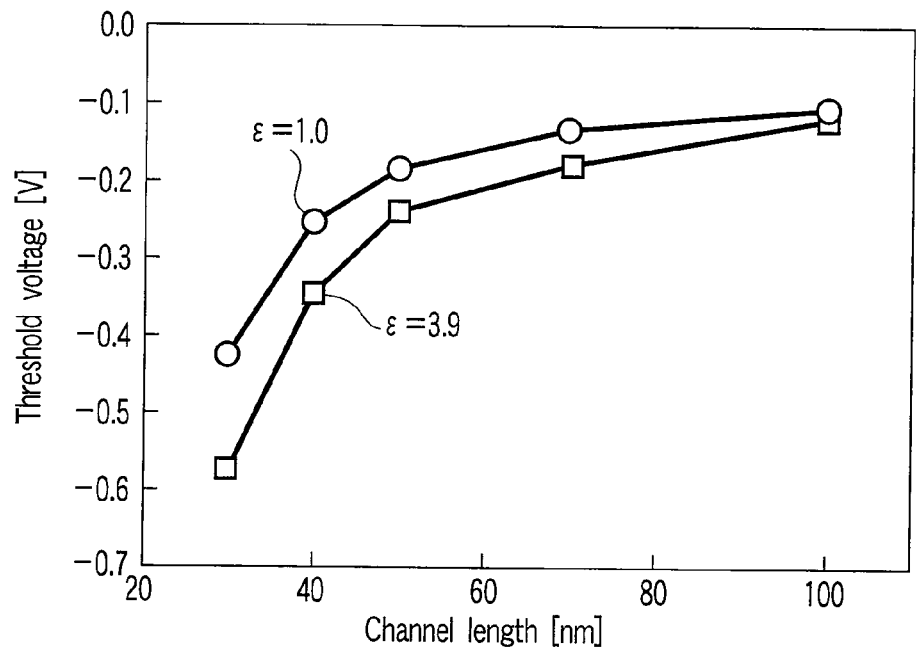
FIG. 6 is a characteristic view for explaining a relationship between a channel length and a threshold voltage of the semiconductor component according to the first embodiment.
Figure 7:
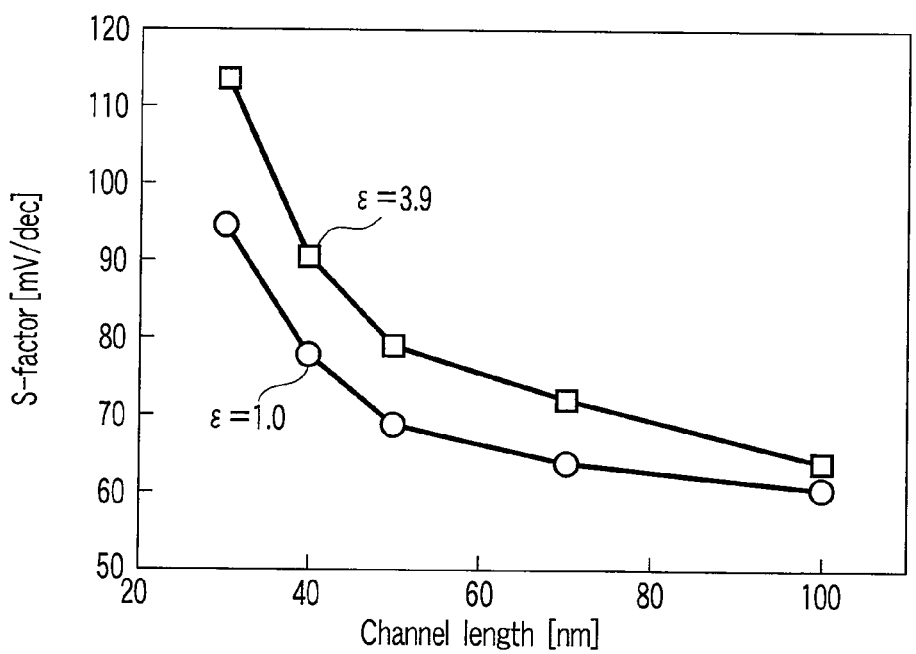
FIG. 7 is a characteristic view for explaining a relationship between a channel length and an S-factor of the semiconductor component according to the first embodiment.

FIGS. 6 and 7 show dependences of a threshold voltage and an S-factor with respect to a channel length, respectively. First, referring to FIG. 6, the threshold voltage is reduced with a decrease in channel length due to the short channel effect. A relative dielectric constant of the insulating region is set to 1.0 (indicated by ○) in this embodiment, and it can be understood that the short channel effect is effectively suppressed in this examination as compared with a component according to the conventional technology where a specific dielectric constant of an insulting region is set to 3.9, which is a value of the silicon oxide (indicated by □).

Now, referring to FIG. 7, the S-factor is increased with a reduction in channel length due to the short channel effect. The S-factor is small in this embodiment where the relative dielectric constant of the insulating region is set to 1.0 (indicated by ○) as compared with the component according to the conventional technology where a specific dielectric constant of an insulting region is set to 3.9, which is a value of the silicon oxide (indicated by □), and it can be understood that the short channel effect is effectively suppressed.

As explained above, it was demonstrated that the short channel effect is effectively suppressed in the semiconductor component according to this embodiment. Therefore, in the component where the plurality of channel regions are formed in particular, the interval Y between the channel regions can be narrowed to be smaller than twofold the physical film thickness W of the gate insulating film, and the short channel effect can be suppressed, thereby providing a high-performance semiconductor component having a high current driving force.

It is to be noted that, in the component having each channel region 3 formed on the insulating region 2, reducing the dielectric constant of the insulating region 2 enables suppressing the short channel effect irrespective of the wire-form component. This can be understood as follows. When the dielectric constant of the insulating region is reduced, capacitance coupling formed between a drain region 6 and the channel region 3 is weakened due to the lines of electric force running through the insulating region. Therefore, an influence of the drain region 6 on the potential of the channel region 3 is weakened, and the controllability of the gate electrode 5 with respect to the potential in the channel region 3 is thereby improved.

Although the component according to this embodiment has the same effect as that explained above, the component in which each channel region has a wire shape has a different effect, in which capacitance coupling formed between the gate electrode 5 and the side surface of the channel region 3 is intensified, as explained with reference to FIGS. 5A and 5B. Examination using a simulation was performed to quantitatively consider this fact, and its result will now be explained hereinafter.

In this embodiment, a difference in threshold voltage between an example where the relative dielectric constant of the insulating region 2 is 1.0 and that where the same is 3.9 will be referred to as an "improvement in a reduction in threshold voltage". When the dielectric constant of the insulating region 2 is reduced, capacitance coupling formed between the drain region 6 and the channel region 3 is weakened due to the lines of electric force running through the insulating region 2, thereby suppressing the short channel effect.

First, in order to check the above-explained effect, a component which has a cross section shown in FIG. 3 and a uniform structure in a width direction of the channel was subjected to a two-dimensional simulation. In the component having this structure, since the channel region 3 does not have a side surface, reducing the dielectric constant of the insulating region 2 weakens capacitance coupling formed between the drain region 6 and the channel region 3 due to the lines of electric force running through the insulating region 2 alone, thereby enabling to extract this effect in the "improvement in a reduction in threshold voltage".

Making a difference between the above result and the result from the three-dimensional simulation considering the side surface of the channel region 3, which is shown in FIGS. 6 and 7, an effect due to increasing capacitance coupling formed between the gate electrode 5 and the side surface of the channel region 3, which is explained with reference to FIGS. 5A and 5B, is extracted in the "improvement in a reduction in threshold voltage". FIG. 8 shows relationship between a channel length and "the threshold voltage reduction due to increasing capacitance coupling formed between the gate electrode 5 and the side surface of the channel region 3", which is explained with reference to FIGS. 5A and 5B, in this "improvement in a reduction in threshold voltage".

Referring to FIG. 8, it can be understood that the "effect due to increasing capacitance coupling formed between the gate electrode and the side surface of the channel region" explained in conjunction with FIGS. 5A and 5B can be effectively obtained in the "improvement in a reduction in threshold voltage". Therefore, this embodiment is essentially different from a combination of simply setting the dielectric constant of the insulating region low and forming each channel region into the wire shape.

FIG. 9 shows dependence of the "effect due to increasing capacitance coupling formed between the gate electrode 5 and the side surface of the channel region 3" explained with reference to FIGS. 5A and 5B in the "improvement in a reduction in threshold voltage" with respect to each interval Y between the channel regions 3 (FIG. 2). The component used in the simulation is a component in which each channel region 3 has a square cross section having each side of 10 nm (i.e., X=10 [nm]), the gate insulating film 4 has a relative dielectric constant of 19.5 and a physical film thickness W of 5 nm on the channel region 3, and a relative dielectric constant of the insulating region 2 is 1.0 to 3.9, and a channel length of the component is changed from 30 nm to 100 nm as a parameter.

Referring to FIG. 9, when the interval Y between the channel regions 3 is increased, the "effect due to increasing capacitance coupling formed between the gate electrode 5 and the side surface of the channel region 3" explained with reference to FIGS. 5A and 5B is reduced in the "improvement in a reduction in threshold voltage". This effect is lost when the interval Y between the channel regions 3 becomes approximately 20 nm.

The above phenomenon can be explained as follows. When the interval between the channel regions 3 is increased, a degree that the potential in each channel region 3 is affected by the potential in the drain region 6 is increased through capacitance coupling formed between each channel region 3 and the drain region 6 due to the lines of electric force running through the gate insulating film 4 that is present in contact with the side surface of each channel region 3. As a result, the controllability of the gate electrode 5 over the potential in each channel region 3 is weakened.

In FIG. 9, an effect of a reduction in threshold voltage appears when $Y \leq 20$ nm. Since X=10 nm, $X/Y \geq 0.5$ is achieved. Since a degree of capacitance coupling is substantially fixed in similarity transformation of the component, it can be understood that 0.5 or above is preferable as a value obtained by dividing the width X of each channel region 3 by the interval Y between the channel regions.

Figure 10:
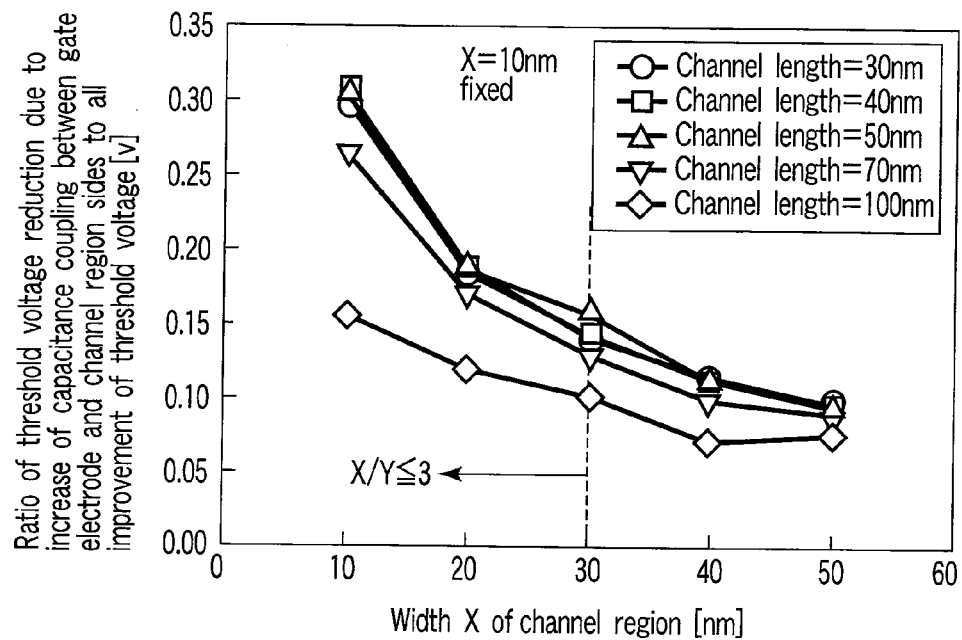
FIG. 10 is a characteristic view for explaining a relationship between a width of the channel region and a threshold voltage improvement of the semiconductor component according to the first embodiment.

A consideration will now be given as to a ratio of the "effect due to increasing capacitance coupling formed between the gate electrode 5 and the side surface of the channel region 3" explained with reference to FIGS. 5A and 5B in the "improvement in a reduction in threshold voltage" with respect to the entire "improvement in a reduction in threshold voltage". FIG. 10 shows dependence of this ratio with respect to the width X of each channel region 3. The component used in the simulation is a component in which both a height Z and the interval Y of the channel region 3 are 10 nm, the gate insulating film 4 has a relative dielectric constant of 19.5 and a physical film thickness W of 5 nm on the channel region 3, and the insulating region 2 has a relative dielectric constant of 1.0 to 3.9. A channel length of the component is changed from 30 nm to 100 nm as a parameter.

Referring to FIG. 10, it can be understood that the ratio of the "effect due to increasing capacitance coupling formed between the gate electrode 5 and the side surface of the channel region 3" explained with reference to FIGS. 5A and 5B in the "improvement in a reduction in threshold voltage" with respect to the entire "improvement in a reduction in threshold voltage" is reduced when the width of the channel region 3 is increased, and that the ratio is reduced by half when the width X of the channel region 3 becomes approximately 30 nm as compared with an example where the width of the channel region 3 is 10 nm.

This phenomenon occurs because an influence of the side surface of the channel region 3 is weakened when the width of the channel region 3 is increased, and the "effect due to increasing capacitance coupling formed between the gate electrode 5 and the side surface of the channel region 3" explained with reference to FIGS. 5A and 5B is thereby reduced in the "improvement in a reduction in threshold voltage". As explained above, the effect is prominent when Y=10 nm and the width X of the channel region 3 is equal to or below 30 nm. Since a degree of capacitance coupling is substantially fixed by similarity transformation, it can be understood that 3 or below is preferable as a value obtained by dividing the width of the channel region by the interval of the channel region, i.e., a value obtained by dividing X by Y in FIG. 2.

Here, in the wire-form component, the gate electrode 5 controls the potential in the channel region 3 from three directions, i.e., upper, left, and right directions, thereby improving the controllability of the gate electrode 5 over the potential in the channel region 3. Therefore, it is considered that this advantage is lost when the height of the channel region 3 is too high. Here, the height of the channel region 3 means a length of the channel region measured vertically to a surface of the semiconductor substrate, i.e., a length indicated by Z in FIG. 2.

Figure 11:
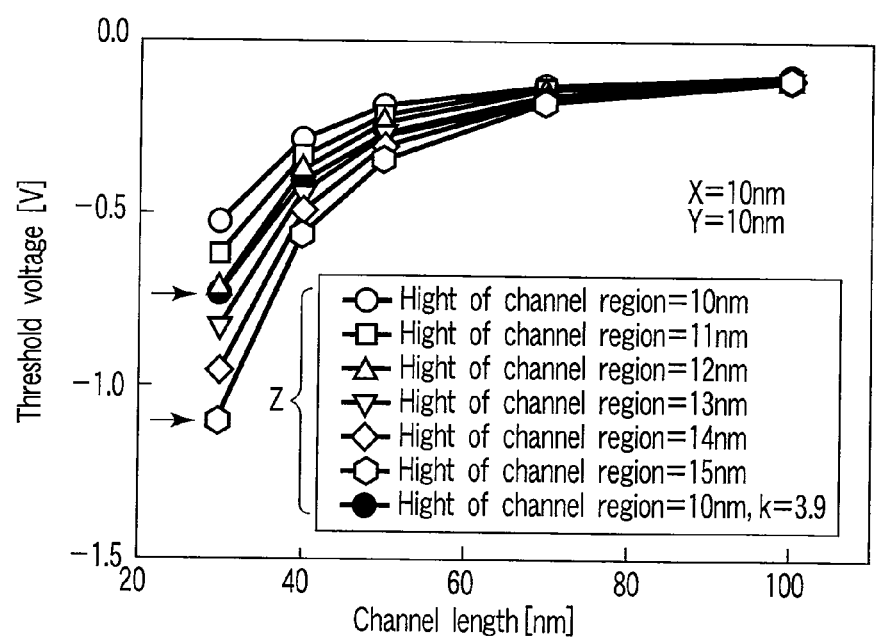
FIG. 11 is a characteristic view for explaining a relationship between a channel length and a threshold voltage when a height of the channel region is changed in the semiconductor component according to the first embodiment.

FIG. 11 shows dependence of a threshold voltage with respect to a channel length. The component used in a simulation is a component in which both a width X and an interval Y of the channel region 3 are 10 nm, the gate insulating film 4 has a relative dielectric constant of 19.5 and a physical film thickness W of 5 nm on the channel region 3, and the insulating region 2 has a relative dielectric constant of 1.0. A height Z of the channel region 3 is changed from 10 nm to 15 nm as a parameter. It is to be noted that the drawing also shows a result of a component in which the channel region 3 has a height Z of 10 nm and the insulating region 2 has a relative dielectric constant of 3.9 (shown by filled-in circles).

Referring to FIG. 11, in the component in which the channel region 3 has the height Z of 15 nm, a threshold voltage of the component having the channel length of 30 nm is approximately 1.0V lower than that of a component having a channel length of 100 nm. That is, a reduction in threshold voltage involved by a decrease in channel length is substantially equivalent to a power supply voltage which is expected in the component having the channel length of approximately 30 mm (see, e.g., International Technology Roadmap for Semiconductors 2006 Update, Process Integration, Devices & Structures).

In the component in which the width X of the channel region is 10 nm and the height Z of the channel region 3 is 15 nm, assuming that an allowable value of a reduction in threshold voltage is substantially equal to the above-explained value (1.0V), since a degree of capacitance coupling is substantially fixed in similar transformation of the component, it can be understood that 1.5 or below is preferable as a value obtained by dividing the height Z of the channel region by the width X of the channel region.

Furthermore, referring to FIG. 11, the component in which the channel region has the height of 12 nm provides values substantially equal to those of the component in which the height of the channel region is equal to the width of the same, i.e., 10 nm and the relative dielectric constant of the insulating region is 3.9. That is, the advantage of reducing the relative dielectric constant of the insulating region 2 is substantially lost. Since a degree of capacitance coupling is substantially fixed in similar transformation of the component, it can be understood that 1.2 or below is preferable as a value obtained by dividing the height Z of the channel region by the width X of the channel region.

Figure 12:
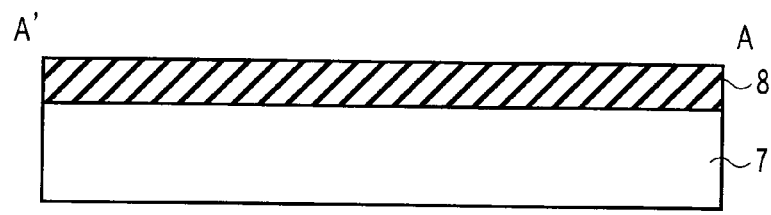

A manufacturing method of the semiconductor component according to this embodiment will now be explained. It is to be noted that FIGS. 12 to 15 show cross sections taken along A-A' in FIG. 1. First, as shown in FIG. 12, a silicon oxide film 8 which has a thickness of, e.g., 500 nm and contains, e.g., 12 atomic % of fluorine is formed on a first silicon substrate 7 based on a method such as a chemical vapor deposition method (which will be referred to as a CVD method hereinafter) using, e.g., an $SH_4$ gas, an $SF_4$ gas, an oxygen gas, or an argon (Ar) gas.

Figure 13:
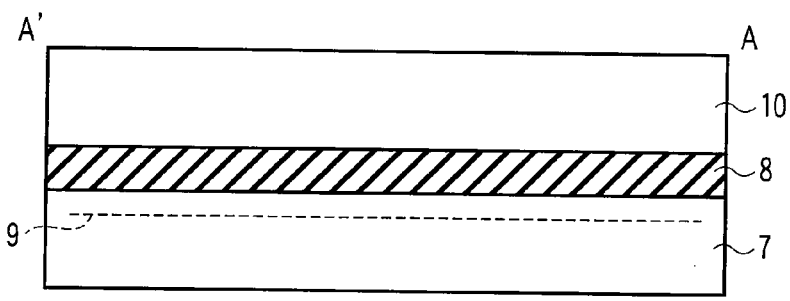

Then, as shown in FIG. 13, for example, H (hydrogen) ions 9 are implanted with, e.g., an energy of 65 keV and a dose of $5\times10^{16}/cm^2$. Subsequently, a second silicon substrate 10 is attached to an upper side of the silicon oxide film 8 containing fluorine.

Figure 14:
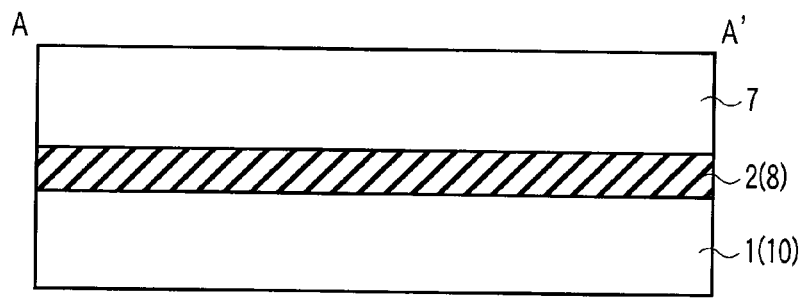

Then, as shown in FIG. 14, the first silicon substrate 7 is partially removed by performing a heat treatment at, e.g., 500° C. Thereafter, a surface of this substrate is flattened. It is to be noted that FIG. 14 and subsequent drawings show a structure which is turned upside down from the state of FIG. 13. In this manner, the second silicon substrate 10 serves as a support semiconductor substrate 1, and the silicon oxide 8 containing fluorine functions as an insulating region 2.

Figure 15:
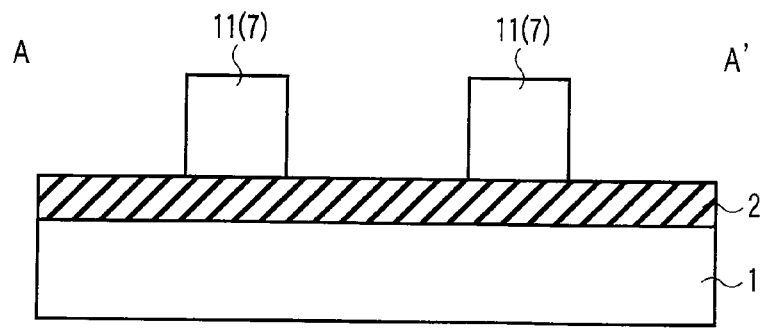

Then, as shown in FIG. 15, B (boron) ions are implanted into the first silicon substrate 7 with an energy of 5 keV and a dose of $1\times10^{12}/cm^2$, for example. Subsequently, the first silicon substrate 7 is subjected to anisotropic etching, e.g., a reactive ion etching method (which will be referred to as an RIE method hereinafter) to form semiconductor layers 11 each having a width of 10 nm.

FIGS. 16 to 19 are cross-sectional views taken along B-B' in FIG. 1. First, as shown in FIG. 16, for example, a hafnium oxide film 12 having a thickness of, e.g., 5 nm is formed on an entire surface of the insulating region 2 including each semiconductor layer 11 based on a method such as a CVD method.

Subsequently, as shown in FIG. 17, a W (tungsten) film 13 having a thickness of, e.g., 10 nm is formed on an entire surface of the hafnium oxide film 12 by using, e.g., the CVD method.

Then, as shown in FIG. 18, the W film 13 and the hafnium oxide film 12 are processed by performing anisotropic etching, e.g., the RIE method to form a gate insulating film 4 and a gate electrode 5.

Subsequently, as shown in FIG. 19, for example, As (arsenic) ions are implanted with, e.g., an energy of 10 keV and a dose of $1\times10^{15}/cm^2$ to form source/drain regions 6 and a channel region 3 provided therebetween. Thereafter, the semiconductor component according to the present invention shown in FIG. 1 is formed by carrying out an interlayer insulating film forming step or a wiring step in the same manner as in the conventional technology.

The manufacturing method according to the present invention can be likewise applied to a complementary type by introducing an impurity into a specific region alone in a substrate based on a method such as a photo engraving process. Further, the present invention can be also used for a semiconductor device partially including these structures.

Furthermore, although the formation process for the single semiconductor component alone has been explained in this embodiment, the present invention can be likewise used when forming a semiconductor component as a part of a semiconductor device which includes an active component such as a field-effect transistor, a bipolar transistor, or a single-electron transistor, a passive component such as a resistor, a diode, an inductor, or a capacitor, a semiconductor storage component, or a component using a ferroelectric substance, or a component using a magnetic substance besides the single semiconductor device. The present invention can be likewise applied when forming a semiconductor component as a part of an OEIC (an opto-electrical integrated circuit) or an MEMS (a micro electromechanical system).

Moreover, in this embodiment, although As is utilized as an impurity that is used to form an n-type semiconductor layer and B is utilized as an impurity that is used to form a p-type semiconductor layer, any other V group impurity may be adopted as the impurity that is used to form the n-type semiconductor layer or any other III group impurity may be adopted as the impurity that is used to form the p-type semiconductor layer. Additionally, in regard to introduction of the III group or V group impurity, a compound containing such an impurity may be used.

Further, although introduction of the impurity into the source and the drain is performed based on ion implantation in this embodiment, it may be carried out by using a method other than ion implantation, e.g., solid-phase diffusion or vapor-phase diffusion. Furthermore, a method of depositing or growing a semiconductor containing an impurity may be used. Moreover, a semiconductor containing an impurity may be deposited. Formation of a complementary type semiconductor device including an n-type component and a p-type component can be easily formed when the ion implantation method is used, and a high impurity concentration can be readily realized when an impurity is introduced by depositing a semiconductor containing the impurity or by using a method, e.g., solid-phase diffusion or vapor-phase diffusion.

Additionally, although introduction of an impurity for adjustment of a threshold voltage of the component is not performed in this embodiment, introduction of an impurity for adjustment of the threshold voltage may be carried out separately from introduction of the impurity into the first silicon substrate 7. When such introduction is carried out, the threshold voltage can be readily set to a desired value. Adopting this embodiment enables simplifying the manufacturing process.

Further, although the example where the two channel regions are present has been explained in this embodiment, this is not essential, and three or more channel regions may be present, or a single channel region alone may be present. Since a total current flowing through the component can be provided in the form of a sum of currents flowing through the respective channel regions, a high current driving force can be obtained when a plurality of channel regions are present.

Furthermore, although the component having a single-drain structure has been explained in this embodiment, a component having a structure other than the single-drain structure, e.g., an extension structure may be constructed. Moreover, a component having, e.g., a halo structure may be constructed. When such structures are adopted, resistance of the component against the short channel effect can be further improved, which is preferable.

Additionally, although the source/drain regions are formed after processing of the gate electrode or the gate insulating film in this embodiment, this order is not essential, and a reversed order may be adopted. Performing a heat treatment may not be preferable depending on the material of the gate electrode or the gate insulating film. In such a case, effecting introduction of the impurity into the source/drain regions or the heat treatment for activation prior to processing of the gate electrode or the gate insulating film is preferable.

Further, although the gate electrode is formed of tungsten in this embodiment, any other metal may be used to form the gate electrode. Furthermore, the gate electrode may be formed of a semiconductor of single-crystal silicon or amorphous silicon, a compound containing a metal, or a lamination layer of these materials. When the gate electrode is formed of a semiconductor, controlling the threshold voltage is easy, and the threshold voltage can be readily set to a desired value with respect to both the n-type component and the p-type component in the case of forming a complementary type semiconductor device. Moreover, when the gate electrode is formed of a metal or a component containing a metal, resistance of the gate electrode is suppressed, and a high-speed operation of the component can be obtained, which is preferable. Additionally, when the gate electrode is formed of a metal, since an oxidation reaction hardly advances, generation of an interface state is suppressed at an interface between the gate electrode and the insulating film, or at an interface between the insulating film and the channel region. In this manner, the metal gate electrode has an advantage that controllability over the interface is excellent.

Further, although the gate electrode is formed by the method of performing anisotropic etching after depositing a material of the gate electrode in this embodiment, an embedding method, e.g., a damascene process may be used to form the gate electrode. When forming the source/drain regions prior to formation of the gate electrode, adopting the damascene process enables forming the source/drain regions and the gate electrode in a self-alignment manner, which is preferable.

Furthermore, a length of the gate electrode measured in a main direction (a wire direction of the thin wire structure) of the current flowing through the component is equal to both an upper side and a lower side of the gate electrode in this embodiment, but this is not essential. For example, the gate electrode may have a shape such as an alphabetical letter "T" in which a length of the upper side of the gate electrode is longer than a length of the lower side of the same. In this case, an advantage that a gate resistance can be reduced is obtained.

Moreover, although not explicitly stated in this embodiment, a metal layer for interconnect lines may be formed by, e.g., a sputtering method or a deposition method. Additionally, a metal selective growth method or a damascene method may be used. Further, as a material of an interconnect metal, a metal such as aluminum (Al) or copper (Cu) containing silicon may be used. In particular, Cu is preferable since its resistivity is low.

Furthermore, although a silicide process has not been explained in this embodiment, a silicide layer may be formed on the source/drain regions. Moreover, a method of, e.g., depositing or growing a layer containing a metal on the source/drain regions may be adopted. When such a method is adopted, a resistance of the source/drain regions is reduced, which is preferable. Additionally, when forming the gate electrode of polysilicon, the gate electrode may be subjected to silicidation. In this case, a gate resistance is reduced, which is preferable. Further, an elevated source and drain structure may be adopted. The elevated source and drain structure also enables reducing the resistance of the source/drain regions, which is preferable.

Furthermore, although the upper side of the gate electrode has a structure where the electrode is exposed in this embodiment, an insulator such as a silicon oxide, a silicon nitride, or a silicon oxynitride may be provided on the upper side of the gate electrode. In particular, when the gate electrode must be protected during the manufacturing process, e.g., when the gate electrode is formed of a material containing a metal and the silicide layer is formed on the source/drain regions, a protective material, e.g., a silicon oxide, a silicon nitride, or a silicon oxynitride must be provided on the upper side of the gate electrode.

Moreover, although a hafnium oxide film is used as the gate insulating film in this embodiment, an insulating film such as a silicon oxide film or a silicon oxynitride film, or any other insulating film such as a lamination of these films may be used. When nitrogen is present in the insulting film, using polysilicon containing an impurity as the gate electrode enables suppressing the impurity from being diffused in the substrate. Therefore, a fluctuation of the threshold voltage can be suppressed, which is preferable.

Further, when silicon oxide is used, an interface state of the interface with respect to the gate electrode or a quantity of fixed charges in the insulating film is small, and hence a fluctuation in component characteristics can be suppressed. Additionally, for example, when an oxide of a given material is used as the insulating film, a method of, e.g., first forming a film of this material and then oxidizing this film may be adopted. Further, exposure to an oxygen gas in an excited state which does not necessarily involve an increase in temperature may be adopted. When the insulating film is formed by the method of exposure to oxygen gas in the excited state which does not involve an increase in temperature, the impurity in the channel region can be suppressed from changing a concentration distribution due to diffusion, which is preferable.

Furthermore, when silicon oxynitride is used, a silicon oxide film may be first formed, and then this film may be exposed to a gas containing nitrogen in a temperature increased state or an excited state to introduce nitrogen into the insulating film. When the insulating film is formed by using the method of exposure to nitrogen gas in the excited state which does not involve an increase in temperature, the impurity in the channel region can be suppressed from changing a concentration distribution due to diffusion, which is preferable. Alternatively, a silicon nitride film may be first formed, and then this film may be exposed to a gas containing oxygen in a temperature increased state or an excited state, thereby introducing oxygen into the insulating film. When the insulating film is formed by the method of exposure to oxygen gas in the excited state which does not involve an increase in temperature, the impurity in the channel region can be suppressed from changing a concentration distribution due to diffusion, which is preferable.

Moreover, it is possible to use any other insulating film of, e.g., an oxide such as a Hf (hafnium), Zr (zirconium), Ti (titan), Sc (scandium), Y (yttrium), Ta (tantalum), Al (aluminum), La (lanthanum), Ce (cerium), Pr (praseodymium), or lanthanoid based metal element, a silicate material containing various elements such as these elements, a high-dielectric-constant film such as an insulating film obtained by mixing nitrogen in these elements, or a lamination layer of these elements.

The essence of this embodiment lies in that a dielectric constant of the gate insulating film is higher than that of a surface of the insulating region. The effect can be usefully obtained when a dielectric constant of the insulating region formed near the gate insulating film is low and when a dielectric constant of the gate insulating film formed near the insulating region is high. In particular, it is preferable for the dielectric constant of the gate insulating film to be higher than that of the silicon oxide used for the gate insulating film in the conventional technology. For example, since an oxide of an Hf, Zr, Ti, Sc, Y, Ta, Al, La, Ce, Pr, or lanthanoid based metal element, a silicate material containing various elements such as these elements, or a high-dielectric-constant film such as an insulating film obtained by mixing nitrogen in these elements has a higher dielectric constant than the silicon oxide, the silicon nitride, the silicon oxynitride, and other materials, using these materials for the gate insulating film is preferable.

Additionally, the insulating film forming method is not restricted to the CVD method, and any other method such as a thermal oxidation method, an evaporation method, a sputtering method, or an epitaxial growth method may be used.

Further, although the insulating region is formed by using a silicon oxide containing fluorine in this embodiment, the insulating region may be formed of any other material. A relative dielectric constant of the silicon oxide containing fluorine in this embodiment is approximately 3.2 to 3.6, which is lower than that of silicon oxide, which is preferable. Furthermore, for example, a relative dielectric constant of spin-on glass is approximately 2.5 to 3.5, which is lower than the relative dielectric constant of silicon oxide, which is approximately 3.2 to 3.6, which is further preferable.

Moreover, for example, a relative dielectric constant of a fluoridated amorphous carbon is as low as approximately 2.3, which is further preferable. Additionally, for example, a relative dielectric constant of fluorine-added polyimide is as low as approximately 2.7 to 2.8, which is preferable. Further, since the silicon oxide containing fluorine in this embodiment is a material similar to the silicon oxide which is often used in the conventional manufacturing process for a semiconductor component or a semiconductor device, there is an advantage that it can be easily processed.

Although a gate sidewall has not been explained in this embodiment, a sidewall insulating film may be provided to the gate electrode. In particular, when the gate insulating film is formed of a high-dielectric-constant material, providing the gate sidewall which is formed of a high-dielectric-constant material enables alleviating an electric field in the gate insulating film near a lower end corner of the gate electrode, and hence the reliability of the gate insulating film can be improved, which is preferable (see Japanese Patent No. 3658564).

Further, although post-oxidation after forming the gate electrode has not been explained in this embodiment, a post-oxidation process may be carried out if it is possible in view of, e.g., a material of the gate electrode. Furthermore, the present invention is not restricted to post-oxidation, and corners of the gate electrode may be rounded by using, e.g., a chemical treatment or a method of exposure to a reactive gas. When such a process can be performed, an electric field at the lower end corner portions of the gate electrode can be alleviated by this process, and hence reliability of the gate insulating film can be improved, which is preferable.

Moreover, although not explicitly stated in this embodiment, the silicon oxide film may be used for an interlayer insulting film, or a material other than the silicon oxide, e.g., a low-dielectric-constant material may be used for the interlayer insulating film. When a dielectric constant of the interlayer insulating film is lowered, it is possible to obtain an advantage that a high-speed operation of the component can be realized since a parasitic capacitance of the component is reduced.

Additionally, although a contact hole has not been explained, a self-alignment contact can be formed. Since using the self-alignment contact enables reducing an area of the component, an integration degree can be improved, which is preferable.

As explained above, according to the first embodiment, since capacitance coupling formed between the side surface of the channel region and the gate electrode is increased, the controllability of the gate electrode over the potential in the channel region can be improved even though the gate electrode is formed solely on the upper side of the channel region, thus suppressing the short channel effect. Therefore, even when a plurality of channel regions are formed and each interval between the channel regions is formed to be narrower than twofold the physical film thickness of the gate insulating film, the short channel effect can be suppressed, thereby providing a high-performance semiconductor component having a high current driving force in which the short channel effect is suppressed.

Second Embodiment

Figure 21:
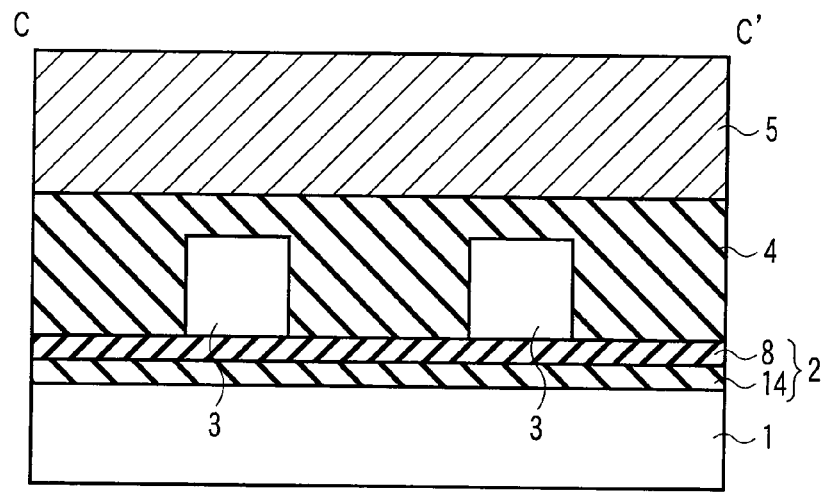
FIG. 21 is a cross-sectional view of the semiconductor component taken along a line C-C' in FIG. 20.
Figure 22:
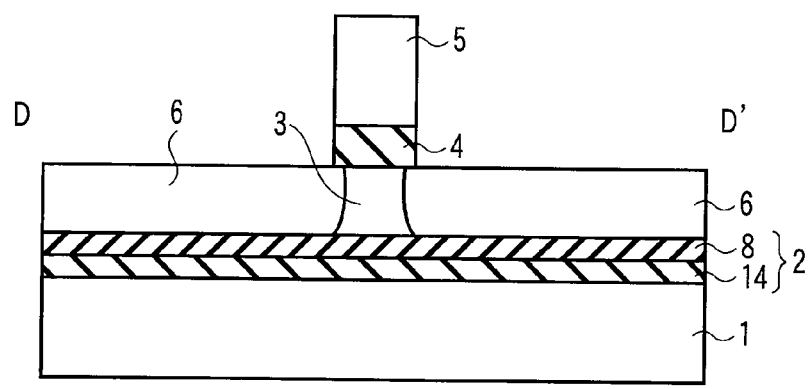
FIG. 22 is a cross-sectional view of the semiconductor component taken along a line D-D' in FIG. 20.

FIG. 20 schematically shows a structure of a semiconductor component according to a second embodiment of the present invention. FIGS. 21 and 22 show cross sections taken along a line C-C' and a line D-D' in FIG. 20, respectively. This semiconductor component is different from the semiconductor component explained in the first embodiment, and is characterized in that an insulating region 2 is a lamination layer of a silicon oxide film 8 containing fluorine and a silicon oxide film 14. Other structures are the same as those in the first embodiment, thereby omitting a repeated explanation.

Figure 23:
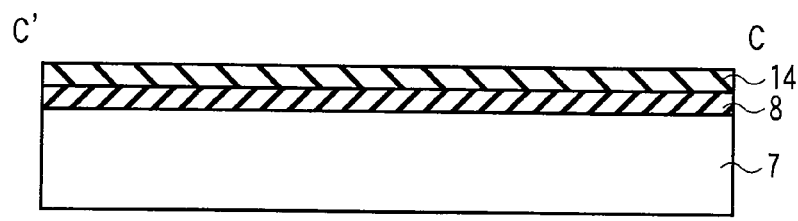

A manufacturing method of the semiconductor component according to this embodiment will now be explained. It is to be noted that FIGS. 23 and 24 show cross sections taken along C-C' in FIG. 20. First, as in FIG. 12 of the first embodiment, the silicon oxide film 8 which has a thickness of, e.g., 200 nm and contains, e.g., 20 atomic % of fluorine is formed on a first silicon substrate 1 based on a method, e.g., a CVD method using an $SH_4$ gas, an $SF_4$ gas, an oxygen gas, or an Ar gas. Subsequently, the silicon oxide film 14 having a thickness of, e.g., 300 nm is formed on the silicon oxide film 8 containing fluorine based on a method, e.g., the CVD method, thereby obtaining a structure depicted in FIG. 23.

Then, as shown in FIG. 24, for example, H ions 9 are implanted with an energy of 65 keV and a dose of $5 \times 10^{16}$/cm$^2$. Subsequently, a second silicon substrate 10 is attached to an upper side of the silicon oxide film 14. Thereafter, the same manufacturing steps as those shown in FIG. 14 and subsequent drawings in the first embodiment are carried out.

In the semiconductor component according to this embodiment, as explained above, the insulating region 2 is formed as the lamination layer of the silicon oxide film 8 containing fluorine and the silicon oxide film 14. Further, since the side of the insulating region 2 close to the gate insulating film 4 is formed of the silicon oxide 8 containing fluorine having a lower dielectric constant than the silicon oxide, the controllability of a gate electrode 5 over a potential in each channel region 3 can be improved due to an increase in capacitance coupling between a side surface of the channel region 3 and the gate electrode 5, as in the first embodiment. As a result, even in a component in which the gate electrode 5 is formed above an upper side alone of each channel region 3, the short channel effect can be suppressed.

Consequently, a current driving force can be improved by providing the plurality of channel regions 3 and setting each interval between the channel regions 3 to be narrower than twofold a physical film thickness of the gate insulating film 4 and the short channel effect can be suppressed, thereby constructing the high-performance semiconductor component having the high current driving force in which the short channel effect is suppressed.

In this embodiment, the insulating region is the lamination layer of the silicon oxide film containing fluorine and the silicon oxide film. Since the silicon oxide film is formed of a material that is used in a conventional semiconductor device, its properties are well known. Therefore, as compared with an example like the first embodiment, where the entire insulating region is formed of a material with a low dielectric constant, e.g., the silicon oxide film containing fluorine, this embodiment has an advantage that a material can be easily processed. Further, when the insulating film 2 is formed of one material as in the first embodiment, there is an advantage that the manufacturing process can be simplified.

Furthermore, in this embodiment, the silicon oxide film 14 is formed on the silicon oxide film 8 containing fluorine formed on the first semiconductor substrate 7, and the second semiconductor substrate 10 is attached to the upper side of the silicon oxide film 14. However, the present invention is not restricted to this method, and the second silicon substrate 10 having the silicon oxide film formed on a surface thereof may be attached to the upper side of the silicon oxide film containing fluorine formed on the first semiconductor substrate 7.

As explained in this embodiment, since using the method of forming both the insulating layers on the first silicon substrate and then attaching the second silicon substrate enables forming the insulating layers in continuous manufacturing steps, an advantage that control over an interface of films constituting the lamination layer is facilitated can be obtained.

Further, when the layer formed of a material with a low dielectric constant in the insulating layers constituting the lamination layer is formed on the first silicon substrate and the silicon oxide layer is formed on the second silicon substrate, a well-known method which is often used in a manufacturing process of a conventional bonded substrate, e.g., thermal oxidation can be used for formation of the silicon oxide layer. Therefore, an advantage that control of the manufacturing steps is facilitated can be obtained.

Moreover, although the region that is in contact with the support semiconductor substrate in the insulating region is formed of a silicon oxide film in this embodiment, any other material may be used. When the region is formed of silicon oxide as in this embodiment, since silicon oxide is a material that is frequently used in a conventional semiconductor device manufacturing process, there can be obtained an advantage that control of the manufacturing steps is facilitated.

Third Embodiment

Figure 26:
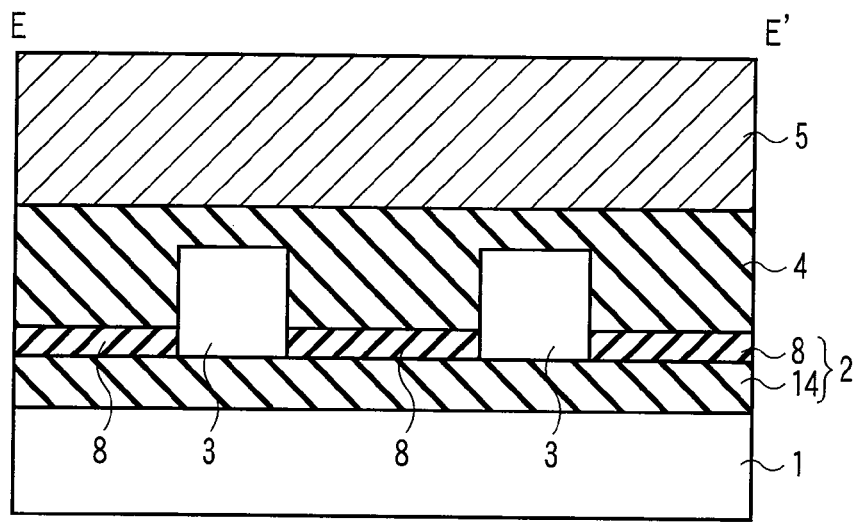
FIG. 26 is a cross-sectional view taken along a line E-E' in FIG. 25.

FIG. 25 schematically shows a structure of a semiconductor component according to a third embodiment of the present invention. FIG. 26 shows a cross section taken along a line E-E' in FIG. 25. A cross section taken along a line F-F' in FIG. 25 is the same as FIG. 3. This semiconductor component is different from the semiconductor component explained in the first embodiment, and is characterized in that an insulating region 2 is a lamination layer of a silicon oxide film 8 containing fluorine and a silicon oxide film 14 in a region where the insulating region 2 is in contact with a gate insulating film 4, and other structures are the same as those in the first embodiment, thereby omitting a detailed explanation.

Figure 27:
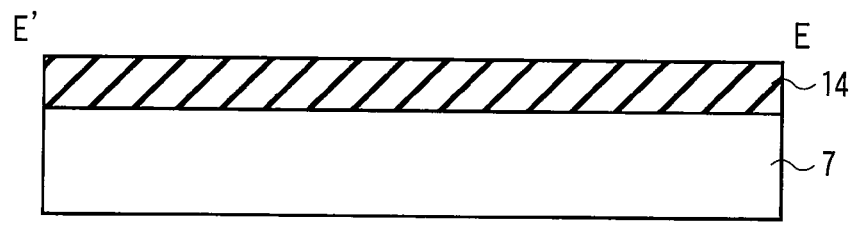
FIGS. 27 to 32 are cross-sectional views for explaining a manufacturing process of the semiconductor component according to a third embodiment in stages.

A manufacturing method of the semiconductor component according to this embodiment will now be explained. It is to be noted that FIGS. 27 to 32 show cross sections taken along E-E' in FIG. 25. First, as shown in FIG. 27, the silicon oxide film 14 having a thickness of, e.g., 500 nm is formed on a first silicon substrate 7 based on, e.g., a CVD method.

Figure 28:
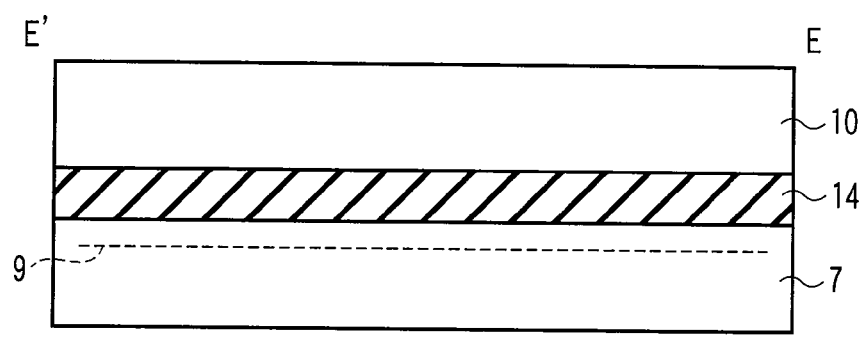

Then, as shown in FIG. 28, for example, hydrogen (H) ions 9 are implanted with, e.g., an energy of 65 keV and a dose of $5 \times 10^{16}/cm^2$. Subsequently, a second silicon substrate 10 is attached to an upper side of the silicon oxide film 14.

Figure 29:
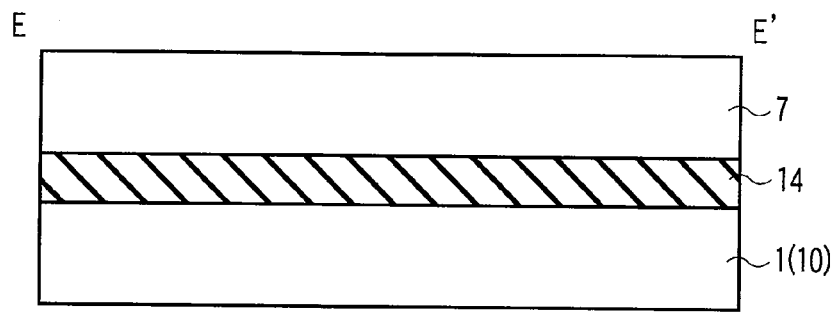

Then, as shown in FIG. 29, a heat treatment at, e.g., 500° C. is performed to partially remove the first silicon substrate 7. Thereafter, a surface is flattened. It is to be noted that this drawing and subsequent drawings show states inverted from those depicted in FIGS. 27 and 28. In this manner, the second silicon substrate 10 functions as a support semiconductor substrate 1 and the silicon oxide 14 serves as a part of the insulating region 2.

Figure 30:
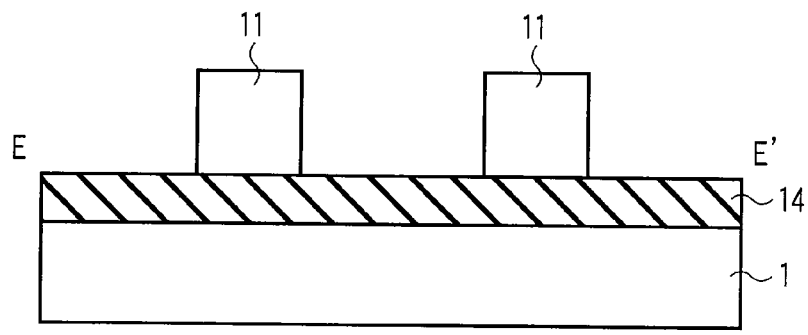

Then, as shown in FIG. 30, for example, B ions are implanted into the first silicon substrate 7 with, e.g., an energy of 5 keV and a dose of $1 \times 10^{12}/cm^2$. Subsequently, the first silicon substrate 7 is subjected to anisotropic etching, e.g., an RIE method to form semiconductor layers 11 each having a width of, e.g., 10 nm.

Figure 31:
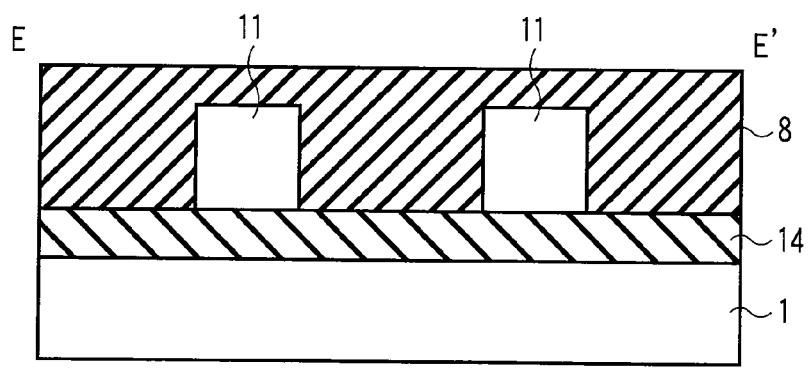

Then, as shown in FIG. 31, the silicon oxide film 8 which has a thickness of, e.g., 20 nm and contains, e.g., 12 atomic % of fluorine is formed on the silicon oxide film 14 containing the semiconductor layers 11 based on, e.g., the CVD method using an $SH_4$ gas, an $SF_4$ gas, an oxygen gas, or an Ar gas. Moreover, a surface of the silicon oxide film 8 containing fluorine is flattened by using, e.g., chemical mechanical polishing (which will be referred to as CMP hereinafter).

Figure 32:
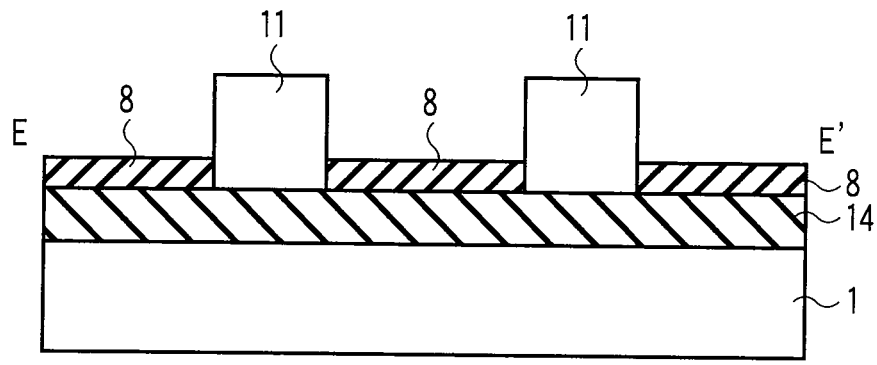

Then, as shown in FIG. 32, the silicon oxide film 8 containing fluorine is subjected to anisotropic etching, e.g., the RIE method to partially leave the silicon oxide film 8 on the silicon oxide film 14 and partially remove the same. Thereafter, the same manufacturing steps as those in FIG. 16 and subsequent drawings in the first embodiment are carried out.

In the semiconductor component according to this embodiment, as explained above, the insulating region 2 is formed as the lamination layer of the silicon oxide film 8 containing fluorine and the silicon oxide film 14 in the region where the insulating region 2 is in contact with the insulating film 4. Additionally, the side of the insulating region 2 close to the gate insulating film 4 is formed of the silicon oxide containing fluorine with a lower dielectric constant than the silicon oxide. Therefore, as in the first embodiment, the controllability of a gate electrode over a potential in each channel region is improved due to an increase in capacitance coupling between a side surface of each channel region and the gate electrode. As a result, even in a component where the gate electrode is formed above an upper side alone of each channel region, the short channel effect can be suppressed.

As a result, a current driving force can be improved by providing the plurality of channel regions and setting each interval between the channel regions to be narrower than twofold a physical film thickness of the gate insulating film, and the short channel effect can be suppressed, thereby constructing a high-performance semiconductor component having a high current driving force in which the short channel effect is suppressed.

In this embodiment, the insulating region 2 is the lamination layer of the silicon oxide film 8 containing fluorine and the silicon oxide film 14 only in the region where the insulating region 2 is in contact with the gate insulating film 4. Therefore, the component can be formed by using a commercially available SOI (silicon-on-insulator) substrate. Further, when the insulating region 2 is uniformly formed over the entire surface of the semiconductor substrate 1 as in the first and second embodiments, there can be obtained an advantage that the manufacturing process can be simplified.

Further, in this embodiment, the silicon oxide film 8 containing fluorine is formed on the entire surface of the semiconductor substrate including the semiconductor layers 11 after forming the semiconductor layers 11, and the silicon oxide film 8 containing fluorine is removed except for the region where the insulating region 2 is in contact with the gate insulating film 4. However, the present invention is not restricted to this method, and fluorine may be introduced into the insulating region 14 in the region where the insulating region 14 is in contact with the gate insulating film 4 after forming the semiconductor layers 11 by using, e.g., ion implantation, vapor-phase diffusion, or solid-phase diffusion. In particular, using, e.g., ion implantation or vapor-phase diffusion enables obtaining an advantage that the manufacturing steps can be simplified since a step of removing the silicon oxide film 8 containing fluorine is not required or that damage to an underlying layer involved by removal can be avoided.

Further, as explained in this embodiment, when the silicon oxide containing fluorine is deposited, there can be obtained an advantage that fluorine with a high concentration can be introduced into the insulating region 8.

Fourth Embodiment

Figure 33:
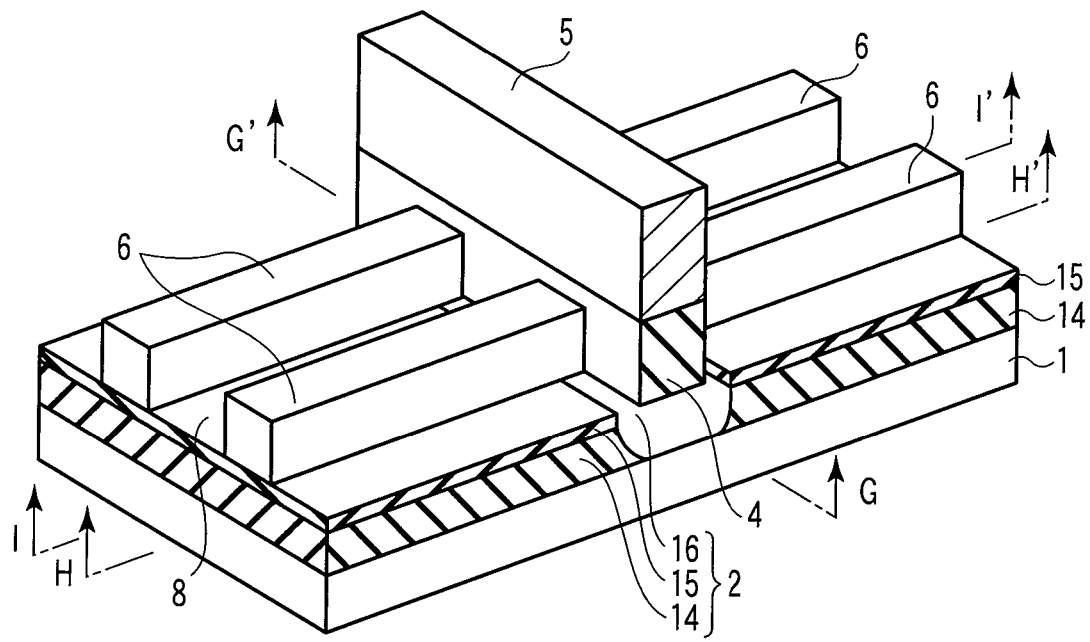
FIG. 33 is a perspective view for explaining a structure of a semiconductor component according to a fourth embodiment.

FIG. 33 schematically shows a structure of a semiconductor component according to a fourth embodiment of the present invention.

Figure 34:
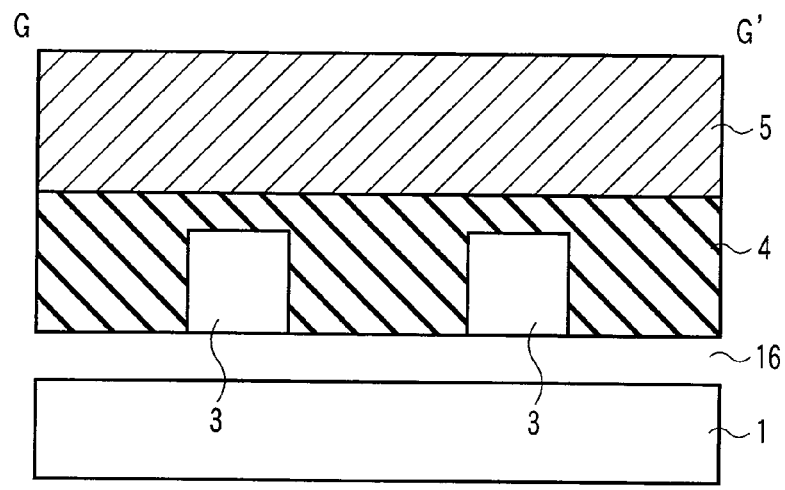
FIG. 34 is a cross-sectional view taken along a line G-G' in FIG. 33.
Figure 35:
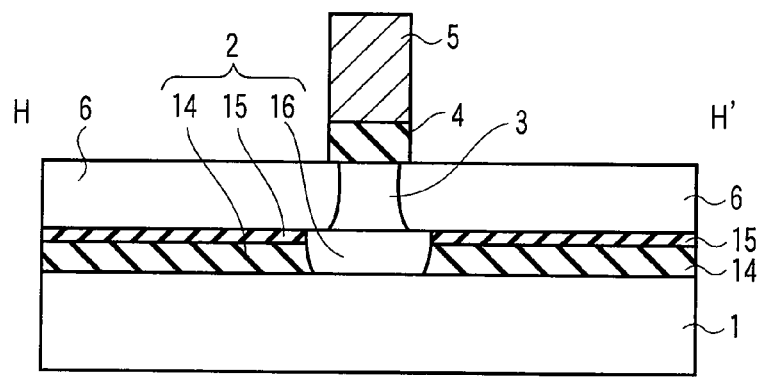
FIG. 35 is a cross-sectional view taken along a line H-H' in FIG. 33.
Figure 36:
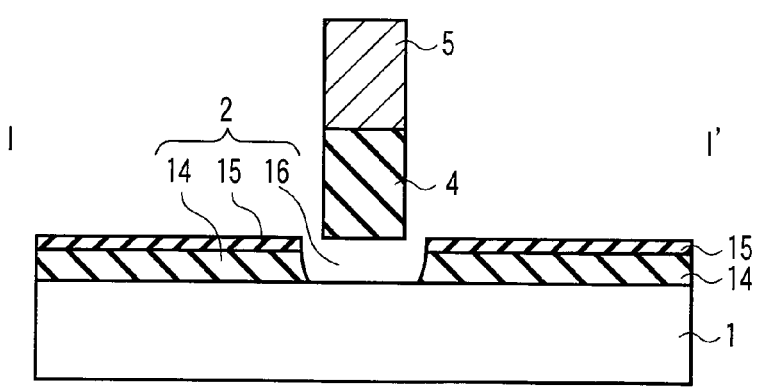
FIG. 36 is a cross-sectional view taken along a line I-I' in FIG. 33.

FIGS. 34, 35, and 36 show cross sections taken along lines G-G', H-H', and I-I' in FIG. 33, respectively. This semiconductor component is characterized in that an insulating region 2 has a void 16 in a region where the insulating region 2 is in contact with a gate insulating film 4, and other structures are the same as those in the first embodiment, thereby omitting a repeated explanation.

A manufacturing method of the semiconductor component according to this embodiment will now be explained. It is to be noted that FIGS. 37 to 40 show cross sections taken along G-G' in FIG. 33. First, as shown in FIG. 37, a first silicon nitride film 15 having a thickness of, e.g., 10 nm is formed on a first silicon substrate 7 based on, e.g., a CVD method. Then, a silicon oxide film 14 having a thickness of, e.g., 500 nm is formed on the first silicon nitride film 15 based on, e.g., the CVD method.

Subsequently, as shown in FIG. 38, for example, hydrogen (H) ions 9 are implanted with, e.g., an energy of 65 keV and a dose of $5 \times 10^{16}/cm^2$. Then, a second silicon substrate 10 is attached to an upper side of the silicon oxide film 14.

Subsequently, as shown in FIG. 39, a heat treatment at, e.g., 500° C. is carried out to remove a part of the first silicon substrate 7. Thereafter, a surface is flattened. It is to be noted that this drawing and subsequent drawings show structures inverted from those depicted in FIGS. 37 and 38. In this manner, the second silicon substrate 10 serves as a support semiconductor substrate 1, and the first silicon nitride film 15 and the silicon oxide film 14 function as the insulating region 2.

Then, as shown in FIG. 40, boron (B) ions are implanted into the first silicon substrate with, e.g., an energy of 5 keV and a dose of $1 \times 10^{12}/cm^2$. Subsequently, the first silicon substrate 7 is subjected to anisotropic etching, e.g., an RIE method to form semiconductor layers 11 each having a width of 10 nm.

FIGS. 41 to 44 show cross sections taken along H-H' in FIG. 33. As shown in FIG. 41, for example, a hafnium oxide film 12 having a thickness of, e.g., 5 nm is formed on an entire surface of the first silicon nitride film 15 including the semiconductor layers 11 by using, e.g., the CVD method.

Then, as shown in FIG. 42, for example, a W film 13 having a thickness of 10 nm is formed on an entire surface of the hafnium oxide film 12 by using, e.g., the CVD method.

Subsequently, as shown in FIG. 43, the W film 13 and the hafnium oxide film 12 are subjected to anisotropic etching, e.g., of an RIE method to form a gate insulating film 4 and a gate electrode 5.

Then, as shown in FIG. 44, for example, As ions are implanted with, e.g., an energy of 10 keV and a dose of $1 \times 10^{15}/cm^2$ to form source/drain regions 6 and a channel region 3 provided therebetween.

FIGS. 45 to 48 show cross sections taken along I-I' in FIG. 33. As shown in FIG. 45, for example, a second silicon nitride film 19 having a thickness of, e.g., 10 nm is formed on the gate electrode 5, the gate insulating film 4, and the first silicon nitride film 15 by using, e.g., the CVD method.

Then, as shown in FIG. 46, the second silicon nitride film 19 is subjected to anisotropic etching, e.g., of the RIE method to form a sidewall insulating film 20. At this time, the first silicon nitride film 15 and the second silicon nitride film 19 may be at least partially covered with, e.g., a photoresist. In this embodiment, the first silicon nitride film 15 and the second silicon nitride film 19 are left except for near the gate electrode 5.

Figure 47:
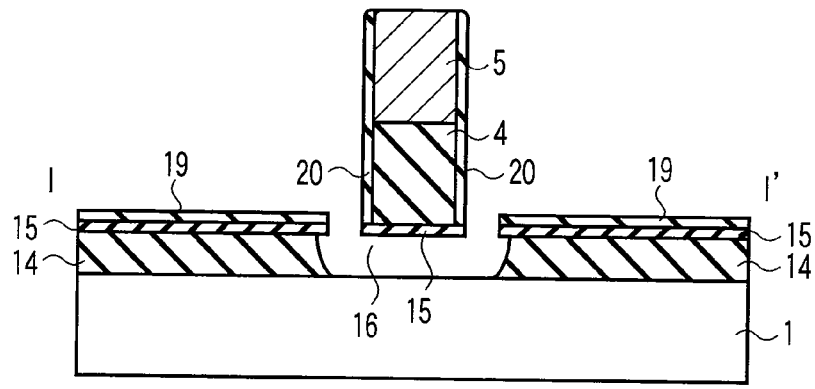

Subsequently, as shown in FIG. 47, the silicon oxide film 14 is partially removed by using, e.g., a hydrofluoric acid treatment to form a void 16.

Figure 48:
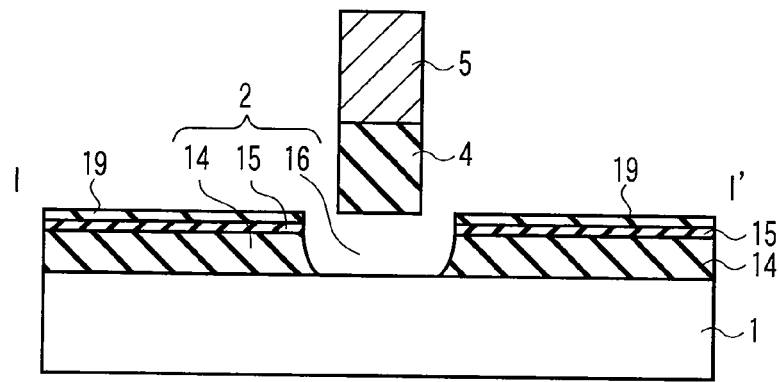

Then, as shown in FIG. 48, the first silicon nitride film 15 and the sidewall insulating film 20 near a lower portion of the gate insulating film 4 are removed by using, e.g., a phosphoric acid treatment. At this time, the first silicon nitride film 15 and the second silicon nitride film 19 may be at least partially covered with, e.g., a photoresist.

In this embodiment, the first silicon nitride film 15 and the second silicon nitride film 19 are left except for near the gate electrode. Furthermore, although the sidewall insulating film 20 is removed in this embodiment, the sidewall insulating film 20 may be left. Moreover, in FIGS. 33 to 36, the second silicon nitride film 19 and the sidewall 20 are omitted. Thereafter, an interlayer insulating film forming step, a wiring step, and other steps are carried out in the same manner as in the conventional technology, thereby forming the semiconductor component according to this embodiment shown in FIG. 33.

In the semiconductor component according to this embodiment, the void 16 is formed in the region where the insulating region 2 is in contact with the gate insulating film as explained above. Since a dielectric constant of the void can be regarded as being substantially equal to 1, the controllability of the gate electrode 5 over a potential in each channel region 3 can be improved due to an increase in capacitance coupling between the side surface of each channel region 3 and the gate electrode 5, and its effect is considerable, as in the first embodiment. As a result, even in the component in which the gate electrode 5 is formed on each channel region 3 alone, the short channel effect can be suppressed, and its effect is very high.

Consequently, a current driving force can be improved by providing the plurality of channel regions 3 and setting each interval between the channel regions 3 to be narrower than twofold a physical film thickness of the gate insulating film 4 and the short channel effect can be suppressed, thereby constructing a high-performance semiconductor component having a high current driving force in which the short channel effect is very effectively suppressed. When a semiconductor component having the structure according to this embodiment is constructed, an expected effect can be very efficiently realized. Further, when a component according to each foregoing embodiment is constructed, since the step of forming the void is not provided, there can be obtained an advantage that the manufacturing steps can be simplified.

It is to be noted that the silicon oxide film 14 in the insulating region is not left below the void 16 in this embodiment, but it may be left. As explained in this embodiment, when the silicon oxide film 14 is not left below the void 16, there can be obtained an advantage that control of the manufacturing steps can be facilitated.

Fifth Embodiment

Figure 49:
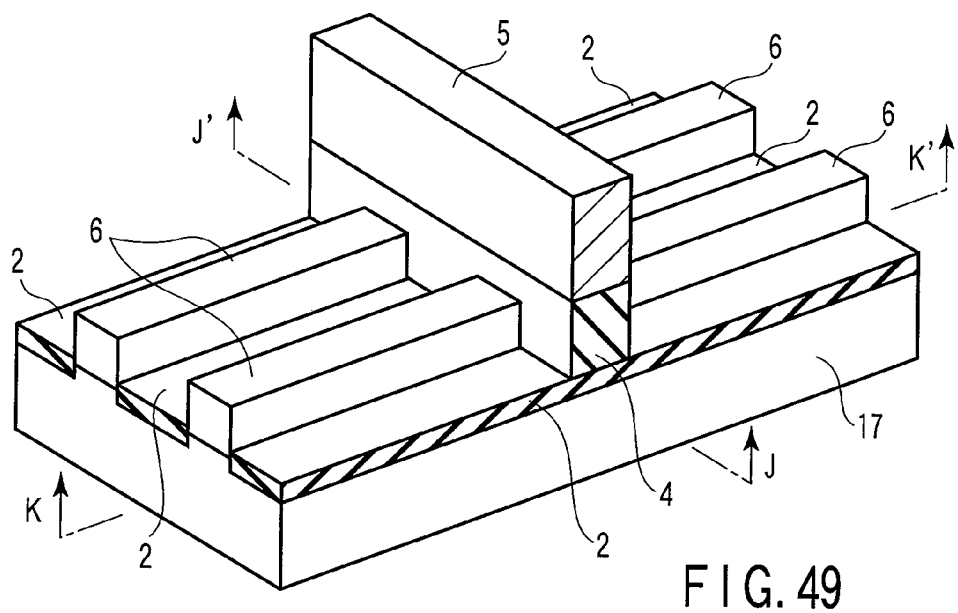
FIG. 49 is a perspective view for explaining a structure of a semiconductor component according to fifth and ninth embodiments.
Figure 50:
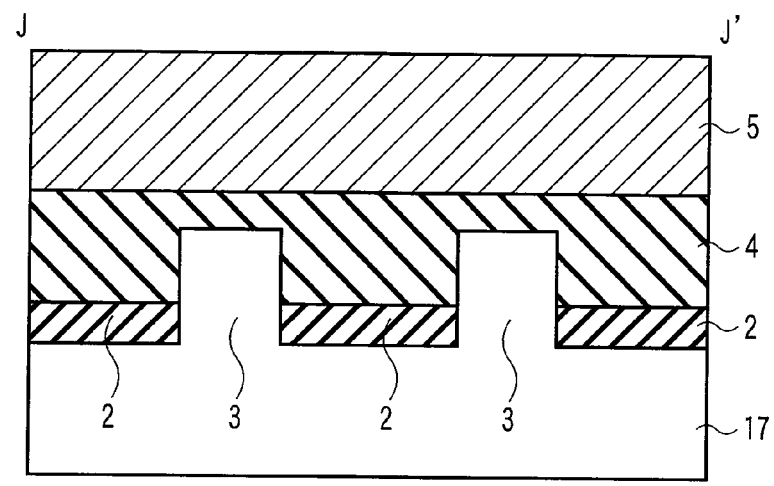
FIG. 50 is a cross-sectional view taken along a line J-J' in FIG. 49.
Figure 51:
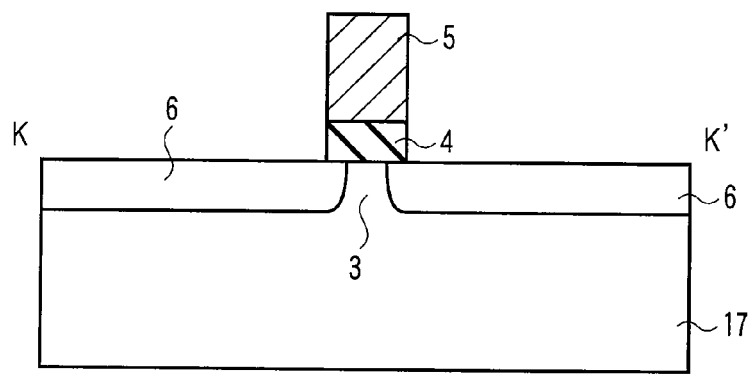
FIG. 51 is a cross-sectional view taken along a line K-K' in FIG. 49.

FIG. 49 schematically shows a structure of a semiconductor component according to a fifth embodiment of the present invention. FIGS. 50 and 51 show cross sections taken along lines J-J' and K-K' in FIG. 49, respectively. This semiconductor component is different from the semiconductor component according to the first embodiment, and is characterized in that source/drain regions 6 or semiconductor layers 11 in which channel regions 3 are formed are formed on a silicon substrate 17, and an insulating region 2 is not formed below the semiconductor layers 11. Other structures are the same as those in the first embodiment, thereby omitting a detailed explanation.

A manufacturing method of the semiconductor component according to this embodiment will now be explained. It is to be noted that FIGS. 52 to 54 show cross sections taken along J-J' in FIG. 49.

Figure 52:
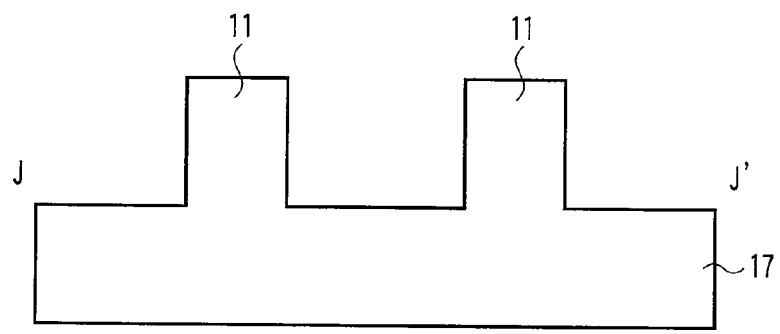

First, as shown in FIG. 52, the silicon substrate 17 is subjected to an anisotropic etching, e.g., of the RIE method to form the semiconductor layers 11.

Then, as shown in FIG. 53, a silicon oxide film 8 having a thickness of, e.g., 30 nm and containing, e.g., 12 atomic % of fluorine is formed on the silicon substrate 17 and the semiconductor layers 11 based on, e.g., a CVD method using, e.g., an $SH_4$ gas, an $SF_4$ gas, an oxygen gas, or an Ar gas. Subsequently, a surface of the silicon oxide film 8 containing fluorine is flattened by using, e.g., a CMP method.

Then, as shown in FIG. 54, the silicon oxide film 8 containing fluorine is subjected to anisotropic etching, e.g., an RIE method to be partially removed, thereby forming an insulating region 2 to expose the semiconductor layers 11. Subsequently, B ions are implanted into each semiconductor layer 11 with, e.g., an energy of 5 keV and a dose of $1\times10^{12}/cm^2$.

FIGS. 55 to 58 show cross sections taken along K-K' in FIG. 49, respectively. As shown in FIG. 55, for example, a hafnium oxide film 12 having a thickness of, e.g., 5 nm is formed on the semiconductor layers 11 and the insulating region 2 by using, e.g., the CVD method.

Subsequently, as shown in FIG. 56, for example, a W film 13 having a thickness of, e.g., 10 nm is formed on an entire surface of the hafnium oxide film 12 by, e.g., the CVD method.

Then, as shown in FIG. 57, the W film 13 and the hafnium oxide film 12 are subjected to anisotropic etching, e.g., the RIE method to form a gate insulating film 4 and a gate electrode 5.

Subsequently, as shown in FIG. 58, for example, As ions are implanted with, e.g., an energy of 10 keV and a dose of $1\times10^{15}/cm^2$ to form source/drain regions 6 and a channel region 3 provided between. Thereafter, an interlayer insulating film forming step, a wiring step, and other steps are carried out in the same manner as in the conventional technology, thereby forming the semiconductor component according to this embodiment shown in FIG. 49.

In the semiconductor component according to this embodiment, each semiconductor layer 11 in which the source/drain regions 6 and the channel region 3 are formed is formed on the silicon substrate 17, and the insulating region 2 is not formed below each semiconductor layer 11. Therefore, there can be obtained an advantage that an electrode can be formed in the channel region 3 and a substrate bias can be thereby applied from the outside.

Further, when the insulating region 2 is formed below the channel region 3 as in the foregoing embodiment, a current flowing through the channel region 3 flows only near the gate electrode 5 or the gate insulating film 4, another advantage that the short channel effect can be effectively suppressed can be obtained.

Sixth Embodiment

Figure 59:
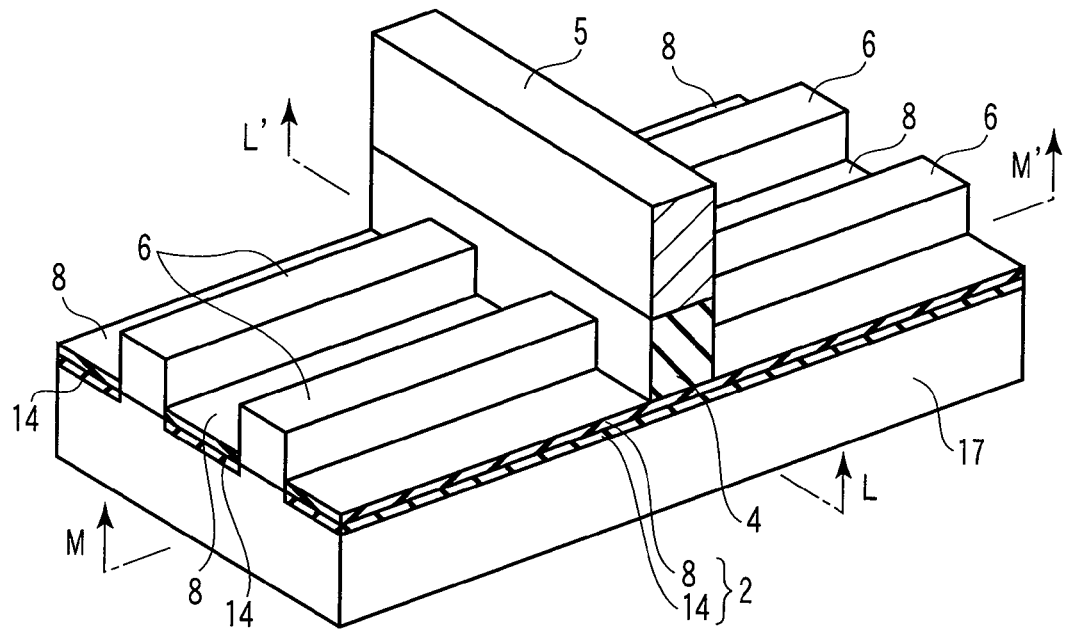
FIG. 59 is a perspective view for explaining a structure of a semiconductor component according to a sixth embodiment.
Figure 60:
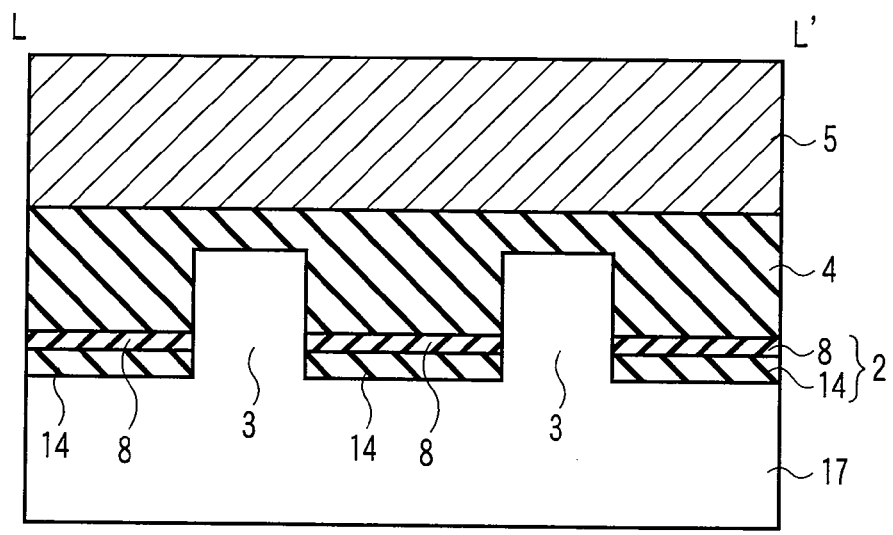
FIG. 60 is a cross-sectional view taken along line L-L' in FIG. 59.

FIG. 59 schematically shows a structure of a semiconductor component according to a sixth embodiment of the present invention. FIG. 60 shows a cross section taken along a line L-L' in FIG. 59. The cross section taken along M-M' in FIG. 59 is the same as that in FIG. 51. This semiconductor component is different from the semiconductor component according to the fifth embodiment, and is characterized in that an insulating region 2 is a lamination layer of a silicon oxide film 8 containing fluorine and a silicon oxide film 14. Other structures are the same as those in the fifth embodiment, thereby omitting a detailed explanation.

A manufacturing method of the semiconductor component according to this embodiment will now be explained. It is to be noted that FIGS. 61 to 64 show cross sections taken along a line L-L' in FIG. 59. After the manufacturing step depicted in FIG. 52 according to the fifth embodiment, the silicon oxide film 14 having a thickness of, e.g., 30 nm is formed on the silicon substrate 17 and the semiconductor layers 11 by, e.g., a CVD method. Subsequently, a surface of the silicon oxide film 14 is flattened by, e.g., a CMP method.

Then, as shown in FIG. 62, the silicon oxide film 14 is subjected to anisotropic etching, e.g., an RIE method to be partially removed, thereby processing the silicon oxide film 14 to expose the semiconductor layers 11.

Subsequently, as shown in FIG. 63, for example, the silicon oxide film 8 which has a thickness of 30 nm and contains 12 atomic % of fluorine is formed on the silicon substrate 17, the semiconductor layers 11, and the silicon oxide film 14 by, e.g., a CVD method using an $SH_4$ gas, an $SF_4$ gas, an oxygen gas, or an Ar gas. Then, a surface of the silicon oxide film 8 containing fluorine is flattened by using, e.g., the CMP method.

Then, as shown in FIG. 64, the silicon oxide film 8 containing fluorine is subjected to anisotropic etching, e.g., an RIE method, to be partially removed, thereby forming the insulating region 2 to expose the semiconductor layers 11. Subsequently, B ions are implanted into the semiconductor layers 11 with, e.g., an energy of 5 keV and a dose of $1\times10^{12}/cm^2$. Thereafter, the same manufacturing steps as those shown in FIG. 55 and subsequent drawings according to the fifth embodiment are carried out.

In the semiconductor component according to this embodiment, as explained above, the insulating region 2 is formed as the lamination layer of the silicon oxide film 8 containing fluorine and the silicon oxide film 14. A side of the insulating region 2 close to the gate insulating film 4 is formed of the silicon oxide containing fluorine which has a lower dielectric constant than the silicon oxide, and hence capacitance coupling between the side surface of the channel region 3 and the gate electrode 5 is increased as in the foregoing embodiments. As a result, the controllability of the gate electrode 5 over a potential in each channel region 3 is improved. Consequently, even in a component in which the gate electrode 5 is formed on each channel region 3 alone, the short channel effect can be suppressed. As a result, a current driving force can be improved by providing the plurality of channel regions and setting each interval between the channel regions to be narrower than twofold a physical film thickness of the gate insulating film, and the short channel effect can be suppressed, thereby constructing a high-performance semiconductor component having a high current driving force in which the short channel effect is suppressed.

In this embodiment, the region where the insulating region 2 is in contact with the gate insulating film 4 alone serves as the lamination layer of the silicon oxide film containing fluorine and the silicon oxide film. Since the silicon oxide is used in the conventional manufacturing method, its properties are well known. Therefore, it has an advantage that control of the manufacturing steps is facilitated. Further, when the insulating region 2 is formed of a single material as in the fifth embodiment, there can be obtained an advantage that the manufacturing steps can be simplified.

Further, in this embodiment, the silicon oxide film containing fluorine is formed on the entire surface of the semiconductor substrate including the semiconductor layers, and the silicon oxide film containing fluorine is removed from the upper side of the semiconductor layers, but the present invention is not restricted thereto. For example, fluorine may be introduced into the insulating region by using, e.g., ion implantation, vapor-phase diffusion, or solid-phase diffusion. In particular, when, e.g., ion implantation or vapor-phase diffusion is used, the step of removing the silicon oxide film containing fluorine is not required, thus simplifying the manufacturing steps. In addition, damage to the substrate involved by removal can be avoided.

Further, as explained in this embodiment, depositing the silicon oxide containing fluorine enables obtaining an advantage that fluorine with a high concentration can be introduced into the insulating region.

Seventh Embodiment

Figure 66:
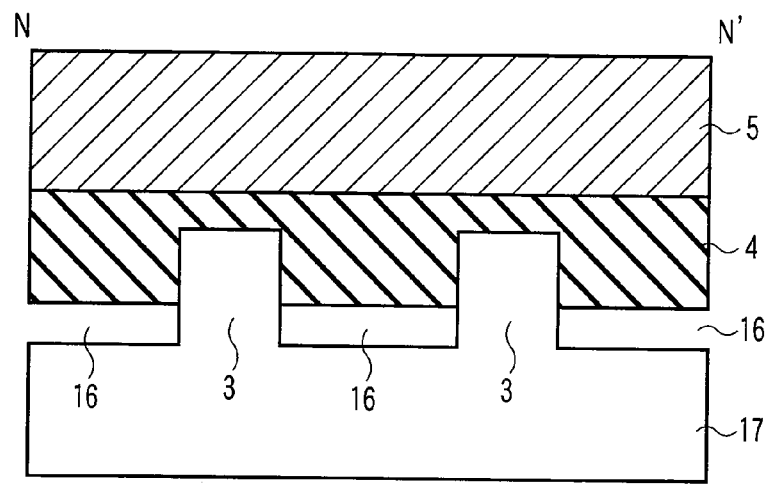
FIG. 66 is a cross-sectional view taken along a line N-N' in FIG. 65.
Figure 67:
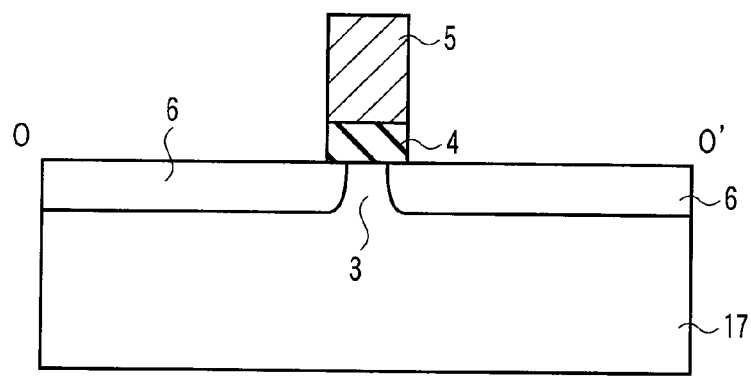
FIG. 67 is a cross-sectional view taken along a line O-O' in FIG. 65.
Figure 68:
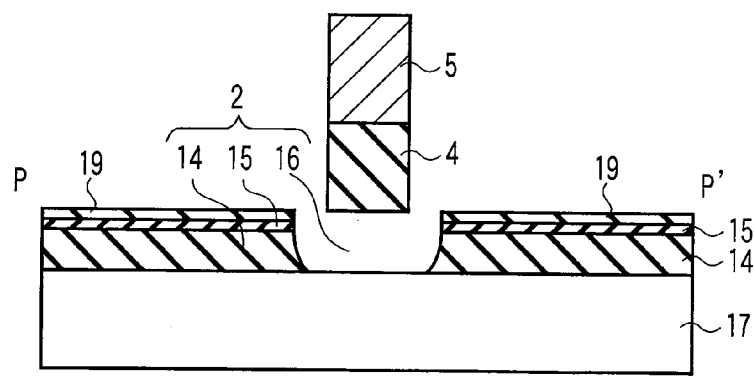
FIG. 68 is a cross-sectional view taken along a line P-P' in FIG. 65.

FIG. 65 schematically shows a structure of a semiconductor component according to a seventh embodiment of the present invention. FIGS. 66, 67, and 68 show cross sections taken along N-N', O-O', and P-P' in FIG. 65, respectively. This semiconductor component is characterized in that an insulating region 2 formed to expose each semiconductor layer 11 is a void in a region where the insulating region 2 is in contact with a gate insulating film 4. Other structures are the same as those in the fifth embodiment, thereby omitting a repeated explanation.

A manufacturing method of a semiconductor component according to this embodiment will now be explained hereinafter. It is to be noted that FIGS. 69 and 70 show cross sections taken along N-N' in FIG. 65. After the step shown in FIG. 62 according to the sixth embodiment, a first silicon nitride film 15 having a thickness of, e.g., 30 nm is formed on the silicon oxide film 14 and the semiconductor layers 11 based on, e.g., a CVD method as shown in FIG. 69. Subsequently, a surface of the first silicon nitride film 15 is flattened based on, e.g., a CMP method.

Then, as shown in FIG. 70, the first silicon nitride film 15 is subjected to anisotropic etching, e.g., an RIE method to be partially removed, thereby processing the first silicon nitride film 15 to expose the semiconductor layers 11.

FIGS. 71 to 74 show cross sections taken along O-O' in FIG. 65. As shown in FIG. 71, a hafnium oxide film 12 having a thickness of, e.g., 5 nm is formed on the semiconductor layers 11 and the first silicon nitride film 15 based on, e.g., the CVD method.

Subsequently, as shown in FIG. 72, for example, a W film 13 having a thickness of, e.g., 10 nm is formed on an entire surface of the hafnium oxide film 12 based on, e.g., the CVD method.

Then, as shown in FIG. 73, the W film 13 and the hafnium oxide film 12 are subjected to anisotropic etching, e.g., of an RIE method, to form a gate insulating film 4 and a gate electrode 5.

Subsequently, as shown in FIG. 74, for example, As ions are implanted with, e.g., an energy of 10 keV and a dose of $1 \times 10^{15}/cm^2$ to form source/drain regions 6 and a channel region 3 provided therebetween.

FIGS. 75 to 78 show cross sections taken along P-P' in FIG. 65. As shown in FIG. 75, for example, a second silicon nitride film 19 having a thickness of, e.g., 10 nm is formed on the gate electrode 5, the gate insulating film 4, and the first silicon nitride film 15 based on, e.g., the CVD method.

Then, as shown in FIG. 76, the second silicon nitride film 19 is subjected to anisotropic etching, e.g., of the RIE method to form a sidewall insulating film 20. At this time, the first silicon nitride film 15 and the second silicon nitride film 19 may be at least partially covered with, e.g., photoresist. In this embodiment, the first silicon nitride film 15 and the second silicon nitride film 19 are left except for near the gate electrode.

Subsequently, as shown in FIG. 77, the silicon oxide film 14 is partially removed by using, e.g., a hydrofluoric acid treatment, thereby forming a void 16.

Figure 78:
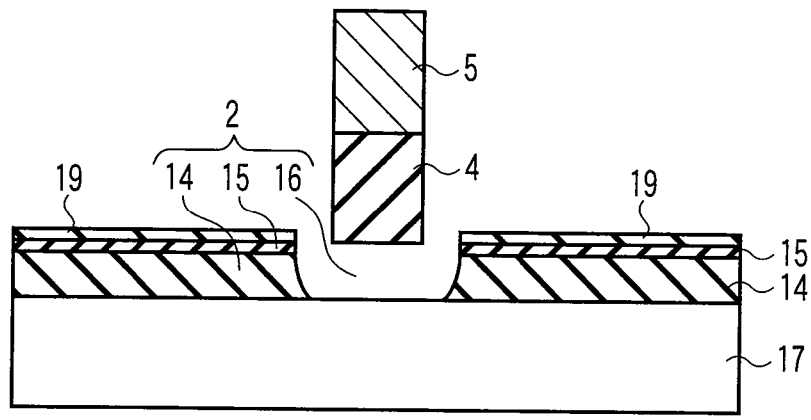

Then, as shown in FIG. 78, the first silicon nitride film 15 and the sidewall insulating film 20 near a lower portion of the gate insulating film 4 are removed by using, e.g., a thermal phosphoric acid treatment. At this time, the first silicon nitride film 15 and the second silicon nitride film 19 may be at least partially covered with, e.g., a photoresist. In this embodiment, the first silicon nitride film 15 and the second silicon nitride film 19 are left except for near the gate electrode. Further, likewise, the sidewall insulating film 20 may be left. In this embodiment, the sidewall insulating film is removed.

It is to be noted that, in FIGS. 65 to 68, the first silicon nitride film 15, the second silicon nitride film 19, and the sidewall insulating film 20 in the insulating region 2 formed to expose the semiconductor layers 11 are omitted. Thereafter, an interlayer insulating film forming step, a wiring step, and other steps are carried out in the same manner as in the conventional technology, thereby forming the semiconductor component according to the present invention.

In this embodiment, since the void 16 is provided in the region where the insulating region 2 is in contact with the gate insulating film 4 as in the forth embodiment, when capacitance coupling between the side surface of the channel region 3 and the gate electrode 4 is increased, the controllability of the gate electrode 5 over a potential in the channel region 3 can be improved.

Eighth Embodiment

A semiconductor component according to an eighth embodiment is characterized in that a gate insulating film 4 is a different ferroelectric gate insulating film than that in the semiconductor components according to the foregoing embodiments. When such a structure is adopted, a threshold voltage of the semiconductor component varies depending on a direction of spontaneous polarization of the ferroelectric gate insulating film, thereby providing the semiconductor component with a storage function. The term threshold voltage refers to a gate voltage with which a conducting state and a non-conducting state of the semiconductor component are switched. A specific operation will be explained later. Since the structure according to this embodiment is the same as in the first embodiment, except for a material of the gate insulating film, FIGS. 1 to 3 and the explanation of the first embodiment are used, and an explanation and drawings of the structure according to this embodiment will be omitted.

A manufacturing method of the semiconductor component according to this embodiment will now be explained with reference to FIGS. 12 to 19 of the first embodiment. After the step shown in FIG. 14 of the first embodiment, As ions are implanted into the first silicon substrate 7 with, e.g., an energy of 5 keV and a dose of $1 \times 10^{12}/cm^2$ as in FIG. 15. Subsequently, the first silicon substrate 7 is subjected to anisotropic etching, e.g., of an RIE method to form semiconductor layers 11 each having a width of, e.g., 10 nm.

Then, as shown in FIG. 16, for example, a PZT ($PbZr_xTi_{1-x}O_3$) film 12 having a thickness of 5 nm is formed on an entire surface of an insulating region 2 including the semiconductor layers 11 based on, e.g., a CVD method.

Subsequently, as shown in FIG. 17, for example, a Pt (platinum) film 13 having a thickness of, e.g., 10 nm is formed on an entire surface of the PZT film 12 based on, e.g., the CVD method.

Then, as shown in FIG. 18, the Pt film 13 and the PZT film 12 are subjected to anisotropic etching, e.g., the RIE method to form a ferroelectric gate insulating film 4 and the a gate electrode 5.

Subsequently, as shown in FIG. 19, for example, As ions are implanted with, e.g., an energy of 10 keV and a dose of $1 \times 10^{15}/cm^2$ to form source/drain regions 6 and a channel region 3 provided therebetween. Thereafter, an interlayer insulating film forming step, a wiring step, and other steps are carried out in the same manner as in the conventional technology, thereby forming the semiconductor component according to the present invention shown in FIG. 1.

In this embodiment, although PZT is used as a material forming the ferroelectric gate insulating film, any other ferroelectric material, e.g., PLZT ($Pb_xLa_{1-x}Zr_yTi_{1-y}O_3$) or SBT ($SrBi_2Ti_2O_9$) may be used besides PZT.

Furthermore, although Pt is used as a material forming the gate electrode in this embodiment, the gate electrode may be formed by utilizing a metal, e.g., Au, Ir, or Ru besides Pt. Moreover, the gate electrode may be formed of a semiconductor such as single-crystal silicon or amorphous silicon, a metal excluding the above four materials, a compound containing a metal, or a lamination layer of these materials. When the gate electrode is formed of a metal or a compound containing a metal, a resistance of the gate electrode is reduced, and hence a high-speed operation of the component can be obtained. Additionally, when the gate electrode is formed of a metal, e.g., Pt, Au, Ir, or Ru, since a reaction hardly advances on an interface with respect to the ferroelectric gate insulating film, there can be obtained an advantage that the controllability of the interface between the gate electrode and the ferroelectric gate insulating film is excellent.

Since the ferroelectric insulating film is used as the gate insulating film in this embodiment, the threshold voltage of the semiconductor component varies depending on a direction of spontaneous polarization of the ferroelectric gate insulating film, thereby providing the semiconductor component with a storage function. This application will be explained in the following embodiment.

Ninth Embodiment

A semiconductor component according to a ninth embodiment is also characterized in that a gate insulating film 4 is a ferroelectric gate insulating film, and has the same advantage as that in the eighth embodiment. A specific operation will be explained later. Since the structure in this embodiment is the same as that in the fifth embodiment, FIGS. 49 to 51 and the explanation of the fifth embodiment are used, thereby omitting an explanation and drawings of the structure according to this embodiment.

A manufacturing method of a semiconductor component according to this embodiment will be explained with reference to FIGS. 52 to 58 of the fifth embodiment. After the step shown in FIG. 54 of the fifth embodiment, for example, a PZT film 12 having a thickness of, e.g., 5 nm is formed on an entire surface of an insulating region 2 including semiconductor layers 11 based on, e.g., a CVD method as shown in FIG. 55.

Then, as shown in FIG. 56, for example, a Pt film 13 having a thickness of, e.g., 10 nm is formed on an entire surface PZT film 12 based on, e.g., a CVD method.

Subsequently, as shown in FIG. 57, the Pt film 13 and the PZT film 12 are subjected to anisotropic etching, e.g., of an RIE method to form a ferroelectric gate insulating film 4 and a gate electrode 5. Thereafter, the same manufacturing steps as those shown in FIG. 58 and subsequent drawings are carried out, thereby forming a semiconductor component having the ferroelectric gate insulating film 4 in the conformation shown in FIG. 49.

Since the ferroelectric insulating film is likewise used as the gate insulating film in this embodiment, a threshold voltage of the semiconductor component varies depending on a direction of spontaneous polarization of the ferroelectric gate insulating film, thereby providing the semiconductor component with a storage function. This application will be explained in the following embodiment.

10th Embodiment

Figure 79:
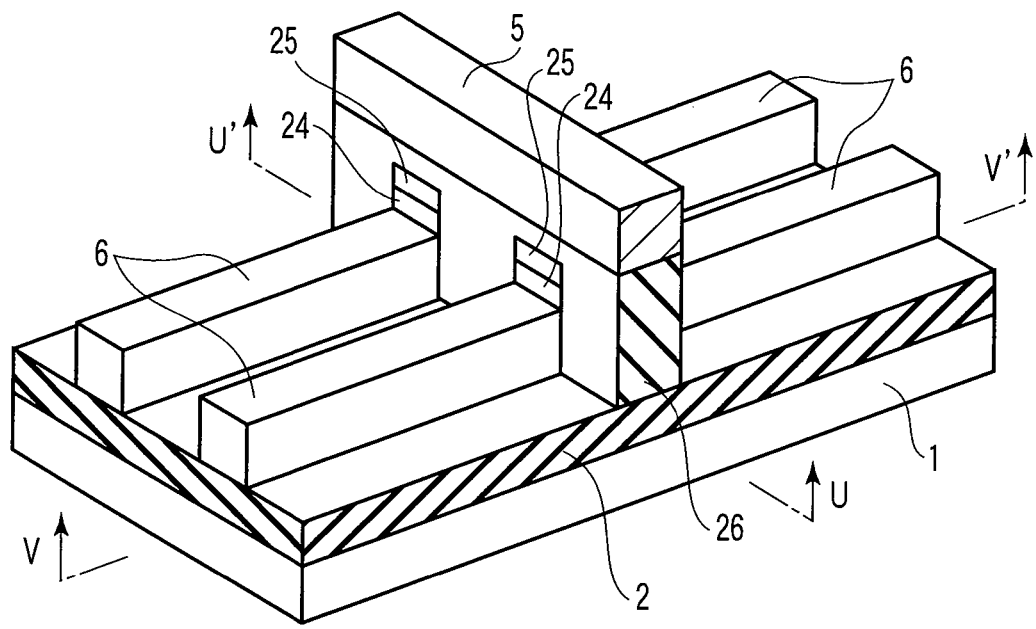
FIG. 79 is a perspective view for explaining a structure of a semiconductor component according to a 10th Embodiment.
Figure 80:
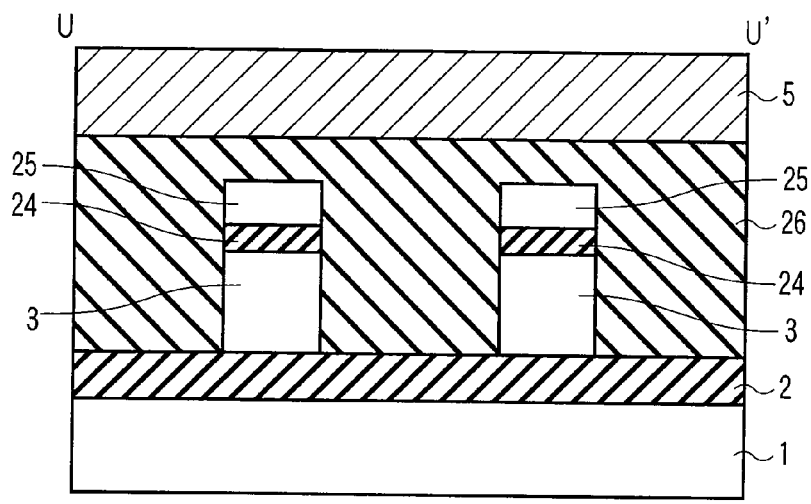
FIG. 80 is a cross-sectional view taken along a line U-U' in FIG. 79.
Figure 81:
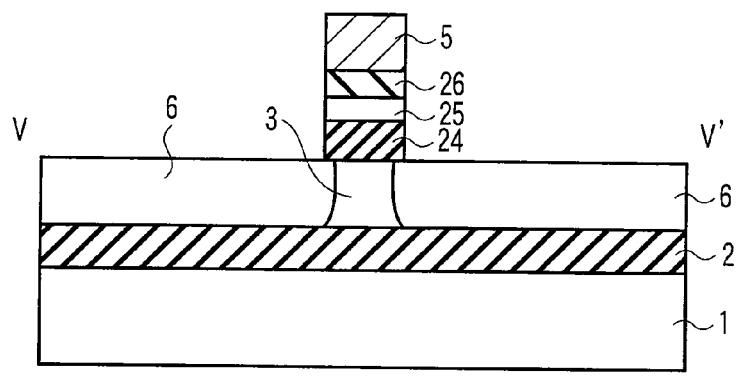
FIG. 81 is a cross-sectional view taken along a line V-V' in FIG. 79.

FIG. 79 schematically shows a structure of a semiconductor component according to a 10th embodiment of the present invention. FIGS. 80 and 81 show cross sections taken along lines U-U' and V-V' in FIG. 79, respectively. This semiconductor component is characterized in that a tunnel gate insulating film 24 is formed on a channel region 3, a charge storage layer 25 is formed on the tunnel gate insulating film 24, an inter-electrode insulating film 26 is formed on the charge storage layer 25, and a gate electrode 5 is formed on the inter-electrode insulating film 26. When such a structure is adopted, a threshold voltage of the semiconductor component varies depending on a quantity of electric charges stored in the charge storage layer 25, thereby providing the semiconductor component with a storage function. A specific operation will be explained later. Other structures are the same as those in the first embodiment, thus omitting a repeated explanation.

Figure 82:
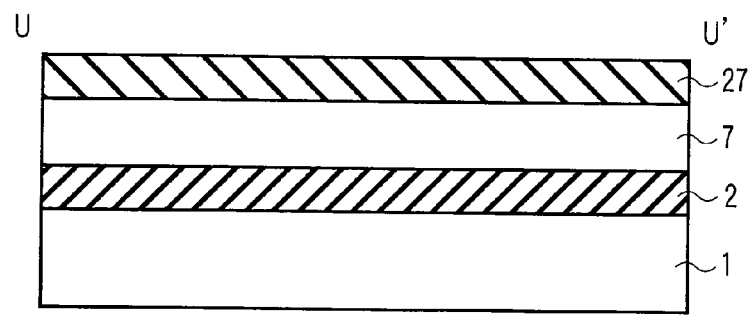

A manufacturing method of a semiconductor component according to this embodiment will now be explained hereinafter. It is to be noted that FIGS. 82 to 84 show cross sections taken along U-U' in FIG. 79. After the step shown in FIG. 14 according to the first embodiment, As ions are implanted into a first silicon substrate 7 with, e.g., an energy of 5 keV and a dose of $1 \times 10^{12}/cm^2$ as shown in FIG. 82. Subsequently, a silicon oxynitride film 27 having a thickness of, e.g., 5 nm is formed on the first silicon substrate 7 based on, e.g., the CVD method.

Then, as shown in FIG. 83, for example, a polysilicon film 28 having a thickness of, e.g., 5 nm is formed on the silicon oxynitride film 27 based on, e.g., the CVD method.

Subsequently, as shown in FIG. 84, anisotropic etching, e.g., of an RIE method is carried out to process the polysilicon film 28 and the silicon oxynitride film 27. Then, anisotropic etching, e.g., of the RIE method is performed to process the first silicon substrate 7, thereby forming semiconductor layers 11.

FIGS. 85 to 88 show cross sections taken along V-V' in FIG. 79. As shown in FIG. 85, for example, a hafnium oxide film 12 having a thickness of, e.g., 5 nm is formed on an entire surface of an insulating region 2 including the polysilicon film 28, the oxynitride film 27, and the semiconductor layers 11 based on, e.g., the CVD method.

Figure 86:
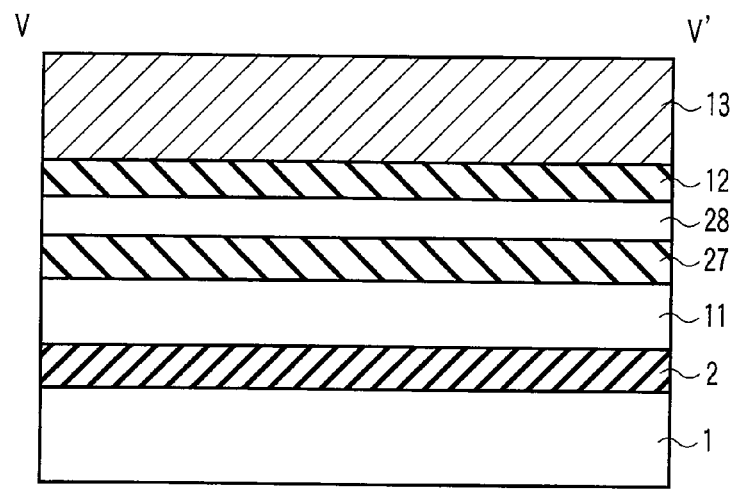

Then, as shown in FIG. 86, for example, a W film 13 having a thickness of, e.g., 10 nm is formed on an entire surface of the hafnium oxide film 12 based on, e.g., the CVD method.

Figure 87:
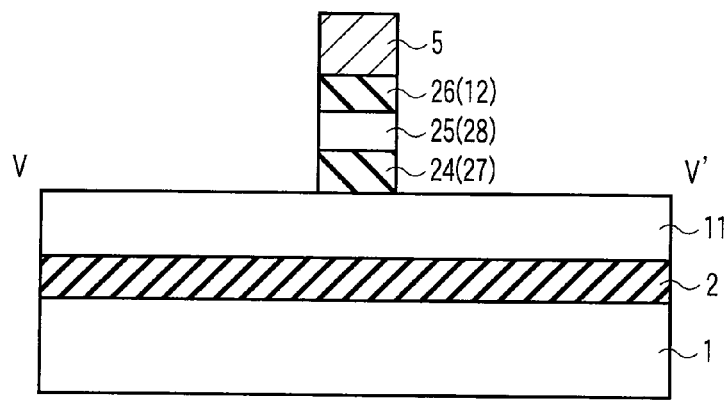

Subsequently, as shown in FIG. 87, the W film 13, the hafnium oxide film 12, the polysilicon film 28, and the oxynitride film 27 are processed by performing anisotropic etching, e.g., RIE, thereby forming the inter-electrode insulating film 26, the charge storage layer 25, and the tunnel gate insulating film 24.

Figure 88:
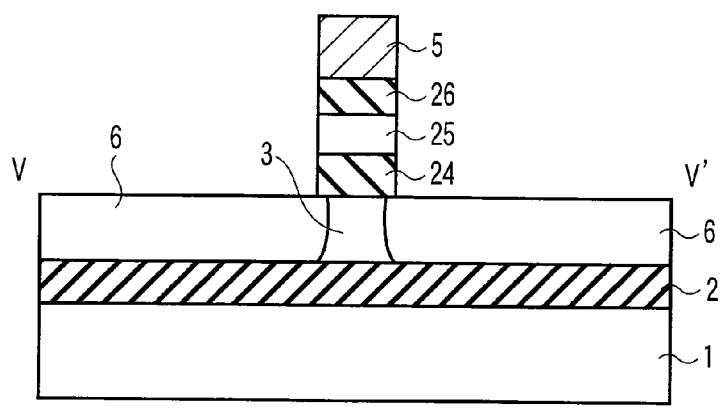

Then, as shown in FIG. 88, for example, As ions are implanted with, e.g., an energy of 10 keV and a dose of $1 \times 10^{15}/cm^2$ to form source/drain regions 6 and a channel region 3 provided therebetween. Thereafter, an interlayer insulating film forming step, a wiring step, and other steps are carried out in the same manner as in the conventional technology, thus forming the semiconductor component according to this embodiment depicted in FIG. 79.

Although the charge storage layer 25 is formed of polysilicon in this embodiment, it may be formed of a metal such as tungsten. Further, the charge storage layer 25 may be formed of a semiconductor such as single-crystal silicon or amorphous silicon, a metal which is not necessarily restricted to tungsten, a compound containing a metal, or a lamination layer of these materials.

Furthermore, a granulated metal or semiconductor or a compound of these materials may be used for the charge storage layer. When the charge storage layer is formed of a metal, since an oxidation reaction hardly advances, there can be obtained an advantage that an interface state of an interface of the inter-electrode insulating film or the tunnel gate insulating film and the charge storage layer is suppressed from occurring and the controllability of the interface is excellent.

Furthermore, when a semiconductor such as polysilicon is used for at least a part of the control gate electrode or the charge storage layer, since control over a work function is facilitated, another advantage that adjustment of a threshold voltage of the component becomes easy can be obtained.

Moreover, although the silicon oxynitride film is used as the tunnel gate insulating film 24 and the hafnium oxide film is used as the inter-conducting-layer insulating film in this embodiment, it is possible to use an insulating film, e.g., a silicon oxide film, a silicon nitride film, an aluminum oxide film, or a lanthanum aluminate film, or any other insulating film, or, for example, a lamination layer of these materials.

In a case where nitrogen is present in the insulating film, when polysilicon containing an impurity is used as the gate electrode or the charge storage layer, the impurity can be suppressed from being diffused in the substrate, and hence a fluctuation in threshold voltage can be suppressed, which is preferable. In particular, when nitrogen is present in the tunnel gate insulating film 24, reliability of the insulating film is improved, which is preferable.

Further, when the silicon oxide is used, since an interface state of an interface between the insulating film and the charge storage layer, the gate electrode, or the substrate or a quantity of fixed charges in the insulating film is small, there can be obtained an advantage that a fluctuation in component characteristics can be suppressed.

Further, for example, when an oxide of a given material is used for the insulating film, a film of this material may be first formed in advance and this film may be exposed to a gas containing oxygen in a temperature increased state or an excited state. When a method of exposing the film in an oxygen gas in an excited state involving no increase in temperature is used, a concentration distribution of an impurity in the channel region is suppressed from being changed due to diffusion, which is preferable.

When the silicon oxynitride is used, a silicon oxide film may be first formed, and then this film may be exposed to a gas containing nitrogen in a temperature increased state or an excited state, thereby introducing nitrogen into the insulating film. When a method of exposing the film to a nitrogen gas in an excited state involving no increase in temperature is used, a concentration distribution of an impurity in the channel region is suppressed from being changed due to diffusion, which is preferable.

Alternatively, a silicon nitride film may be first formed, and then this film may be exposed to a gas containing oxygen in a temperature increased state or an excited state, thereby introducing oxygen into the insulating film. When a method of exposing the film in an oxygen gas in an excited state is used without involving an increase in temperature, a concentration distribution of an impurity in the channel region is suppressed from being changed due to diffusion, which is preferable.

Further, it is also possible to use an insulating film consisting of, e.g., an oxide of a metal of an Hf, Zr, Ti, Sc, Y, Ta, Al, La, Ce, Pr, or lanthanoid based element, or a silicate material containing various elements including these elements, or an insulating film containing nitrogen besides these materials, or a high-dielectric film, or any other insulating film as a lamination layer of these materials.

When a larger amount of a voltage applied to a space between the gate electrode and the channel region is applied to the tunnel gate insulating film formed between the charge storage layer and the channel region than the inter-electrode insulating film formed between the gate electrode and the charge storage layer at the time of a storage operation, this is advantageous when performing the storage operation. Therefore, a smaller equivalent oxide thickness of the inter-electrode insulating film is preferable.

For the same reason, it is preferable for a dielectric constant of the inter-electrode insulating film to be higher than that of the tunnel gate insulating film. In particular, a higher dielectric constant of the inter-electrode insulating film is preferable. For example, there is an insulating film consisting of an oxide of Hf, Zr, Ti, Sc, Y, Ta, Al, La, Ce, Pr, or lanthanoid based metal element or a silicate material containing various elements including these elements, and an insulating film containing nitrogen mixed in with these materials. A high-dielectric film containing a metal has a higher dielectric constant than that of silicon oxide, silicon nitride, or silicon oxynitride, and hence using such materials for the inter-electrode insulating film is preferable.

Further, when film thicknesses of the inter-electrode insulating film and the tunnel gate insulating film are small, there occurs a problem that a tunneling current flows even in a situation where the tunneling current flowing through these insulating films does not have to flow and stored information fluctuates, namely, an information holding time is reduced. Therefore, it is preferable to increase film thicknesses of the inter-electrode insulating film and the tunnel gate insulating film to a certain level. Furthermore, to intensify capacitance coupling formed between the control gate electrode and the channel region through the inter-electrode insulating film, the charge storage layer, and the tunnel gate insulating film, it is preferable for the inter-electrode insulating film and the tunnel gate insulating film to have higher dielectric constants than that of the conventionally adopted silicon oxide.

Further, the insulating film forming method is not restricted to the CVD method, and any other method, e.g., a thermal oxidation method, an evaporation method, a sputtering method, or an epitaxial growth method may be used.

Moreover, in this embodiment, an area of the gate electrode per channel region is formed to be larger than the charge storage layer. As a result, the inter-electrode insulating film has an area larger than that of the tunnel gate insulating film. When such a structure is adopted, capacitance coupling formed between the gate electrode and the charge storage layer through the inter-electrode insulating film can be readily set to be larger than a capacitance formed between the charge storage layer and the channel region through the tunnel gate insulating film.

As a result, a larger amount of a voltage applied to a space between the gate electrode and the channel region can be easily applied to the tunnel gate insulating film formed between the charge storage layer and the channel region than the inter-electrode insulating film formed between the gate electrode and the charge storage layer at the time of a storage operation, which is advantageous when performing the storage operation.

11th Embodiment

Figure 91:
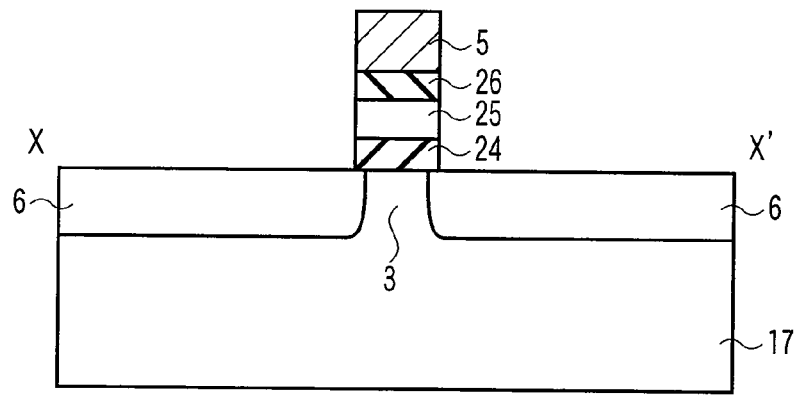
FIG. 91 is a cross-sectional view taken along a line X-X' in FIG. 89.

FIG. 89 schematically shows a structure of a semiconductor component according to an 11th embodiment of the present invention. FIGS. 90 and 91 show cross sections taken along W-W' and X-X' in FIG. 89, respectively. This semiconductor component is also characterized in that a tunnel gate insulating film 24, a charge storage layer 25, an inter-electrode insulating film 26, and a gate electrode 5 are sequentially formed on the channel region 3. When such a structure is adopted, a threshold voltage of the semiconductor component varies depending on a quantity of electric charges stored in the charge storage layer 25, thereby providing the semiconductor component with a storage function. A specific operation will be explained later. Since the structure of this embodiment is the same as that of the fifth embodiment except for the above-mentioned point, a repeated explanation will be omitted.

Figure 92:
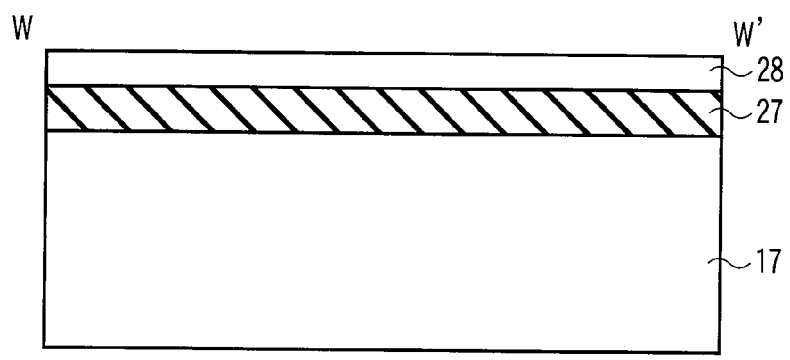

A manufacturing method of a semiconductor component according to this embodiment will now be explained. It is to be noted that FIGS. 92 to 95 show cross sections taken along W-W' in FIG. 89. First, as shown in FIG. 92, B ions are implanted into a silicon substrate 17 with, e.g., an energy of 5 keV and a dose of $1 \times 10^{12}/cm^2$. Subsequently, for example, a silicon oxynitride film 27 having a thickness of, e.g., 5 nm is formed on the silicon substrate 17 based on, e.g., a CVD method. Then, for example, a polysilicon film 28 having a thickness of, e.g., 5 nm is formed on the silicon oxynitride film 27 based on, e.g., the CVD method.

Figure 93:
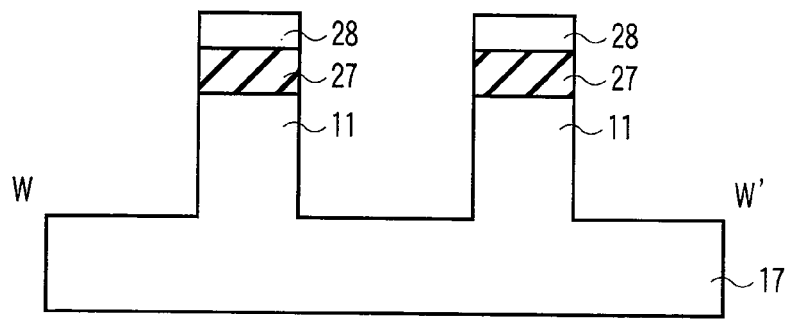

Subsequently, as shown in FIG. 93, the polysilicon film 28 and the silicon oxynitride film 27 are processed based on anisotropic etching, e.g., RIE. Then, the silicon substrate 17 is processed by anisotropic etching, e.g., RIE, to form semiconductor layers 11.

Subsequently, as shown in FIG. 94, for example, a silicon oxide film 8 which contains, e.g., 12 atomic % of fluorine and has a thickness of, e.g., 30 nm is formed on the silicon substrate 17, the polysilicon film 28, the silicon oxynitride film 27, and the semiconductor layers 11 based on, e.g., the CVD method using an $SH_4$ gas, an $SF_4$ gas, an oxygen gas, or an Ar gas. Then, a surface of the silicon oxide film 8 containing fluorine is flattened based on, e.g., a CMP method.

Subsequently, as shown in FIG. 95, the silicon oxide film 8 containing fluorine is subjected to anisotropic etching, e.g., RIE, to be partially removed, thereby forming an insulating region 2 to expose the semiconductor layers 11.

FIGS. 96 to 99 show cross sections taken along X-X' in FIG. 89. As shown in FIG. 96, for example, a hafnium oxide film 12 having a thickness of, e.g., 5 nm is formed on an entire surface of the insulating region 2 including the polysilicon film 28, the oxynitride film 27, and each semiconductor layer 11 based on, e.g., the CVD method. Then, as shown in FIG. 97, for example, a W film 13 having a thickness of 10 nm is formed on an entire surface of the hafnium oxide film 12 based on, e.g., the CVD method.

Subsequently, as shown in FIG. 98, for example, anisotropic etching, e.g., RIE, is carried out to process the W film 13, the hafnium oxide film 12, the polysilicon film 28, and the oxynitride film 27, thereby forming a gate electrode 5, an inter-electrode insulating film 26, a charge storage layer 25, and a tunnel gate insulating film 24.

Then, as shown in FIG. 99, for example, As ions are implanted with, e.g., an energy of 10 keV and a dose of $1 \times 10^{15}/cm^2$ to form source/drain regions 6 and a channel region 3 provided therebetween. Thereafter, an interlayer insulating film forming step, a wiring step, and other steps are carried out in the same manner as in the conventional technology to form the semiconductor component according to the present invention shown in FIG. 89. This embodiment can demonstrate the same effect as in the 10th embodiment.

12th Embodiment

Figure 100:
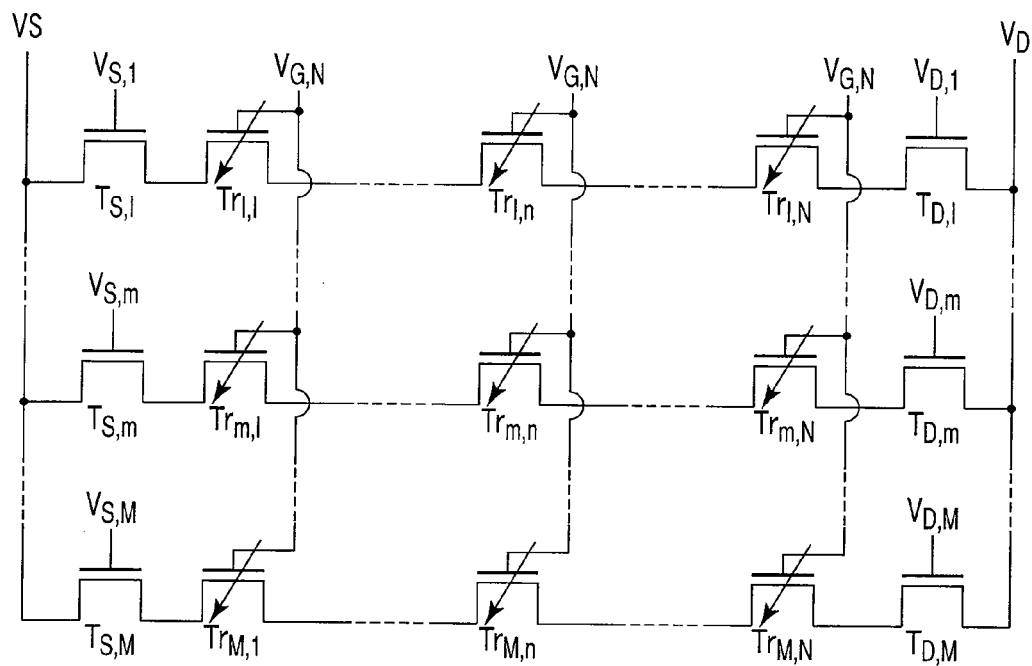
FIG. 100 is a circuit diagram for explaining a semiconductor device according to 12th and 13th embodiments.
Figure 101:
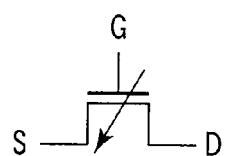
FIG. 101 is a view for explaining symbols in the circuit diagram of FIG. 100.

FIG. 100 is a circuit diagram of a semiconductor device according to a 12th embodiment of the present invention. This semiconductor device is configured by arranging semiconductor components according to the eighth embodiment in the form of lattice points. These semiconductor components are arranged in M rows and N columns, and the M×N semiconductor components are included. It is to be noted that FIG. 100 shows each semiconductor component of the present invention according to the eighth embodiment as in FIG. 101. Each terminal denoted as S or D in FIG. 101 is a source or a drain. A terminal denoted by G is a gate electrode. It is to be noted that a terminal of a substrate is omitted and hence it is not depicted.

In FIG. 100, $Tr_{i,j}$ ($1 \leq i \leq M$, $1 \leq j \leq N$) denotes the semiconductor component. In the semiconductor components included in the same row, source/drain regions of the components adjacent to each other are coupled, and gate electrodes of the semiconductor components included in the same column are coupled with each other. The source/drain regions in each row are coupled with common lines through field-effect transistors $T_{S,i}$ and $T_{D,i}$ ($1 \leq i \leq M$) on right and left sides, and a potential in each common line is $V_S$ or $V_D$.

Potentials in the gate electrodes of the transistors $T_{S,i}$ and $T_{D,i}$ ($1 \leq i \leq M$) are $V_{S,i}$ and $V_{D,i}$ ($1 \leq i \leq M$), respectively. Based on the assumption that threshold voltages of the respective transistors are substantially equal, although they don not have to be the same, values of the threshold voltages are determined as $V_{th}$. $V_{th}$ is set between zero and a power supply voltage $V_{DD}$.

It is to be noted that the source/drain regions and the channel region of the semiconductor component explained in the eighth embodiment are of the n type, whereas the source/drain regions are of the n type but the channel region is of a p type in the transistors $T_{S,i}$ and $T_{D,i}$ ($1 \leq i \leq M$).

Further, potentials in the gate electrodes coupled with each other in a column j are $V_{G,j}$ ($1 \leq i \leq N$). Furthermore, a substrate potential is common to all the semiconductor components $Tr_{i,j}$ ($1 \leq i \leq M$, $1 \leq j \leq N$). It is to be noted that external wiring lines in the region shown in the drawing, a junction region with respect to the external wiring lines, and other parts are omitted in this drawing. This semiconductor device can store information of M×N bits in total. This operation will now be explained.

Methods of writing, erasing, and reading information with respect to the semiconductor component $Tr_{m,n}$ present in the row m and the column n will now be explained based on the assumption that each semiconductor component is of the n type. The methods can be likewise applied to a p type component except that a polarity of a voltage is reversed. Here, m and n designate an arbitrary row and column satisfying $1 \leq m \leq M$ and $1 \leq n \leq N$, respectively.

As explained in the eighth embodiment, since the gate insulating film 4 of the semiconductor component according to the eighth embodiment is formed of a ferroelectric material, spontaneous polarization can be provided. It is assumed that 1 corresponds to a case where a direction of polarization is extended from the gate electrode 5 toward the channel region 3 and 0 corresponds to a case where a direction of polarization is extended from the channel region 3 to the gate electrode 5. It is assumed that $V_{TH,0}$ is a threshold voltage of each semiconductor component in the case of 0 and $V_{TH,1}$ is a threshold voltage of each semiconductor component in the case of 1. In general, $V_{TH,1} < V_{TH,0}$ is achieved.

Here, changing a state where zero is written, i.e., a "state where a direction of polarization of the ferroelectric gate insulating film 4 is extended from the channel region 3 toward the gate electrode 5" to a state where 1 is written, i.e., a "state where a direction of polarization of the ferroelectric gate insulating film 4 is extended from the gate electrode 5 to the channel region 3" is called writing information, and changing in reverse is called erasing information.

Writing information will be explained first. A potential in a common substrate is set to zero. $V_{G,j}$ ($1 \leq j \leq N$) is a potential higher than $V_{TH,0}$. However, it is a potential whereby inversion of polarization of the ferroelectric gate insulating film 4 does not occur. Then, all of $Tr_{i,j}$ ($1 \leq i \leq M$, $1 \leq j \leq N$) enter a conducting state.

$V_{S,i}$ and $V_{D,i}$ ($1 \neq m$) are values lower than $V_{th}$ (e.g., zero), and $V_{S,m}$ and $V_{D,m}$ are values higher than $V_{th}$ (e.g., $V_{DD}$). Then, all of $V_{S,i}$ and $V_{D,i}$ ($i \neq m$) enter a non-conducting state, and all of $V_{S,m}$ and $V_{D,m}$ enter the conducting state.

Further, $V_S$ and $V_D$ are set to zero. Then, since the source/drain regions of $Tr_{i,j}$ ($i \neq m$, $1 \leq j \leq N$) enter a floating state since they are not connected with an external circuit, and potentials in source/drain regions of $Tr_{m,j}$ ($1 \leq j \leq N$) all become zero since the source/drain regions are connected with the external circuit.

As a result, a potential in the channel region of $Tr_{m,j}$ ($1 \leq j \leq N$) also becomes zero. In this state, the common substrate enters the floating state, and $V_{G,n}$ is set to a potential whereby polarization of the ferroelectric gate insulating film 4 of $Tr_{m,n}$ is reversed to a direction extending from the gate electrode 5 toward the channel region 3. Then, polarization of the ferroelectric gate insulating film of $Tr_{m,n}$ occurs, and the threshold voltage of $Tr_{m,n}$ is changed from $V_{TH,0}$ to $V_{TH,1}$.

Here, although $V_{G,j}$ ($j \neq n$) is set to the potential higher than $V_{TH,0}$, it is a potential whereby polarization of the ferroelectric gate insulating film 4 is not reversed, and hence the threshold voltage of $Tr_{i,j}$ ($1 \leq i \leq M$, $j \neq n$) is not changed. Furthermore, as explained above, the source/drain regions of $Tr_{i,n}$ ($i \neq m$) are in the floating state, and the substrate is also in the floating state. Therefore, the channel region of $Tr_{i,n}$ ($i \neq m$) is also in the floating state. Accordingly, when $V_{G,n}$ is changed, the potential in the channel region of $Tr_{i,n}$ ($i \neq m$) follows $V_{G,n}$ due to capacitance coupling of the gate electrode 5 through the ferroelectric gate insulating film 4. Therefore, an electric field in the ferroelectric gate insulating film 4 of $Tr_{i,n}$ ($i \neq m$) does not have a high value, and polarization of the ferroelectric gate insulating film 4 is not reversed. Therefore, the threshold voltage of $Tr_{i,n}$ ($i \neq m$) is not changed.

In this manner, the threshold voltage of $Tr_{m,n}$ alone can be controlled without changing the threshold voltages of other $Tr_{i,j}$ (($i$, $j$)$\neq$($m$, $n$)). In this manner, writing is carried out.

Erasing information will now be explained. A potential in the common substrate is set to zero. It is assumed that $V_{S,i}$ and $V_{D,i}$ ($i \neq m$) are values lower than $V_{th}$ (e.g., zero) and $V_{S,m}$ and $V_{D,m}$ are values higher than $V_{th}$ (e.g., $V_{DD}$). Then, all of $T_{S,i}$ and $T_{D,i}$ ($i \neq m$) enter the non-conducting state, and $V_{S,m}$ and $V_{D,m}$ enter the conducting state. Moreover, $V_S$ and $V_D$ are set to zero. $V_{G,j}$ ($j \neq n$) is a potential higher than $V_{TH,0}$. However, it is a potential which does not provoke reversal of polarization of the ferroelectric gate insulating film 4. Additionally, $V_{G,n}$ is set to a sufficiently low potential. This will be specifically explained later.

Then, since $T_{S,m}$ and $T_{D,m}$ are in the conducting state, potentials in their source/drain regions and channel region are zero, equal to $V_S$ and $V_D$. Here, since all of $Tr_{m,j}$ ($j \neq n$) are in the conducting state, potentials in their channel regions and source/drain regions become zero, and potentials in the source/drain regions of $Tr_{m,n}$ also become zero.

Here, since a low potential is applied to $V_{G,n}$, the potential in the channel region of $Tr_{m,n}$ is lowered due to capacitance coupling between the channel region and the gate electrode through the ferroelectric gate insulating film. Both the source/drain regions and the channel region of each $Tr_{m,n}$ are of the n type, and the potentials in the source/drain regions of $Tr_{m,n}$ are also lowered. With this reduction, potentials in the channel region and the source/drain regions of each $Tr_{m,j}$ ($j \neq n$) are also decreased, but the potentials are not lowered any further when pn junctions between the channel regions and the source/drain regions of $T_{S,m}$ and $T_{D,m}$ are biased in a forward direction. Therefore, the potential in the channel region of each $Tr_{m,n}$ does not become lower than zero.

Further, when $V_{G,n}$ is set to a sufficiently low potential whereby polarization of the ferroelectric gate insulating film 4 is reversed in a direction extending from the channel region 3 toward the gate electrode 5, polarization of the ferroelectric gate insulating film 4 of $Tr_{m,n}$ is reversed in a direction extending from the channel region 3 to the gate electrode 5. That is, zero is written.

Here, since all of $T_{S,i}$ and $T_{D,i}$ ($i \neq m$) are in the non-conducting state, the source-drain regions and the channel region 3 of each $Tr_{i,j}$ ($i \neq m$, $1 \leq j \leq N$) enter the floating state. Therefore, when a low potential is applied to $V_{G,n}$, the potential in the channel region of each $Tr_{i,n}$ ($i \neq m$) is lowered due to capacitance coupling between the channel region 3 and the gate electrode 5 through the ferroelectric gate insulating film 4, an electric field in the ferroelectric gate insulating film 4 does not take a very high value, and polarization of the ferroelectric gate insulating film 4 does not change.

Furthermore, although $V_{G,j}$ ($j \neq n$) is a potential higher than $V_{TH,0}$, it is a potential which does not provoke reversal of potential of the ferroelectric insulating film 4, and hence the polarization of the ferroelectric gate insulating film of $Tr_{i,j}$ ($1 \leq i \leq M$, $j \neq n$) does not change. In this manner, the threshold voltage of $Tr_{m,n}$ alone can be controlled without changing the threshold voltages of other $Tr_{i,j}$ (($i$, $j$)$\neq$($m$, $n$)). In this manner, erasing is carried out.

It is to be noted that the method of erasing information stored in $Tr_{m,n}$ alone has been explained here, but all of information stored in $Tr_{i,n}$ ($1 \leq i \leq M$) can be erased at the same time by the same method when all of $V_{S,i}$ and $V_{D,i}$ ($1 \leq i \leq M$) are set to values higher than $V_{th}$ (e.g., $V_{DD}$). Therefore, the operation can be simplified, and an advantage that a time required for erasing is shortened can be obtained.

Further, when the method explained first is used to perform erasing, another advantage that information stored in a specific semiconductor component alone can be selectively erased is obtained. In this manner, writing and erasing are carried out.

A method of reading will now be explained. Reading information in $Tr_{m,n}$ is carried out as follows. A potential in the common substrate is set to zero. $V_{G,j}$ ($j \neq n$) is set to a potential higher than $V_{TH,0}$. However, it is a potential that does not provoke reversal of polarization of the ferroelectric gate insulating film 4. Then, all of $Tr_{i,j}$ ($1 \leq i \leq M$, $j \neq n$) enter the conducting state. $V_S$ is set to, e.g., zero, and $V_D$ is set to, e.g., $V_{DD}$. $V_{S,i}$ and $V_{D,i}$ ($i \neq m$) are set to values lower than $V_{th}$ (e.g., zero), and $V_{S,m}$ and $V_{D,m}$ are set to values higher than $V_{th}$ (e.g., $V_{DD}$).

When the above-explained setting is adopted, $T_{S,i}$ and $T_{D,i}$ ($i \neq m$) all enter the non-conducting state, and $T_{S,m}$ and $T_{D,m}$ enter the conducting state. Further, the source/drain regions of each $Tr_{i,j}$ ($i \neq m$, $1 \leq j \leq N$) enter the floating state since they are not connected with an external circuit. Since the source/drain regions of each $Tr_{m,j}$ ($1 \leq j \leq N$) are connected with the external circuit, potentials in the source/drain regions of $Tr_{m,j}$ ($1 \leq j \leq n$) or the source/drain regions of $Tr_{m,n}$ on the left-hand side in FIG. 100 become zero, and potentials in the source/drain regions of $Tr_{m,j}$ ($n < j \leq N$) or the source/drain regions of $Tr_{m,n}$ on the right-hand side in FIG. 100 become $V_{DD}$.

Further, assuming that $V_{G,n}$ has a value between $V_{TH,0}$ and $V_{TH,1}$, since a current corresponding to the threshold voltage of $Tr_{m,n}$ flows from a terminal to which $V_D$ is applied to a terminal to which $V_S$ is applied, detecting this current value enables reading information stored in $Tr_{m,n}$. It is to be noted that detecting whether the current flows can suffice in this operation, and hence amplification can be performed by using, e.g., a sense amplifier, and then detection is carried out. Performing this operation enables obtaining an advantage that erroneous reading can be avoided. In this manner, information of M×N bits can be stored.

According to this embodiment, improving the controllability of the gate electrode over the potential in the channel region enables suppressing the short channel effect, and a high-performance storage device can be realized since the storage device is constituted of storage components having a high-current driving force.

13th Embodiment

A 13th embodiment is a storage device in which the semiconductor components according to the ninth embodiment are arranged in the form of lattice points. The circuit diagram of the semiconductor component arrangement and the drawing of the component are the same as FIGS. 100 and 101, and hence a description will be given with reference to these drawings.

The semiconductor components according to this embodiment are likewise arranged in M rows and N columns, thus M×N semiconductor components are included in total. Connections between the plurality of semiconductor components are the same as those in the 12th embodiment, thereby omitting a repeated explanation. An operation will now be explained hereinafter.

Methods of writing, erasing, and reading information with respect to a semiconductor component $Tr_{m,n}$ in a row m and a column n will now be explained based on the assumption that each semiconductor component is of an n type. The same explanation can be applied to p-type components except that a voltage polarity is reversed. Here, m and n mean an arbitrary row and column satisfying $1 \leq m \leq M$ and $1 \leq n \leq N$.

As explained in the ninth embodiment, since the gate insulating film of each semiconductor component according to the ninth embodiment is also formed of a ferroelectric substance, spontaneous polarization can be provided. The definition of direction of polarization, threshold voltage of each semiconductor component, and writing or erasing information are the same as those explained in the 12th embodiment.

First, information is written by performing the same operation as writing information in the semiconductor device explained in the 12th embodiment.

Erasing information will now be explained. A potential in a common substrate is set to zero. $V_{S,i}$ and $V_{D,i}$ ($1 \leq i \leq M$) are set to values lower than $V_{th}$. Then, all of $T_{S,i}$ and $T_{D,i}$ ($1 \leq i \leq M$) enter a non-conducting state. Furthermore, $V_S$ and $V_D$ are set to, e.g., zero. $V_{G,j}$ ($j \neq n$) is set to a potential which does not provoke reversal of polarization of a ferroelectric gate insulating film, e.g., zero. Moreover, $V_{G,n}$ is set to a sufficiently low potential. This will be specifically explained later.

When such a setting is adopted, since the potential in the common substrate is zero, an electric field having a direction extending from the substrate 1 to a gate electrode 5 is generated in the ferroelectric gate insulating film 4 of each $Tr_{i,n}$ ($1 \leq i \leq M$). Therefore, when $V_{G,n}$ is set to a sufficiently low potential whereby polarization of the ferroelectric gate insulating film 4 is reversed to a direction extending from a channel region 3 to the gate electrode 5, polarization of the ferroelectric gate insulating film 4 is reversed to a direction extending from the channel region 3 to the gate electrode 5. That is, zero is written.

Here, since $V_{G,j}$ ($j \neq n$) is set to a potential which does not provoke reversal of polarization of the ferroelectric gate insulating film 4, e.g., zero, an electric field in the ferroelectric gate insulating film 4 does not take a very high value, and polarization of the ferroelectric gate insulating film 4 does not change.

In this manner, a threshold voltage of each $Tr_{i,n}$ ($1 \leq i \leq M$) alone can be controlled without changing threshold voltages of other $Tr_{i,j}$ ($1 \leq i \leq M$, $j \neq n$). In this manner, erasing is effected.

It is to be noted that the method of erasing information stored in $Tr_{i,n}$ ($1 \leq i \leq M$) has been explained. However, when $V_{G,j}$ ($1 \leq j \leq n$) is set to, e.g., zero and a potential which provides reversal of polarization of the ferroelectric gate insulating film 4 is applied to the common substrate 1, polarizations of the ferroelectric gate insulating films 4 of all $Tr_{i,j}$ ($1 \leq i \leq M$, $1 \leq j \leq N$) are reversed to a direction extending from the channel region 3 to the gate electrode 5. That is, zero is written.

Based on this structure, since information in all $Tr_{i,j}$ ($1 \leq i \leq M$, $1 \leq j \leq N$) is erased by a single operation, there can be obtained an advantage that the operation can be simplified and a time required for erasing can be shortened. Further, when the method explained first is used to perform erasing, another advantage that information stored in the semiconductor components belong to a specific row alone can be erased can be obtained. In this manner, writing and erasing are effected.

Reading is carried out by performing the same operation as reading information in the semiconductor device explained in the 12th embodiment. In this manner, information of M×N bits can be stored.

In this embodiment, improving the controllability of the gate electrode over the potential in the channel region enables suppressing the short channel effect, and the storage device is constituted of the storage components each having a high current driving force, thereby realizing a high-performance storage device.

14th Embodiment

Figure 102:
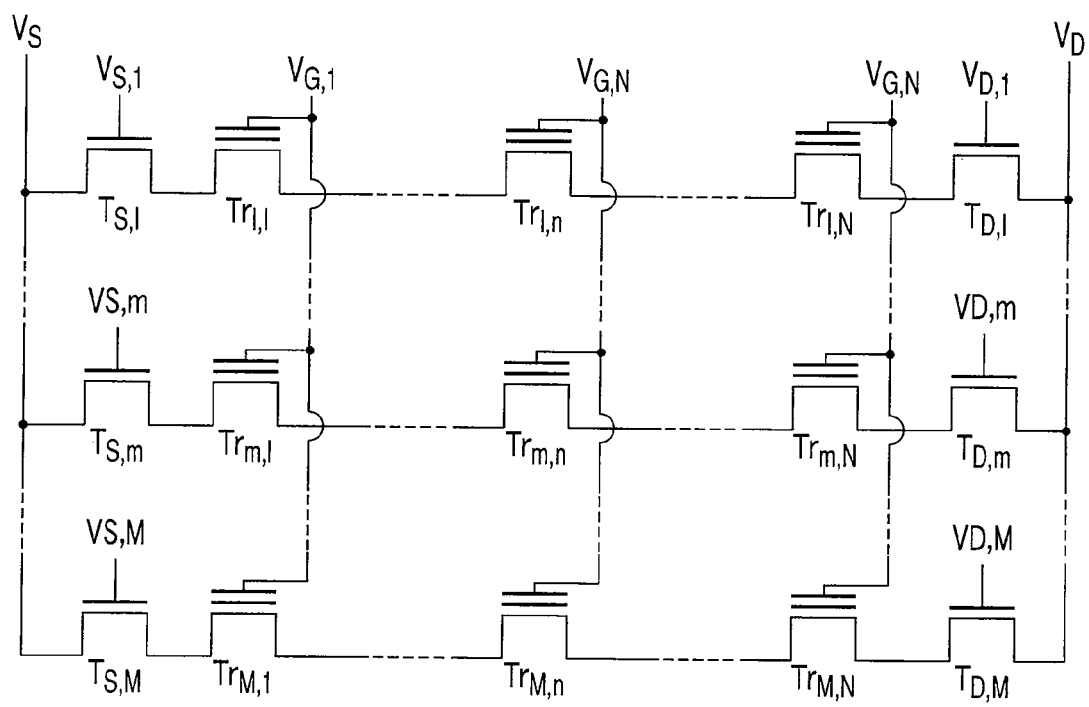
FIG. 102 is a circuit diagram for explaining a semiconductor device according to 14th and 15th embodiments according to the present invention.
Figure 103:
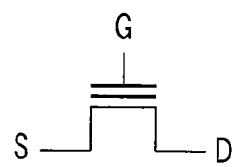
FIG. 103 is a view for explaining symbols in the circuit diagram of FIG. 102.

FIG. 102 is a circuit diagram of a semiconductor device according to a 14th embodiment. This semiconductor device has the semiconductor components according to the 10th embodiment arranged in the form of lattice points. These semiconductor components are arranged in M rows and N columns, thus M×N semiconductor components are included in total. It is to be noted that, in FIG. 102, each semiconductor component of the present invention according to the 10th embodiment is as depicted in FIG. 103. In FIG. 103, terminals denoted by S and D are a source and a drain, and a terminal designated by G is a gate electrode. It is to be noted that a terminal of a substrate is omitted and not shown.

$Tr_{i,j}$ ($1 \leq i \leq M$, $1 \leq j \leq N$) in FIG. 102 denotes each semiconductor component according to the 10th embodiment. In the semiconductor components included in the same row, source/drain regions of the components adjacent to each other are mutually coupled. In the semiconductor components included in the same column, gate electrodes are coupled with each other. The source/drain regions in each row are coupled with common lines through field-effect transistors $T_{S,i}$ and $T_{D,i}$ ($1 \leq i \leq M$) on left and right sides, and potentials in these common lines are $V_S$ and $V_D$, respectively. Moreover, potentials in gate electrodes of $T_{S,i}$ and $T_{D,i}$ ($1 \leq i \leq M$) are $V_{S,i}$ and $V_{D,i}$ ($1 \leq i \leq M$), respectively. Based on the assumption that threshold voltages of $T_{S,i}$ and $T_{D,i}$ ($1 \leq i \leq M$) are substantially equal to each other, although they do not have to be equal, their values are $V_{th}$. $V_{th}$ is set to a value between zero and a power supply voltage $V_{DD}$.

It is to be noted that both the source/drain regions and the channel region of each semiconductor component according to the 10th embodiment are of the n type, whereas the source/drain regions is of the n type and the channel region is of the p type in $T_{S,i}$ and $T_{D,i}$ ($1 \leq i \leq M$).

Additionally, potentials in the gate electrodes coupled with each other in a column j are $V_{G,j}$ ($1 \leq j \leq N$). Further, a substrate potential is common to all $Tr_{i,j}$ ($1 \leq i \leq M$, $1 \leq j \leq N$). It is to be noted that external wiring lines, a junction region with respect to the external wiring lines, and other parts are omitted in this drawing. This semiconductor device can store information of L×M×N bits in total. Here, L means an amount of information that can be stored per semiconductor component. This operation will now be explained.

Note that each semiconductor component is of the n type and methods of writing, erasing, and reading information with respect to each semiconductor component $Tr_{m,n}$ provided in a row m and a column n will be explained. The same explanation can be applied to a component which is of a p type except that a polarity of a voltage is reversed. Here, m and n mean an arbitrary row and column satisfying $1 \leq m \leq M$ and $1 \leq n \leq N$, respectively.

As explained in the 10th embodiment, in each semiconductor component according to the 10th embodiment, a tunnel gate insulating film 24, a charge storage layer 25, an inter-electrode insulating film 26, and a gate electrode 5 are sequentially formed on a channel region 3.

When the above explained structure is adopted, electric charges stored in the charge storage layer can be changed based on a current flowing through the tunnel gate insulating film 24, and a threshold voltage can be changed based on a quantity of electric charges stored in the charge storage layer. It is assumed that the threshold voltage of each semiconductor component can take values in K patterns. K has a relationship of $K=2^L$ with respect to L explained above. The threshold voltages of the respective semiconductor components are $V_{TH,1} < \ldots < V_{TH,K}$ in ascending order. Electric charges stored in the charge storage layer 25 have a negative value, and an absolute value of stored electric charges is increased when the threshold voltage has a larger value.

Writing information will be explained first. A potential of the common substrate is set to zero. $V_{G,j}$ ($1 \leq j \leq N$) is set to a potential higher than $V_{TH,K}$. However, a current flowing through the tunnel gate insulating film is set to a non-flowing potential. Then, $Tr_{i,j}$ ($1 \leq i \leq M$, $1 \leq j \leq N$) all enter a conducting state. $V_{S,i}$ and $V_{D,i}$ ($i \neq m$) are set to values lower than $V_{th}$ (e.g., zero) and $V_{S,m}$ and $V_{D,m}$ are set to values higher than $V_{th}$ (e.g., $V_{DD}$). Then, $T_{S,i}$ and $T_{D,i}$ ($i \neq m$) all enter a non-conducting state, and $T_{S,m}$ and $T_{D,m}$ enter the conducting state. Further, $V_S$ and $V_D$ are set to zero.

When the above-explained setting is adopted, source/drain regions of $Tr_{i,j}$ ($i \neq m$, $1 \leq j \leq N$) enter a floating state since they are not connected with an external circuit, and potentials in source/drain regions of $Tr_{m,j}$ ($1 \leq j \leq N$) all become zero since these regions are connected with the external circuit.

As a result, a potential in the channel region 3 of $Tr_{m,j}$ ($1 \leq j \leq N$) also becomes zero. In this state, when the common substrate 1 is set to the floating state and $V_{G,n}$ is set to a potential whereby a current flowing through the tunnel gate insulating film 24 flows and desired electric charges are stored in the charge storage layer 5, a quantity of electric charges stored in the charge storage layer 25 of $Tr_{m,n}$ can be changed, thereby varying the threshold voltage of $Tr_{m,n}$ to a desired value.

Here, since $V_{G,j}$ ($j \neq n$) is set to a potential higher than $V_{TH,K}$ but it is a potential at which no current flows through the tunnel gate insulating film 24, the threshold voltage of $Tr_{i,j}$ ($1 \leq i \leq M$, $j \neq n$) does not vary. Furthermore, as explained above, since the source/drain regions 6 of $Tr_{i,n}$ ($i \neq m$) are in the floating state and the substrate 1 is also in the floating state, the channel region 3 of $Tr_{i,n}$ ($i \neq m$) is also in the floating state.

Therefore, when $V_{G,n}$ is changed, the potential in the channel region 3 of $Tr_{i,n}$ ($i \neq m$) follows $V_{G,n}$ due to capacitance coupling with the gate electrode 5 through the tunnel gate insulating film 24, the charge storage layer 25, and the inter-electrode insulating film 26. Accordingly, an electric field in the tunnel gate insulating film 24 of $Tr_{i,n}$ ($i \neq m$) does not take a very high value, and the current flowing through the tunnel gate insulating film 24 does not flow. Therefore, the threshold voltage of $Tr_{i,n}$ ($i \neq m$) does not change.

In this manner, the threshold voltage of $Tr_{m,n}$ alone can be controlled without changing the threshold voltages of other $Tr_{i,j}$ ($(i, j) \neq (m, n)$). Writing is carried out in this way.

Erasing information will now be explained. A potential in the common substrate 1 is set to zero. $V_{S,i}$ and $V_{D,i}$ ($i \neq m$) are set to values lower than $V_{th}$ (e.g., zero), and $V_{S,m}$ and $V_{D,m}$ are set to values higher than $V_{th}$ (e.g., $V_{DD}$). Then, $T_{S,i}$ and $T_{D,i}$ ($i \neq m$) all enter the non-conducting state, and $T_{S,m}$ and $T_{D,m}$ enter the conducting state. Moreover, $V_S$ and $V_D$ are set to zero. $V_{G,j}$ ($j \neq n$) is set to a potential higher than $V_{TH,K}$. However, a current flowing through the tunnel gate insulating film 2 is set to a non-flowing potential. Additionally, $V_{G,n}$ is set to a sufficiently low potential. This will be specifically explained later.

When the above-explained setting is adopted, since $T_{S,m}$ and $T_{D,m}$ are in the conducting state, potentials in their source/drain regions and the channel region become zero, equal to $V_S$ and $V_D$. Here, since $Tr_{m,j}$ (j≠n) all enter the conducting state, potentials in their channel regions and the source/drain regions also become zero.

Here, since a low potential is applied to $V_{G,n}$, the potential in the channel region of $Tr_{m,n}$ is lowered due to capacitance coupling with the gate electrode 5 through the tunnel gate insulating film 24, the charge storage layer 25, and the inter-electrode insulating film 26. Since the source/drain regions and the channel region of $Tr_{m,n}$ are also of the n type, the potentials in the source/drain regions of $Tr_{m,n}$ are reduced. With this reduction, although the potentials in the channel region 3 and the source/drain regions 6 of $Tr_{m,j}$ (j≠n) are also decreased, the potentials are not lowered any further when a pn junction between the channel region and the source/drain regions of each of $T_{S,m}$ and $T_{D,m}$ is biased in a forward direction, and the potential in the channel region 3 of $Tr_{m,n}$ does not become lower than zero.

Therefore, when $V_{G,n}$ is set to a sufficiently low potential whereby electric charges stored in the charge storage layer 25 are discharged to the channel region 3 through the tunnel gate insulating film 24, the electric charges stored in the charge storage layer 25 are discharged to the channel region. That is, zero is written.

Here, since all of $T_{S,i}$ and $T_{D,i}$ (i≠m) are in the non-conducting state, the source/drain regions 6 and the channel region 3 of $Tr_{i,j}$ (i≠m, 1≦j≦N) enter the floating state. Therefore, when a low potential is applied to $V_{G,n}$, the potential in the channel region 3 of $Tr_{i,n}$ (i≠m) is reduced due to capacitance coupling between the channel region 3 and the gate electrode 5 through the tunnel gate insulating film 24, the charge storage layer 25, and the inter-electrode insulating film 26, an electric field in the tunnel gate insulating film 24 does not take a very high value, and the current flowing through the tunnel gate insulating film 24 does not flow. That is, the electric charges in the charge storage layer 25 do not vary.

Further, since $V_{G,j}$ (j≠n) is set to the potential higher than $V_{TH,K}$ but it is a potential at which no current flows through the tunnel gate insulating film 24, the electric charges in the charge storage layer 25 of $Tr_{i,j}$ (1≦i≦M, j≠n) do not change. In this manner, the threshold voltage of $Tr_{m,n}$ alone can be controlled without changing the threshold voltages of other $Tr_{i,j}$ ((i, j)≠(m, n)). In this manner, erasing is carried out.

It is to be noted that the method of erasing information stored in $Tr_{m,n}$ alone has been explained here, but setting all of $V_{S,i}$ and $V_{D,i}$ (1≦i≦M) to values higher than Vth (e.g., $V_{DD}$) by the same method enables erasing all of information stored in $Tr_{i,n}$ (1≦i≦M) at the same time. Therefore, an advantage that the operation is simplified and a time required for erasing is shortened can be obtained. Further, when erasing is performed by using the method explained first, information stored in a specific semiconductor component alone can be selectively erased as another advantage. In this manner, writing and erasing are carried out.

A method of reading will now be explained. Reading information in $Tr_{m,n}$ is performed as follows. A potential in the common substrate 1 is set to zero. $V_{G,j}$ (j≠n) is set to a potential higher than $V_{TH,K}$. However, it is a potential that prevents a current flowing through the tunnel gate insulating film from flowing. Then, $Tr_{i,j}$ (1≦i≦M, j≠n) all enter the conducting state. $V_S$ is set to, e.g., zero, and $V_D$ is set to, e.g., $V_{DD}$. $V_{S,i}$ and $V_{D,i}$ (i≠m) are set to values lower than $V_{th}$ (e.g., zero), and $V_{S,m}$ and $V_{D,m}$ are set to values higher than $V_{th}$ (e.g., $V_{DD}$).

When such a setting is adopted, $T_{S,i}$ and $T_{D,i}$ (i≠m) all enter a non-conducting state, and $T_{S,m}$ and $T_{D,m}$ enter a conducting state. When such a structure is adopted, the source/drain regions 6 of $Tr_{i,j}$ (i≠m, 1≦j≦N) enter a floating state since they are not connected with an external circuit. Since the source/drain regions 6 of $Tr_{m,j}$ (1≦j≦N) are connected with the external circuit, potentials in either the source/drain regions 6 of $Tr_{m,j}$ (1≦j≦n) or the source/drain regions 6 of $Tr_{m,n}$ provided on the left-hand side in FIG. 102 become zero, and potentials in either the source/drain regions 6 of $Tr_{m,j}$ (n<j≦N) or the source/drain regions 6 of $Tr_{m,n}$ provided the right-hand side in FIG. 102 become $V_{DD}$.

Furthermore, assuming that $V_{G,n}$ has a value between $V_{TH,K/2}$ and $V_{TH,K/2+1}$, a current corresponding to the threshold voltage of $Tr_{m,n}$ flows from a terminal to which $V_D$ is applied to a terminal to which $V_S$ is applied. Therefore, when this current value is detected, it is possible to know that the threshold voltage of $Tr_{m,n}$ has either a value equal to or below $V_{TH,K/2}$ or a value equal to or above $V_{TH,K/2+1}$. It is to be noted that detecting whether the current flows can suffice in this operation. Therefore, for example, a sense amplifier can be used to perform amplification and then carry out detection, thereby obtaining an advantage that an erroneous reading can be avoided.

If the threshold voltage has a value equal to or below $V_{TH,K/2}$, $V_{G,n}$ is set to a value between $V_{TH,K/4}$ and $V_{TH,K/4+1}$, and whether the current flows from the terminal to which $V_D$ is applied to the terminal to which $V_S$ is applied is detected.

If the threshold voltage has a value equal to or above $V_{TH,K/2+1}$, $V_{G,n}$ is set to a value between $V_{TH,3×K/4}$ and $V_{TH,3×K/4+1}$, and detecting whether the current flows from the terminal to which $V_D$ is applied to the terminal to which $V_S$ is applied enables knowing whether each threshold voltage has a value equal to or below $V_{TH,K/4}$, a value equal to or above $V_{TH,K/4+1}$, a value equal to or below $V_{TH,3×K/4}$, or a value equal to or above $V_{TH,3×K/4+1}$.

Repeating this operation enables detecting the threshold voltage of $Tr_{m,n}$ thus reading information stored in $Tr_{m,n}$. In this manner, information of L×M×N bits can be stored.

In this embodiment, although a verifying operation has not been explained, carrying out the verifying operation at the time of writing information enables obtaining an advantage that a fluctuation in threshold voltage can be suppressed and a low-power-supply-voltage operation can be thereby performed.

In this embodiment, likewise, improving the controllability of the gate electrode over the potential in the channel region enables suppressing the short channel effect, and the high-performance storage device can be realized since the storage device is constituted of the storage components each having a high current driving force.

15th Embodiment

A 15th embodiment provides a storage device in which the semiconductor components according to the 11th embodiment are arranged in the form of lattice points. Since a circuit diagram of a semiconductor component arrangement and an illustration of each component are the same as FIGS. 102 and 103, a description will be given with reference to these drawings.

In the semiconductor device according to this embodiment, the semiconductor components according to the 11th embodiment are arranged in M rows and N columns, thus M×N semiconductor components are included in total. Connections between the plurality of semiconductor components are the same as those in the 14th embodiment, thereby omitting a repeated explanation. An operation will now be explained hereinafter.

Methods of writing, erasing, and reading information with respect to a semiconductor component $Tr_{m,n}$ provided in a row m and a column n are based on the assumption that the semiconductor component is of the n type. The same explanation can be applied to p-type components except that a polarity of a voltage is reversed. Here, m and n are an arbitrary row and column satisfying $1 \leq m \leq M$ and $1 \leq n \leq N$, respectively. As explained in the 11th embodiment, in the semiconductor component according to the 11th embodiment, a tunnel gate insulating film 24, a charge storage layer 25, an inter-electrode insulating film 26, and a gate electrode are sequentially formed on a channel region 3. Therefore, electric charges stored in the charge storage layer 25 can be changed based on a current flowing through the tunnel gate insulating film 24, and a threshold voltage can be changed in accordance with a quantity of the electric charges.

The threshold voltage of each semiconductor component can take values in K patterns. It has a relationship of $K=2^L$ with respect to L mentioned above. The threshold voltages of the respective semiconductor components are $V_{TH,1} < \ldots < V_{TH,K}$ in ascending order. The electric charges stored in the charge storage layer 25 have a negative value, and an absolute value of the stored electric charges is increased when the threshold voltage has a higher value.

First, information is written by performing the same operation as writing information in the semiconductor device according to the 14th embodiment.

Erasing information will now be explained. A potential in a common substrate 1 is set to zero. $V_{S,i}$ and $V_{D,i}$ ($1 \leq i \leq M$) are set to values lower than $V_{TH}$ (e.g., zero). Then, $T_{S,i}$ and $T_{D,i}$ ($1 \leq i \leq M$) all enter a non-conducting state. Further, $V_S$ and $V_D$ are set to, e.g., zero. $V_{G,j}$ ($j \neq n$) is set to a potential which prevents a current flowing through the tunnel gate insulating film 24 from flowing, e.g., zero. Furthermore, $V_{G,n}$ is set to a sufficiently low potential. This will be specifically explained later.

When such a setting is adopted, since the potential in the common substrate 1 is zero, an electric field having a direction extending from the substrate 1 to the gate electrode 5 is generated in the tunnel gate insulating film 24 of $Tr_{i,n}$ ($1 \leq i \leq M$). Therefore, when $V_{G,n}$ is set to a sufficiently low potential whereby electric charges stored in the charge storage layer 25 are discharged to the channel region 3 through the tunnel gate insulating film 24, the electric charges stored in the charge storage layer 25 are discharged to the channel region 3. That is, zero is written.

Here, since $V_{G,j}$ ($j \neq n$) is set to the potential that prevents the current flowing through the tunnel gate insulating film 24 from flowing, e.g., zero, the electric field in the tunnel gate insulating film 24 does not take a very high value, and the current does not flow through the tunnel gate insulating film 24. That is, the electric charges in the charge storage layer 25 do not vary. In this manner, the threshold voltage of $Tr_{i,n}$ ($1 \leq i \leq M$) alone can be controlled without changing the threshold voltages of other $Tr_{i,j}$ ($1 \leq i \leq M$, $j \neq n$). In this manner, information is erased.

It is to be noted that the method of erasing information stored in $Tr_{i,n}$ ($1 \leq i \leq M$) has been explained. However, when $V_{G,j}$ ($1 \leq j \leq n$) is set to, e.g., zero and a high potential whereby the electric charges in the charge storage layer 25 are discharged through the tunnel gate insulating film 24 is applied to the common substrate 1, the electric charges stored in the charge storage layer 25 of all $Tr_{i,j}$ ($1 \leq i \leq M$, $1 \leq j \leq N$) are discharged. That is, zero is written.

Then, since information in all $Tr_{i,j}$ ($1 \leq i \leq M$, $1 \leq j \leq N$) is erased by a single operation, there can be obtained an advantage that the operation is simplified and a time required for erasing is shortened. Further, when the method explained first is adopted to perform erasing, another advantage that information in a semiconductor component belonging to a specific row alone can be selectively erased can be obtained. In this manner, writing and erasing are performed.

Then, reading is carried out by performing the same operation as reading information in the semiconductor device according to the 14th embodiment. In this manner, information of L×M×N bits can be stored.

Also in this embodiment, improving the controllability of the gate electrode over the potential in the channel region enables suppressing the short channel effect, and a high-performance storage device can be realized since the storage device is constituted of storage components each having a high current driving force.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor component comprising:
  a semiconductor substrate;
  an insulating region provided on the semiconductor substrate;
  a plurality of wire-form semiconductor layers of a first conductivity type aligned on the insulating region substantially parallel to each other and each having an upper surface and a side surface;
  a plurality of source/drain regions of a second conductivity type provided to the wire-form semiconductor layers, respectively, each of the source/drain regions of each wire-form semiconductor layer being apart from each other;
  a plurality of channel regions provided between the source/drain regions, respectively;
  a first insulating film provided on the upper surface and the side surface of each channel region; and
  a gate electrode provided on the first insulating film and continuously provided to cross the wire-form semiconductor layers,
  wherein a length of each channel region measured perpendicularly to a current flowing through the wire-form semiconductor layers in a wire direction and in parallel to a surface of the semiconductor substrate is equal to or below twofold a maximum depletion layer width determined based on an impurity concentration in the channel regions,
  each interval between the wire-form semiconductor layers is equal to or below twofold an interval between the upper surface of each wire-form semiconductor layer and the gate electrode, and
  a specific dielectric constant of at least a part of a surface of the insulating region is lower than 3.9.

2. The semiconductor component according to claim 1, wherein a value obtained by dividing the length of each channel region measured perpendicularly to the current flowing through the wire-form semiconductor layers in the wire direction and in parallel to the surface of the semiconductor substrate by each interval between the wire-form semiconductor layers falls within the range of 0.5 to 3.

3. The semiconductor component according to claim 1, wherein a value obtained by dividing a height of each channel region measured in a direction perpendicular to the surface of the semiconductor substrate by the length of each channel region measured perpendicularly to the current flowing through the wire-form semiconductor layers in the wire direction and in parallel to the surface of the semiconductor substrate is equal to or below 1.5.

4. The semiconductor component according to claim 1, wherein the insulating region contains one selected from the group consisting of a fluoridated silicon oxide, spin-on glass, fluoridated amorphous carbon, fluoridated polyimide, and a void formed below the gate electrode.

5. The semiconductor component according to claim 1, wherein the first insulating film has a specific dielectric constant higher than 3.9.

6. The semiconductor component according to claim 1, wherein the first insulating film is a ferroelectric film.

7. The semiconductor component according to claim 6, wherein the gate electrode contains one selected from the group consisting of Au, Pt, Ir, and Ru.

8. A semiconductor device in which the semiconductor components according to claim 6 are arranged in a form of lattice points, the source/drain regions of the semiconductor components which belong to the same row and are adjacent to each other are mutually coupled, and the gate electrodes of the semiconductor components which belong to the same column are mutually coupled.

9. A semiconductor component comprising:
a semiconductor substrate;
an insulating region provided on the semiconductor substrate;
a plurality of wire-form semiconductor layers of a first conductivity type aligned on the insulating region substantially parallel to each other and each having an upper surface and a side surface;
a plurality of source/drain regions of a second conductivity type provided to the wire-form semiconductor layers, respectively, each of the source/drain regions of each wire-form semiconductor layer being apart from each other;
a plurality of channel regions provided between the source/drain regions, respectively;
a plurality of first insulating films provided on upper surfaces of the channel regions, respectively;
a plurality of charge storage layers provided on the first insulating films, respectively;
a second insulating film covering upper surfaces of the charge storage layers and side surfaces of the channel regions, the first insulating films and the charge storage layers; and
a gate electrode provided on the second insulating film and continuously provided to cross the wire-form semiconductor layers,
wherein a length of each channel region measured perpendicularly to a current flowing through the wire-form semiconductor layers in a wire direction and in parallel to a surface of the semiconductor substrate is equal to or below twofold a maximum depletion layer width determined based on an impurity concentration in the channel regions,
each interval between the wire-form semiconductor layers is equal to or below twofold an interval between the upper surface of each wire-form semiconductor layer and the gate electrode, and a specific dielectric constant of at least a part of a surface of the insulating region is lower than 3.9.

10. The semiconductor component according to claim 9, wherein an area of a portion below the gate electrode distributed to each wire-form semiconductor layer is larger than an area of an upper portion of each charge storage layer.

11. The semiconductor component according to claim 9, wherein a dielectric constant of the second insulating film is higher than that of the first insulating film.

12. The semiconductor component according to claim 11, wherein the second insulating film contains a metal.

13. A semiconductor device in which the semiconductor components according to claim 9 are arranged in a form of lattice points, the source/drain regions of the semiconductor components which belong to the same row and are adjacent to each other are mutually coupled, and the gate electrodes of the semiconductor components which belong to the same column are mutually coupled.

14. A semiconductor component comprising:
a semiconductor substrate;
a plurality of wire-form semiconductor layers of a first conductivity type aligned on the semiconductor substrate substantially parallel to each other and each having an upper surface and a side surface;
an insulating region formed on the semiconductor substrate to expose the wire-form semiconductor layers;
a plurality of source/drain regions of a second conductivity type provided to the wire-form semiconductor layers, respectively, each of the source/drain regions of each wire-form semiconductor layer being apart from each other;
a plurality of channel regions provided between the source/drain regions, respectively;
a first insulating film provided on the upper surface and the side surface of each channel region; and
a gate electrode provided on the first insulating film and continuously provided to cross the wire-form semiconductor layers,
wherein a length of each channel region measured perpendicularly to a current flowing through the wire-form semiconductor layers in a wire direction and in parallel to a surface of the semiconductor substrate is equal to or below twofold a maximum depletion layer width determined based on an impurity concentration in the channel regions,
each interval between the wire-form semiconductor layers is equal to or below twofold an interval between the upper surface of each wire-form semiconductor layer and the gate electrode, and
a specific dielectric constant of at least a part of a surface of the insulating region is lower than 3.9.

15. The semiconductor component according to claim 14, wherein a value obtained by dividing the length of each channel region measured perpendicularly to the current flowing through the wire-form semiconductor layers in the wire direction and in parallel to the surface of the semiconductor substrate by each interval between the wire-form semiconductor layers falls within the range of 0.5 to 3.

16. The semiconductor component according to claim 14, wherein a value obtained by dividing a height of each channel region measured in a direction perpendicular to the surface of the semiconductor substrate by the length of each channel region measured perpendicularly to the current flowing through the wire-form semiconductor layers in the wire direction and in parallel to the surface of the semiconductor substrate is equal to or below 1.5.

17. The semiconductor component according to claim 14, wherein the insulating region contains one selected from a group including a fluoridated silicon oxide, spin-on glass, fluoridated amorphous carbon, fluoridated polyimide, and a void formed below the gate electrode.

18. The semiconductor component according to claim 14, wherein the first insulating film has a specific dielectric constant higher than 3.9.

19. The semiconductor component according to claim 14, wherein the first insulating film is a ferroelectric film.

20. The semiconductor component according to claim 19, wherein the gate electrode contains one selected from the group consisting of Au, Pt, Ir, and Ru.

21. A semiconductor device in which the semiconductor components according to claim 19 are arranged in the form of lattice points, the source/drain regions of the semiconductor components which belong to the same row and are adjacent to each other are mutually coupled, and the gate electrodes of the semiconductor components which belong to the same column are mutually coupled.

22. A semiconductor component comprising:
   a semiconductor substrate;
   a plurality of wire-form semiconductor layers of a first conductivity type aligned on the semiconductor substrate substantially parallel to each other and each having an upper surface and a side surface;
   an insulating region formed on the semiconductor substrate to expose the wire-form semiconductor layers;
   a plurality of source/drain regions of a second conductivity type provided to the wire-form semiconductor layers, respectively, each of the source/drain regions of each wire-form semiconductor layer being apart from each other;
   a plurality of channel regions provided between the source/drain regions, respectively;
   a plurality of first insulating film provided on upper surfaces of the channel regions, respectively;
   a plurality of charge storage layers provided on the first insulating films, respectively;
   a second insulating film covering an upper surfaces of the charge storage layers and side surfaces of the channel regions, the first insulating films and the charge storage layers; and
   a gate electrode provided on the first insulating film and continuously provided to cross the wire-form semiconductor layers,
   wherein a length of each channel region measured perpendicularly to a current flowing through the wire-form semiconductor layers in a wire direction and in parallel to a surface of the semiconductor substrate is equal to or below twofold a maximum depletion layer width determined based on an impurity concentration in the channel regions,
   each interval between the wire-form semiconductor layers is equal to or below twofold an interval between the upper surface of each wire-form semiconductor layer and the gate electrode, and
   a specific dielectric constant of at least a part of a surface of the insulating region is lower than 3.9.

23. The semiconductor component according to claim 22, wherein an area of a portion below the gate electrode distributed to each wire-form semiconductor layer is larger than an area of an upper portion of each charge storage layer.

24. The semiconductor component according to claim 22, wherein a dielectric constant of the second insulating film is higher than that of the first insulating film.

25. The semiconductor component according to claim 24, wherein the second insulating film contains a metal.

26. A semiconductor device in which the semiconductor components according to claim 22 are arranged in the form of lattice points, the source/drain regions of the semiconductor components which belong to the same row and are adjacent to each other are mutually coupled, and the gate electrodes of the semiconductor components which belong to the same column are mutually coupled.

* * * * *